US 11,747,392 B2

(12) United States Patent
Batko et al.

(10) Patent No.: US 11,747,392 B2
(45) Date of Patent: Sep. 5, 2023

(54) SELF-TEST AUTO MONITOR GROUND FAULT CIRCUIT INTERRUPTER (GFCI) WITH POWER DENIAL

(71) Applicant: Hubbell Incorporated, Shelton, CT (US)

(72) Inventors: Thomas James Batko, Wallingford, CT (US); Joseph Vincent DeBartolo, North Stonington, CT (US)

(73) Assignee: Hubbell Incorporated, Shelton, CT (US)

( * ) Notice: Subject to any disclaimer, the term of this patent is extended or adjusted under 35 U.S.C. 154(b) by 57 days.

(21) Appl. No.: 17/331,083

(22) Filed: May 26, 2021

(65) Prior Publication Data
US 2021/0278477 A1 Sep. 9, 2021

Related U.S. Application Data

(63) Continuation of application No. 16/573,301, filed on Sep. 17, 2019, now Pat. No. 11,025,049, which is a
(Continued)

(51) Int. Cl.
*G01R 31/28* (2006.01)
*H01H 83/04* (2006.01)
(Continued)

(52) U.S. Cl.
CPC ......... *G01R 31/2827* (2013.01); *G01R 31/50* (2020.01); *G01R 31/52* (2020.01);
(Continued)

(58) Field of Classification Search
CPC ........ H02H 3/162; H02H 3/044; H02H 3/335; G01R 31/025; G01R 31/2827; H01H 2071/044
See application file for complete search history.

(56) References Cited

U.S. PATENT DOCUMENTS 4,318,154 A * 3/1982 DePuy ................. H01H 47/043
361/155
7,253,629 B1 8/2007 Richards et al.
(Continued)

FOREIGN PATENT DOCUMENTS

CN 101714486 5/2010
WO 2009097469 8/2009

OTHER PUBLICATIONS

Canadian Patent Application No. 2,905,859 Office Action dated Apr. 21, 2020 (4 pages).
(Continued)

*Primary Examiner* — Jared Fureman
*Assistant Examiner* — Christopher J Clark
(74) *Attorney, Agent, or Firm* — Michael Best & Friedrich LLP

(57) ABSTRACT

A circuit interrupting device including one or more line terminals for connecting to an external power supply, one or more load terminals for connecting to an external load, one or more contacts electrically connecting one or more line terminals to one or more load terminals, and an auto-monitoring circuit. The auto-monitoring circuit configured to monitor one or more signals to determine an operating state of said circuit interrupting device, output a first signal having a first voltage level based on the operating state, wherein the first voltage level is greater than zero volts, and output a second signal having a second voltage level based on the operating state, wherein the second voltage level is greater than the first voltage level.

17 Claims, 46 Drawing Sheets

Related U.S. Application Data continuation of application No. 15/415,086, filed on Jan. 25, 2017, now Pat. No. 10,418,799, which is a continuation of application No. 14/203,610, filed on Mar. 11, 2014, now Pat. No. 9,595,824.

(60) Provisional application No. 61/791,114, filed on Mar. 15, 2013.

(51) Int. Cl.
| | |
|---|---|
| *G01R 31/50* | (2020.01) |
| *H02H 3/33* | (2006.01) |
| *H01H 71/04* | (2006.01) |
| *H02H 3/04* | (2006.01) |
| *G01R 31/52* | (2020.01) |
| *H02H 3/16* | (2006.01) |

(52) U.S. Cl.
CPC ............ *H01H 71/04* (2013.01); *H01H 83/04* (2013.01); *H02H 3/044* (2013.01); *H02H 3/162* (2013.01); *H02H 3/335* (2013.01); *H01H 2071/044* (2013.01); *H01H 2300/052* (2013.01)

(56) References Cited

U.S. PATENT DOCUMENTS

| | | | |
|---|---|---|---|
| 7,443,309 B2 | 10/2008 | Baldwin | |
| 10,418,799 B2 | 9/2019 | Batko | |
| 2006/0145793 A1 | 7/2006 | Ning et al. | |
| 2007/0030607 A1 | 2/2007 | Liscinsky, III | |
| 2007/0030608 A1 | 2/2007 | Baldwin et al. | |
| 2008/0002314 A1 | 1/2008 | Batko et al. | |
| 2011/0216451 A1 | 9/2011 | Haines | |
| 2011/0216453 A1* | 9/2011 | Haines | H02H 9/00 361/49 |
| 2013/0147547 A1 | 6/2013 | Nalawade | |

OTHER PUBLICATIONS

Chinese Patent Application No. 201480024016.4 Notification of Reexamination dated Aug. 2, 2019 and translation (21 pages).
European Patent Application No. 14768675.2 examination report dated Mar. 20, 2020 (5 pages).
CN201480024016.4 Reexamination Decision and translation dated Feb. 3, 2020.
PCT /US2014/025039 International Search Report and Written Opinion dated Jul. 9, 2014 (10 pages).
Matsushita Electric Works, Ltd.: "Definition of Relay Terminology", May 14, 20014 (32 pages).
"Latching, Sequence and Impulse Relays—Application Data", Magnecraft Solution Guide 105A, Mar. 17, 2010 (6 pages).
European Patent Application No. 14768675.2 Extended European Search Report dated Apr. 4, 2017 (19 pages).
Chinese Patent Application No. 201480024016.4 Rejection Decision dated Oct. 29, 2018 and translation (18 pages).
Chinese Patent Application No. 20140024016 .4 Third Office Action issued by the State Intellectual Property Office dated Feb. 24, 2018 and translation (16 pages).
European Patent Application No. 14768675.2 examination report dated Mar. 17, 2022 (8 pages).

* cited by examiner

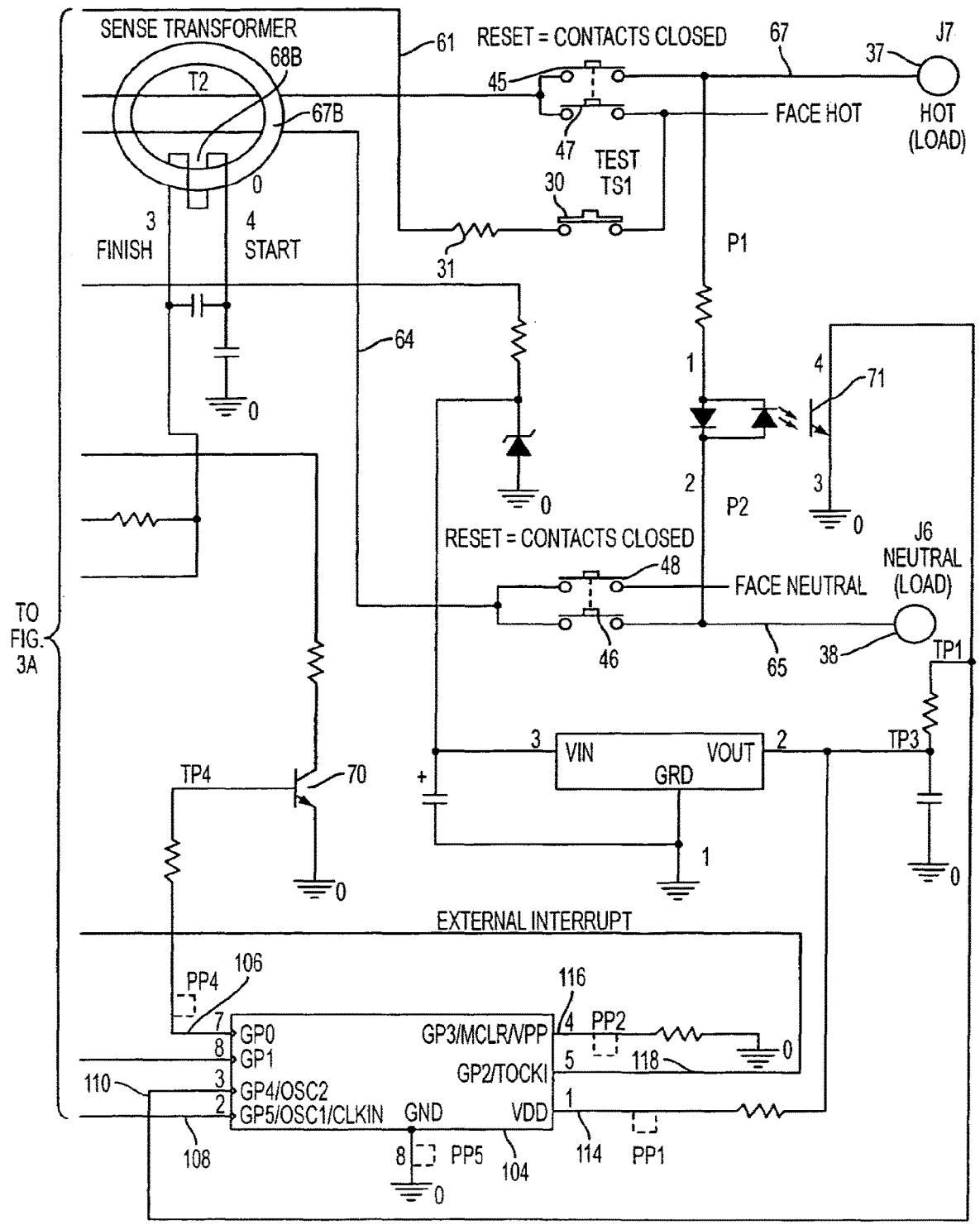
FIG. 3B          □ = SERIAL PROGRAMMING CONNECTIONS

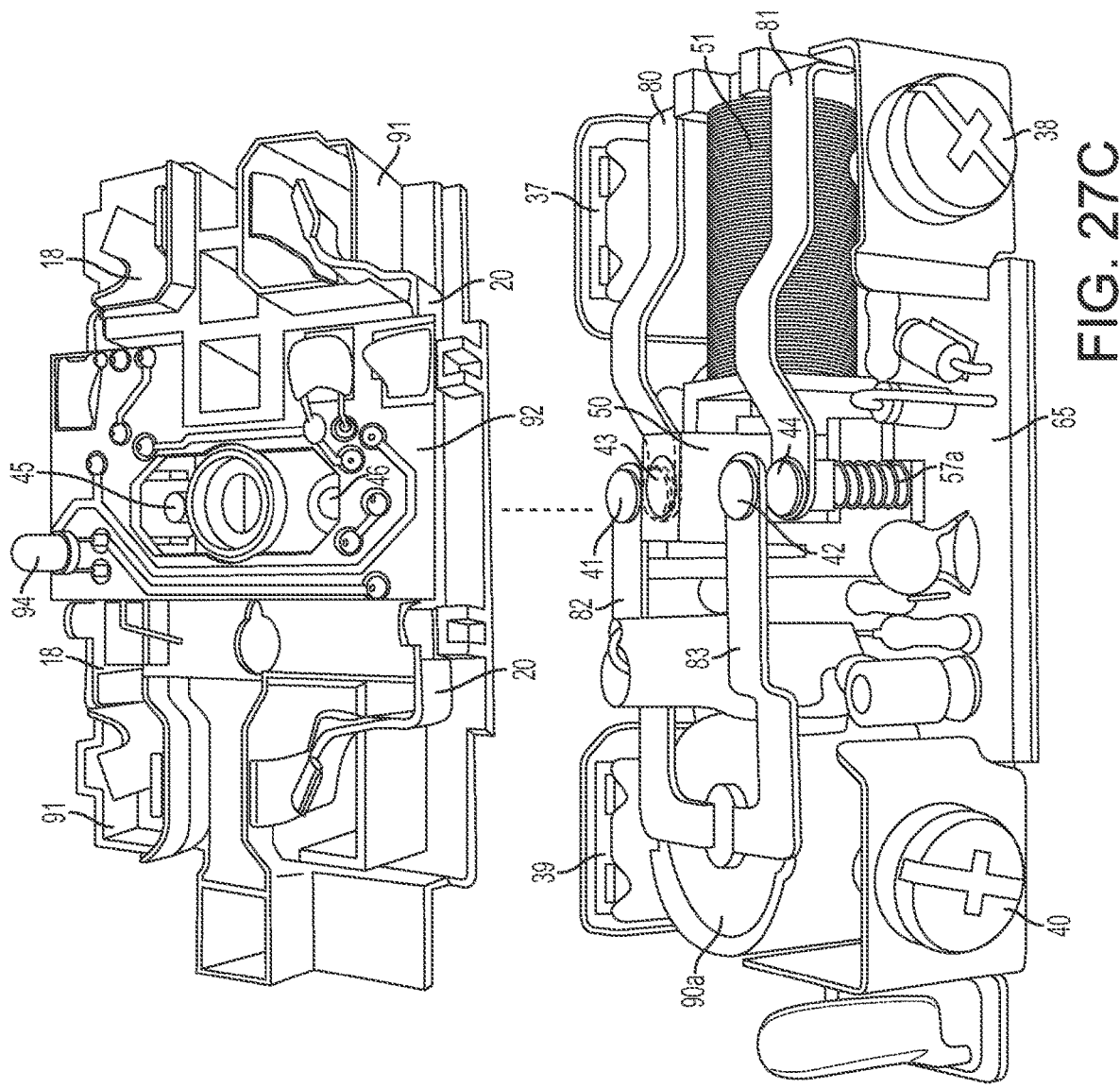

SELF-TEST AUTO MONITOR GROUND FAULT CIRCUIT INTERRUPTER (GFCI) WITH POWER DENIAL

RELATED APPLICATIONS

This application claims priority to U.S. patent application Ser. No. 16/573,301, filed Sep. 17, 2019, which claims priority to U.S. patent application Ser. No. 15/415,086, filed on Jan. 25, 2017, which claims priority to U.S. patent application Ser. No. 14/203,610, filed on Mar. 11, 2014, which claims priority to U.S. Provisional Patent Application No. 61/791,114, filed on Mar. 15, 2013, the entire contents of both of which are hereby incorporated by reference.

Related subject matter is disclosed in U.S. Pat. No. 7,443,309, filed on Dec. 1, 2004, titled "SELF TESTING GROUND FAULT CIRCUIT INTERRUPTER (GFCI)", and U.S. patent application Ser. No. 13/422,793, filed on Mar. 16, 2012, titled "REINSTALLABLE CIRCUIT INTERRUPTING DEVICE WITH VIBRATION RESISTANT MISWIRE PROTECTION," the entire respective contents of both of which are hereby incorporated by reference.

BACKGROUND

The application relates generally to a self-testing fault interrupting device, such as a ground fault circuit interrupter (GFCI). More particularly, the present application relates to a self-testing fault interrupting device where a periodic self-test is performed on the fault detection and tripping portions of the device independent of a manual test.

SUMMARY

Fault interrupting devices are designed to trip in response to the detection of a fault condition at an AC load. The fault condition can result when a person comes into contact with the hot side of the AC load and an earth ground, a situation which can result in serious injury. A ground fault circuit interrupter (GFCI) detects this condition by using a sense transformer to detect an imbalance between the currents flowing in the line and neutral conductors of the AC supply, as will occur when some of the current on the load hot side is being diverted to ground. When such an imbalance is detected, a relay or circuit breaker within the GFCI device is immediately tripped to an open condition, thereby removing all power from the load.

Many types of GFCI devices are capable of being tripped not only by contact between the line side of the AC load and ground, but also by a connection between the neutral side of the AC load and ground. The latter type of connection, which may result from a defective load or from improper wiring, is potentially dangerous because it can prevent a conventional GFCI device from tripping at the required threshold level of differential current when a line-to-ground fault occurs.

To be commercially sold in the United States a GFCI device must conform to standards established by the Underwriter's Laboratory (UL) in conjunction with industry-leading manufacturers as well as other industry members, such as various safety groups. One UL standard covering GFCI devices is UL-943, titled "Standard for Safety—Ground Fault Circuit Interrupters." UL-943 applies to Class A, single- and three-phase, GFCIs intended for protection of personnel and includes minimum requirements for the function, construction, performance, and markings of such GFCI devices. UL-943 requires, among other things, specific fault current levels and response timing requirements at which the GFCI device should trip. Typically, GFCIs are required to trip when a ground fault having a level higher than 5 milliamps (mA) is detected. Further, when a high resistance ground fault is applied to the device, the present version of UL-943 specifies that the device should trip and prevent current from being delivered to the load in accordance with the equation, $T=(20/I)1.43$, where T refers to time and is expressed in seconds and I refers to electrical current and is expressed in milliamps. Thus, in the case of a 5 mA fault, the device must detect the fault and trip in 7.26 seconds or less.

With such safety-related standards in place, and because GFCI devices are directly credited with saving many lives since their introduction in the early 1970s, they have become ubiquitous throughout the residential and commercial electrical power grid. Like most electro-mechanical devices, however, GFCI devices are susceptible to failure. For example, one or more of the electronic components that drive the mechanical current interrupter device can short-out or otherwise become defective, as can components in the fault detector circuit or elsewhere within the device, rendering the device unable to properly detect the ground fault and/or properly interrupt the flow of electrical current. For this reason it has long been required that GFCI devices be provided with a supervisory circuit that enables manual testing of the ability of the device to trip when a fault is encountered. Such supervisory circuits are typically have a TEST button which, when pressed, actuates a simulated ground fault on the hot and neutral conductors. If the device is functioning properly the simulated fault is detected and the device will trip, i.e., the mechanical interrupter is actuated to open the current path connecting the line side of the device, e.g., where the in AC power is supplied, and load side, where the user connects his or her electrical appliance, etc. and where downstream receptacles or additional GFCI devices are connected.

A study performed by industry safety groups indicated that most often the public does not regularly test their GFCI devices for proper operation, i.e., by pressing the TEST button. This study further revealed that some GFCI devices that had been in service for an extended period of time became non-functional and were unable to properly detect a fault condition, thus, rendering the device unsafe. Specifically, it was discovered that after extended use GFCI devices fail to trip when a fault occurs, thus rendering the device operable as an electrical receptacle but unsafe in the presence of a fault condition. Because the devices are not being regularly tested, this unsafe condition is exacerbated. That is, people falsely believe the device is operational, in view of the fact that it adequately delivers power, when in fact the device is a potentially life-threatening hazard.

The discovery that GFCI devices deployed in the field are becoming increasingly non-operational and unsafe in combination with the realization that people do not regularly test their GFCI devices, regardless of manufacturer's explicit instructions to do so, initiated investigations into possible changes to the UL-943 standard to require the GFCI devices to self-test (e.g., auto-monitor) themselves without the need for human intervention. The changes contemplated to UL-943 further included a requirement for either a warning to the consumer of the loss of protection and/or the device automatic removing itself from service, e.g., permanently tripping. Moreover, these additional self-testing operations would have to be performed without interfering with the primary function of the device, i.e., tripping when an actual fault was encountered.

The revised self-test functionality mentioned above is not yet a requirement for UL-943 certification, but it is expected that it will be soon. In preparation for this significant UL change, and in view of the seemingly endless reduction in the cost of integrated circuits, many GFCI manufacturers have migrated to digital techniques (e.g., microprocessors and microcontrollers) in favor of previous analog designs to provide both ground fault protection and self-monitoring functionality. The digital solutions offered thus far, however, are not ideal. For example, several related art GFCI designs, including those directed at providing self-test functionality, suffer from nuisance tripping, a situation where the interrupter is actuated when neither a real ground fault, a manually generated simulated ground fault, nor an automatic self-test fault are present. This unfavorable condition is believed by many to be worsened by the additional requirement of automatic self-testing, which results in additional inductive currents being generated within the device.

It is therefore desired to provide a GFCI device that provides certain self-testing capabilities, including those proposed in the next revision of UL-943, but minimizes the risks associated with nuisance tripping.

In consideration of certain likely additional requirements for commercial GFCI devices and problematic issues associated with related art GFCI devices, including but not limited to the problematic issues discussed above, a self-testing GFCI device in accordance with one or more exemplary embodiments of the present application generally includes an auto-monitoring circuit that continuously monitors the performance of the GFCI device. For example, a GFCI device is provided with an auto-monitoring circuit that periodically and automatically tests the ability of the device to respond to a ground fault. Moreover this testing is done without opening the circuit interrupter contacts of the device.

Also, with the GFCI device wired correctly, i.e., with AC power connected to the line side of the device, the auto-monitoring circuit performs the automatic test each time power becomes available to the load terminal(s) or alternatively line terminal(s) of a properly wired GFCI. The automatic test is initiated within five seconds of power availability to the line or load terminals and the automatic test is repeated at least every three hours and does not compromise the ability of the GFCI device to respond to a ground fault or a grounded neutral fault.

At least one consequence of the auto-monitoring circuit detecting a problem includes one or more of, (a) tripping the device and/or otherwise denying power to the load, or line, terminals (power denial) and preventing the device from being reset, (b) tripping the device with the ability to reset, subject to the next auto-monitoring test cycle or repeatedly tripping, (c) providing visual and/or audible indication of the situation.

More specifically, a processing device, such as a microcontroller or microprocessor, is configured to periodically perform an auto-monitoring routine based on a stored software program for testing and verifying the viability and functionality of various sub-circuits within the GFCI device. To test proper current isolation of the GFCI device, a driver coupled to the microcontroller is operated to initiate a test signal representative of a ground fault each time the auto-monitoring routine is performed, or run, and different circuit nodes are monitored to confirm proper operation of the device.

An end-of-life indicator is also coupled to the microcontroller to indicate whether the GFCI device has failed to properly detect the test signal or some other malfunction within the device has occurred. To avoid tripping the mechanical current-interrupting device when the test signal is generated, but also allow as much of the GFCI device circuitry to perform its intended function, a unique monitor circuit is provided that takes advantage of various functionality of the digital components, such as the GFCI integrated circuit device and the microcontroller. Specifically, to provide an automatic test function that monitors the fault detection capability of the GFCI device without interfering and causing a false trip under normal conditions, embodiments consistent with the application include a specifically selected filter capacitor associated with the interrupter drive output of the GFCI integrated circuit (IC) device. Proper selection of the capacitor and other related circuit components prevents the interrupter drive circuit, e.g., silicon controlled rectifier (SCR), from firing, or turning ON, until a real fault condition is encountered.

According to one exemplary embodiment, circuit component values and microcontroller software of, for example, the device disclosed in U.S. Pat. No. 7,443,309, are modified to meet additional UL943 requirements, such as those of section 6.30 (Yr. 2015), captioned Auto-Monitoring Function Tests. When the End-Of-Life (EOL) state of the GFCI has been verified, the software (S/W) in the microcontroller (uC) outputs a signal (e.g., a high signal) on port GP1, pin 6, for 20 msecs, or more. This time is adjustable and accounts for the inclusion of a positive 60 Hz ½ cycle required to activate the solenoid independent of when the signal to trip is asserted during AC wave.

The microcontroller then outputs a signal (e.g., a low signal) on port GP1, pin 6, to inhibit any further resets (via the reset switch) from triggering the SCR and latching the contacts closed. The value of resistor R5, i.e., the resistor connected between GP1 of the microcontroller and the gate of the SCR, is selectively chosen (e.g., a value less than the equivalent resistor in U.S. Pat. No. 7,443,309) to ensure that the gate voltage of the SCR does not reach its 'ON' threshold point, for example, when a reset is attempted during the time when power denial is being enforced. Further, an indicator, such as a red LED is controlled to flash to provide clear visual indication of the situation, e.g., EOL.

Further, the EOL state is stored in memory within the microcontroller, e.g., in RAM, and is cleared if AC power is lost. If the fault causing the EOL condition is still present when power is restored, the microcontroller verifies and asserts the EOL state again. Alternatively, if the fault causing the EOL is no longer present when power is restored, the GFCI continues auto-monitoring and normal operation.

Additional optional features are provided in regard to other exemplary embodiments as well. For example, the EOL state can be cleared and normal operation of the GFCI resumed should the fault that caused EOL be no longer present and the auto-monitoring routine verifies this "self-healing" via one or more confirmatory operations, such as confirming normal conditions over a predetermined period of time. Operation of the GFCI device according to the application, including the auto-monitoring and self-testing features, at operating frequencies other than 60 Hz are also contemplated by the application. For example, by modifying various device components and/or the software code within the microcontroller the device according to this application can be implemented in countries other than the U.S. where the power grid uses power signals with various frequencies.

In one embodiment, the application provides a circuit interrupting device including one or more line terminals for connecting to an external power supply, one or more load terminals for connecting to an external load, one or more contacts electrically connecting one or more line terminals to one or more load terminals; and an auto-monitoring circuit. The auto-monitoring circuit continuously monitoring one or more signals to determine an operating state of said circuit interrupting device. Wherein if said auto-monitoring circuit determines that said circuit interrupting device has reached its end-of-life and it is determined that the contacts have not failed, then a signal is driven to a first level to actuate a switch and open the contacts. Wherein said signal is further driven to a second level to inhibit said circuit interrupting device from resetting when it is determined that contacts of said interrupting device have failed. Wherein the second level has a voltage greater than zero volts.

In another embodiment the application provides a circuit interrupting device including one or more line terminals for connecting to an external power supply, one or more load terminals for connecting to an external load, and an auto-monitoring circuit. The auto-monitoring circuit is configured to automatically perform a self-test routine based on a predetermined schedule and determine whether said circuit interrupting device has reached the end of its useful life, wherein said determination is based at least in part on a result from said self-test routine. Wherein, when said auto-monitoring circuit determines that said circuit interrupting device has reached the end of its useful life, a driver signal is driven to a first level for a first length of time to place the circuit interrupting device to a tripped condition. Wherein, when said auto-monitoring circuit determines that contacts of said circuit interrupting device have failed, the driver signal is driven to a second level, wherein the second level has a voltage greater than zero volts.

Other aspects of the application will become apparent by consideration of the detailed description and accompanying drawings.

BRIEF DESCRIPTION OF THE DRAWINGS

FIGS. 3A-3B is a schematic diagram of a ground fault circuit interrupter in accordance with an embodiment of the present application, in which a conventional GFCI chip is employed in combination with a microprocessor to operate the GFCI;

FIG. 27C is a perspective view showing the face terminal manifold holding the face terminals and the end-of-life indicator in accordance with an embodiment of the present application;

DETAILED DESCRIPTION

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

Figure 1:
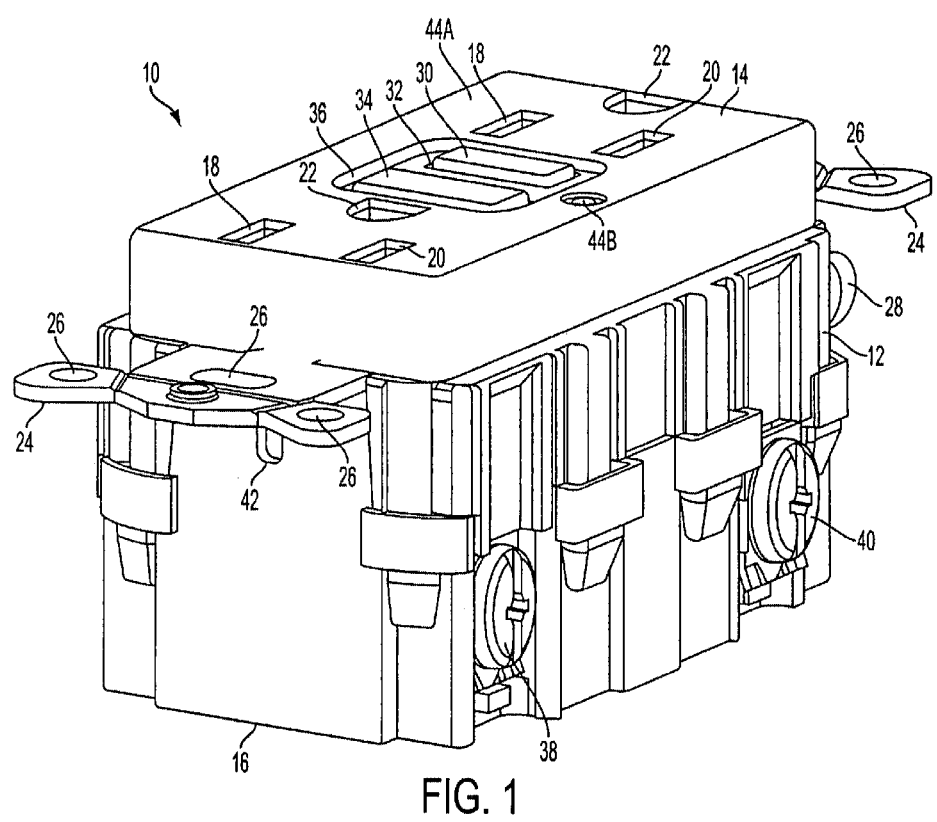
FIG. 1 is a perspective view of an example of a ground fault circuit interrupting (GFCI) device in accordance with an embodiment of the present application.

FIG. 1 is a perspective view of an example of a ground fault circuit interrupting (GFCI) device 10 in accordance with an embodiment of the present application. The GFCI device 10 comprises a housing 12 having a cover portion 14 and a rear portion 16. The GFCI also includes an inner housing 13 (See FIG. 4) when the cover portion 14 is removed from the rear portion 16. The cover portion 14 and rear portion are removably secured to each other via fastening means such as clips, screws, brackets, tabs and the like. The cover portion includes plugin slots (also known as face receptacles) 18 and 20 and grounding slots 22. It should be appreciated by those skilled in the art that plugin slots 18 and 20 and grounding slots 22 can accommodate polarized, non-polarized, grounded or non-grounded blades of a male plug. The male plug can be a two wire or three wire plug without departing from the scope of the embodiment of the present application.

The GFCI receptacle 10 further includes mounting strap 24 having mounting holes 26 for mounting the GFCI receptacle 10 to a junction box (not shown). At the rear wall of the housing 12 is a grounding screw 28 for connecting a ground conductor (not shown).

A test button 30 extends through opening 32 in the cover portion 14 of the housing 12. The test button is used to activate a test operation that tests the operation of the circuit interrupting portion disposed in the GFCI receptacle 10. The circuit interrupting portion, to be described in more detail below, is used to break electrical continuity in one or more conductive paths between the line and load side of the GFCI receptacle 10. A reset button 34 extends through opening 36 in the cover portion 14 of the housing 12. The reset button 34 is used to activate a reset operation, which reestablishes electrical continuity in the open conductive paths.

Figure 2:
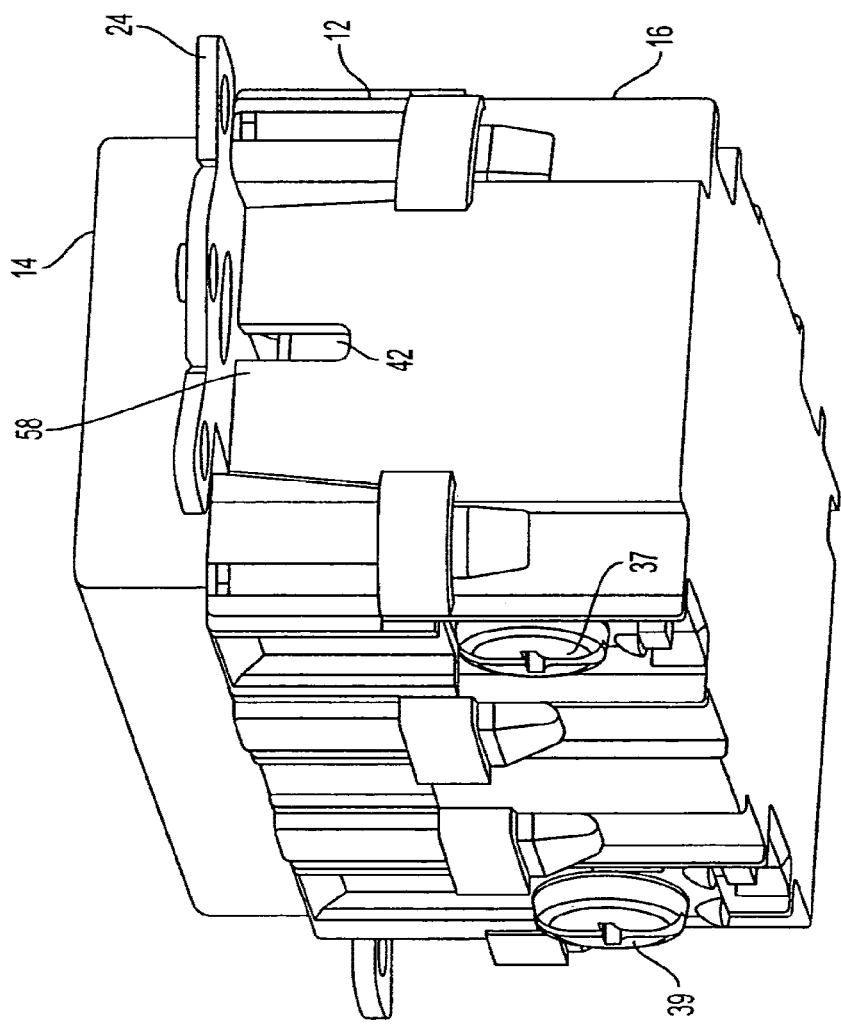
FIG. 2 is another perspective view of the ground fault interrupting device shown in FIG. 1 in accordance with an embodiment of the present application.

Rear portion 16 preferably includes four screws, only two of which are shown in FIG. 1. Load terminal screw 38 is connected to a neutral conductor and an opposing load terminal screw 37 (See FIG. 2) is connected to the hot conductor. Line terminal screw 40 is connected to the neutral conductor and an opposing line terminal screw 39 (See FIG. 2) is connected to the hot conductor. It should be appreciated by those skilled in the art that the GFCI receptacle 10 can also include apertures proximate the line and load terminal screws 37, 38, 39 and 40 to receive the bare end of conductors rather than connecting the bare end of the wires to the line and load terminal screws.

In an embodiment of the present application rear portion 16 also contains an aperture 42 (See FIG. 2) for accessing the internal portion of the GFCI receptacle 10 for testing during the manufacturing process. Specifically, the aperture 42 provides access to a miswire plate 58 the operation of which will be described in detail below. The aperture 42 is preferably sealed prior to shipping of the GFCI receptacle 10 to distributors.

Alarm indicator 44 preferably comprises a dual color lamp which provides a first color when a first filament is activated and a second color when a second filament is activated. In one embodiment of the present application, the alarm indicator 44A illuminates to provide a green color when the GFCI receptacle 10 is operating normally and providing GFCI protection. In another embodiment of the present application, the alarm indicator 44B illuminates to provide a flashing red color when the GFCI receptacle 10 is operating as a normal receptacle and not providing ground fault protection indicating a detected fault in the GFCI mechanism or electronics. Specifically, alarm indicator 44B flashes when any portion of the self-test fails or fails a coil test. In another embodiment of the present application, alarm indicator 44B illuminates steady to indicate that a ground fault was detected. It should be appreciated by those skilled in the art that although the alarm indicator is described as being a dual filament lamp, two separate single filament lamps, a single lamp having a single filament, or a buzzer, or any other suitable indicator such as a colored lamp can be used to provide an alarm indication without departing from the scope of the present application.

Figure 3A:
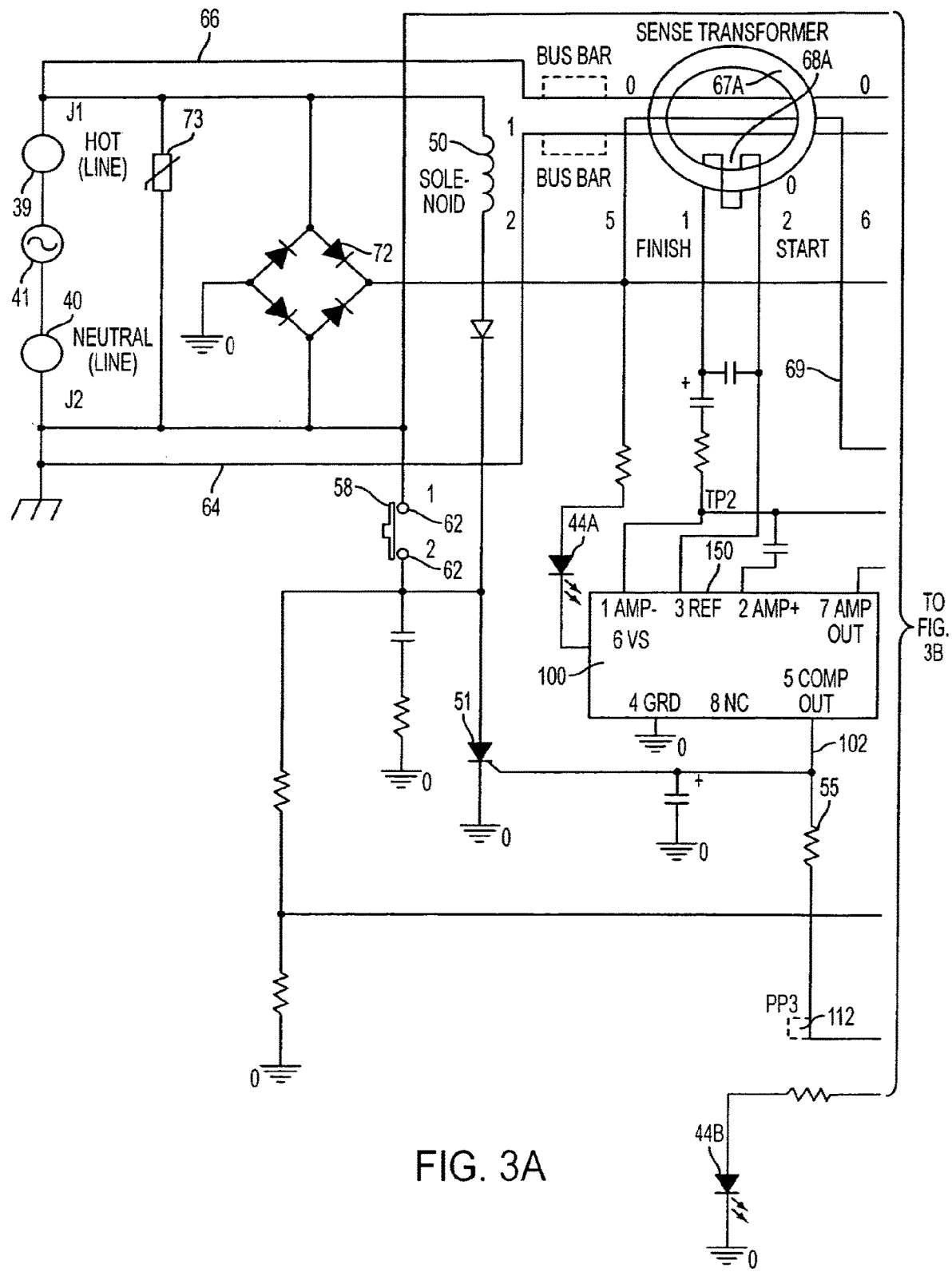

FIG. 3A-3B is a schematic diagram illustrating an example of the circuitry of the ground fault circuit interrupting device of FIG. 1 in accordance with an embodiment of the present application. In accordance with this embodiment, the GFCI device 10 is provided with a latching mechanisms 45, 46, 47, 48, a sensing circuit comprising a GFCI chip 100 and a transformer arrangement 68 comprising sensing transformer 68A and ground transformer 68B, solenoid 50, solenoid plunger 52 (See FIGS. 4-9), latching plate 54 (See FIG. 7-9), reset pin 56 (See FIG. 7-9), miswire plate 58, locking spring 60, secondary contacts 62, neutral conductor 64, hot conductor 66 and a microprocessor 104.

GFCI device 10 is structured and arranged to prevent an initial miswiring of the GFCI. That is, as described in more detail below, prior to shipping the device for use, the miswire plate 58 is pressed downward to engage a projection on the back of plunger 52 and makes contact with secondary contacts 62 to thus close the secondary contacts 62. In the GFCI device's initial configuration, the reset pin 56, when depressed, cannot engage the latching plate 54 because the latching plate 54 is displaced by the solenoid plunger 52 and the miswire plate 58, such that aperture 55 is aligned with reset pin 56 (See FIGS. 7-9). When the GFCI receptacle 10 is connected to the line side, the secondary contacts power the solenoid 50, causing solenoid plunger 52 to release miswire plate 58 and position latching plate 54 so that the reset pin 56 can engage with the edge of the latching plate 54 when the reset button 34 is depressed.

Figure 4:
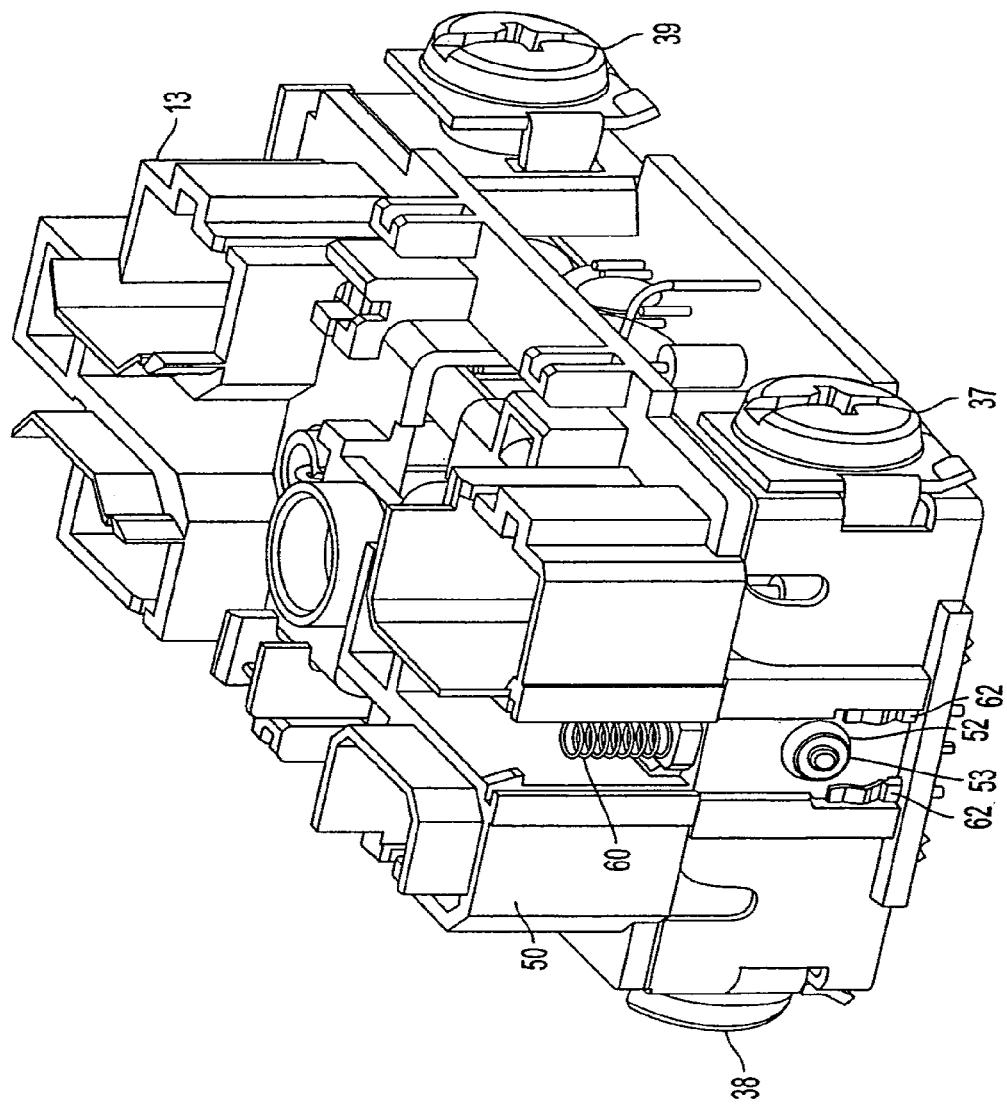
FIGS. 4-6 are perspective views illustrating the operation of a miswire plate of the ground fault circuit interrupting device shown in FIG. 1 in accordance with an embodiment of the present application.
Figure 5:
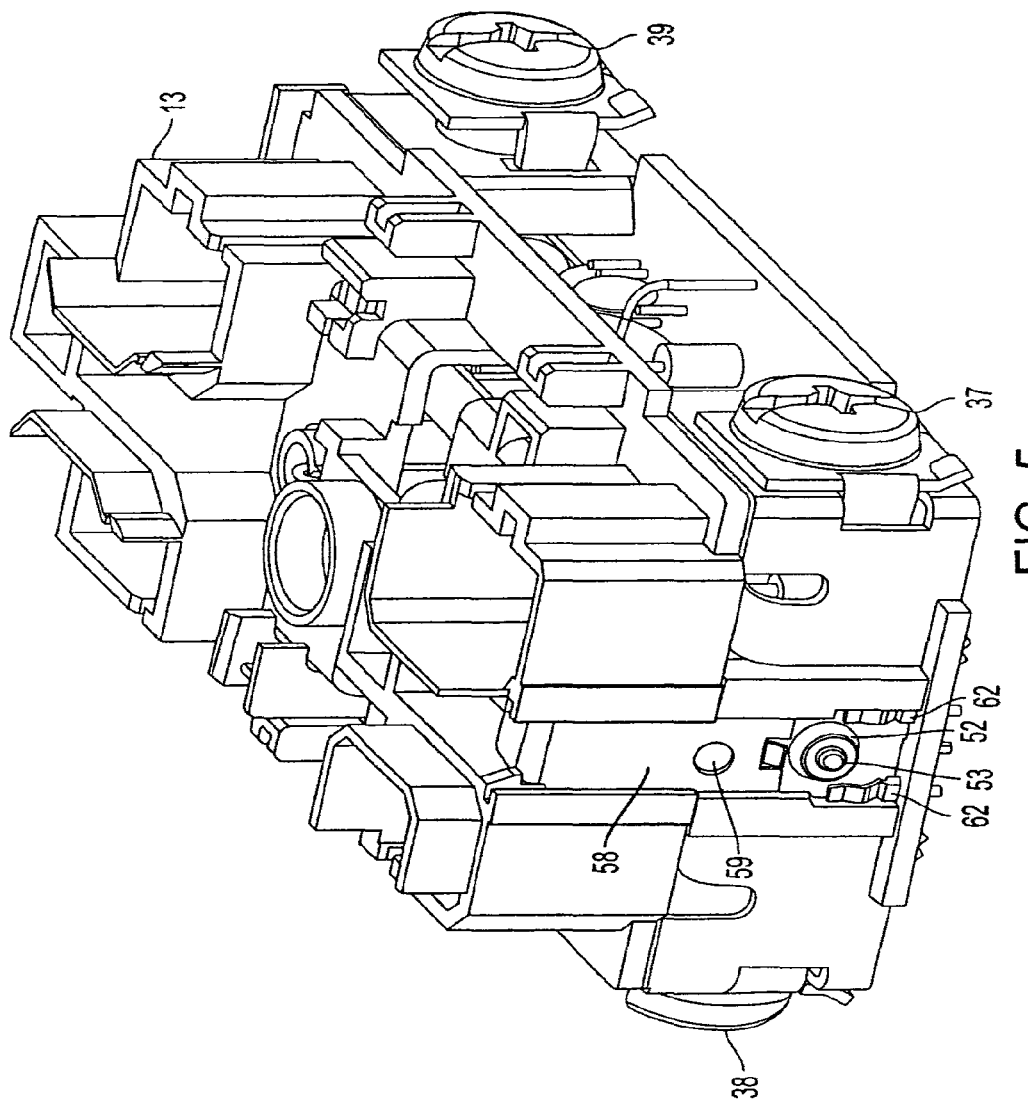
Figure 6:
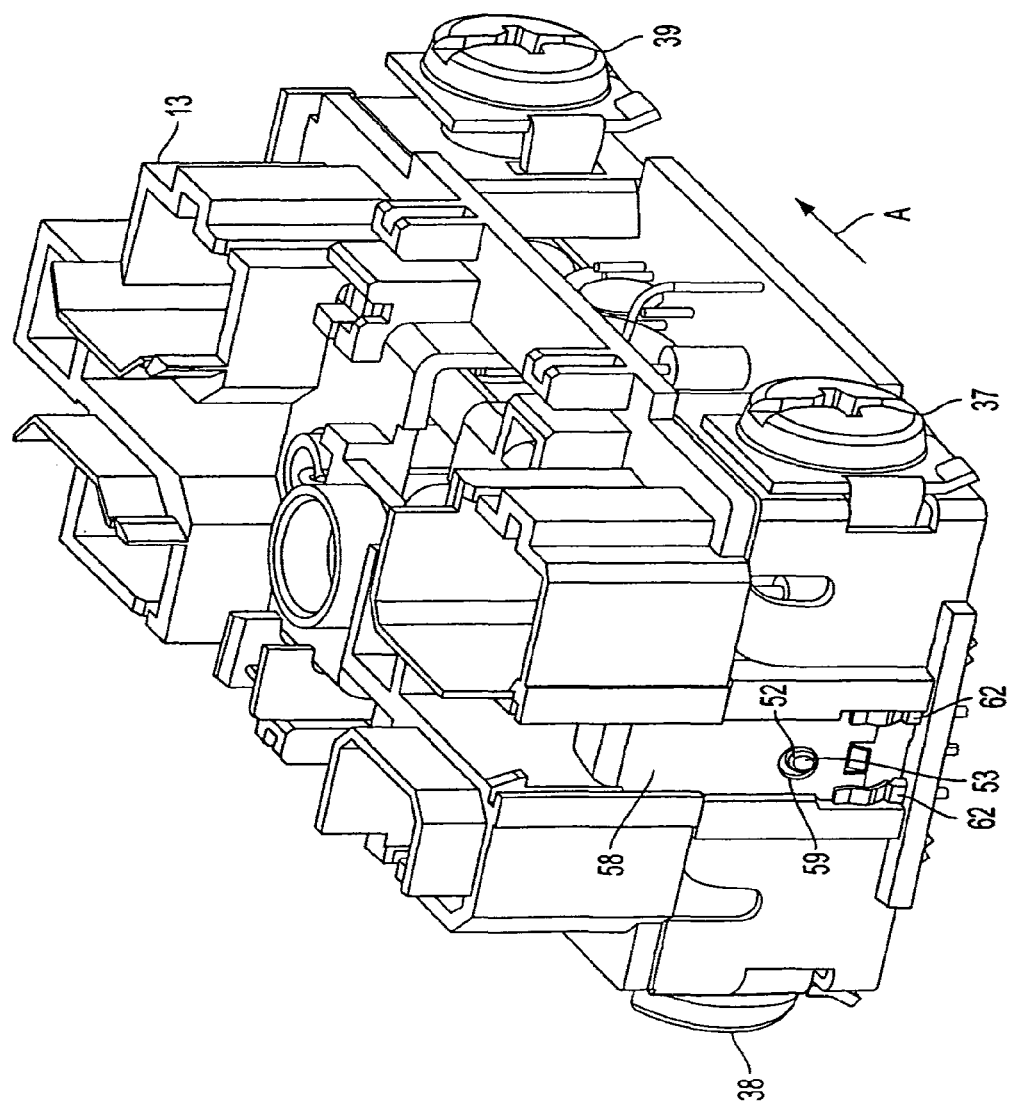

FIGS. 4-6 are perspective views illustrating examples of positions of the miswire plate 58 in accordance with an embodiment of the present application. In FIG. 4 the cover portion 14 of the housing 12 is removed to expose the internal housing 13 of the GFCI 10. The locking spring 60, secondary contacts 62 and solenoid plunger 52 are shown. The locking spring 60 is shown in an extended or release position and is not exerting pressure in FIG. 4.

In FIG. 5, the miswire plate 58 is shown in a released or extended position. The locking spring 60 (See FIG. 4) holds the miswire plate 58 up, thus allowing plunger 52 to fully extend. In this position, an open circuit exists between the secondary contacts 62.

In FIG. 6, the miswire plate 58 is shown as being in the engaged position. Projection 53 of the plunger 52 engages aperture 59 in miswire plate 58, and, holds miswire plate 58 in a miswire prevention position. In this position, miswire plate 58 closes the circuit between secondary contacts 62. That is, an aperture 59 in the miswire plate 58 interlocks with the projection 53 on the plunger 52 and holds the miswire plate 58 in a position in which the miswire plate 58 makes contact with and closes the secondary contacts 62. When the reset button 34 is depressed and the miswire plate 58 is in a locked state, the reset pin 56 cannot engage with the latching plate 54 because the plunger 52 positions the latching plate 54 such that the reset pin 56 passes through aperture 55 freely. The miswire plate 58 will remain in this position until the GFCI receptacle 10 is powered from the line side. As can be appreciated from the schematic in FIG. 3, the load terminals 37 and 38 are electrically isolated from the remainder of the circuit when the latching mechanism 46 is in the open state as shown in FIG. 4. However, as is also shown, the secondary contacts 62, when closed by the miswire plate 58, provide a path which enables the solenoid to be powered from the power source connected to the line terminals 39 and 40 and move the plunger 52 in the direction of "A", thereby removing the projection 53 of the plunger 52 from the aperture 59 and releasing the miswire plate 58. Accordingly, the spring 60 raises the miswire plate 58 upward and out of contact with secondary contacts 62, thus opening the secondary contacts 62.

Figure 7:
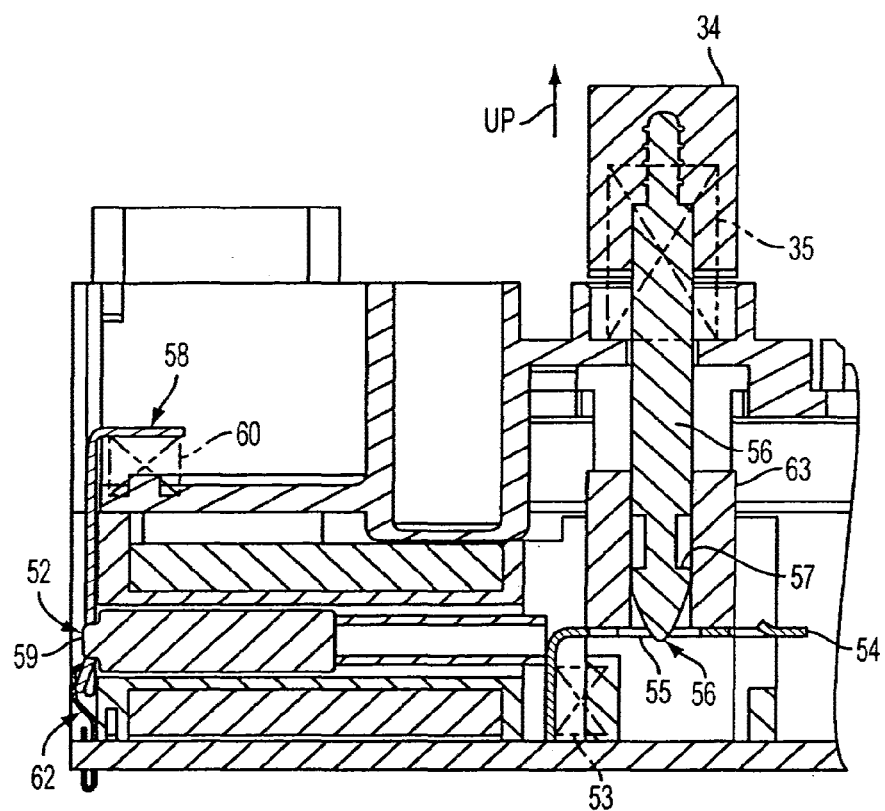
FIGS. 7-9 are cross sectional views illustrating examples of positions of the miswire plate, a latching plate and a reset pin of the ground fault circuit interrupting device of FIG. 1 in accordance with an embodiment of the present application.
Figure 8:
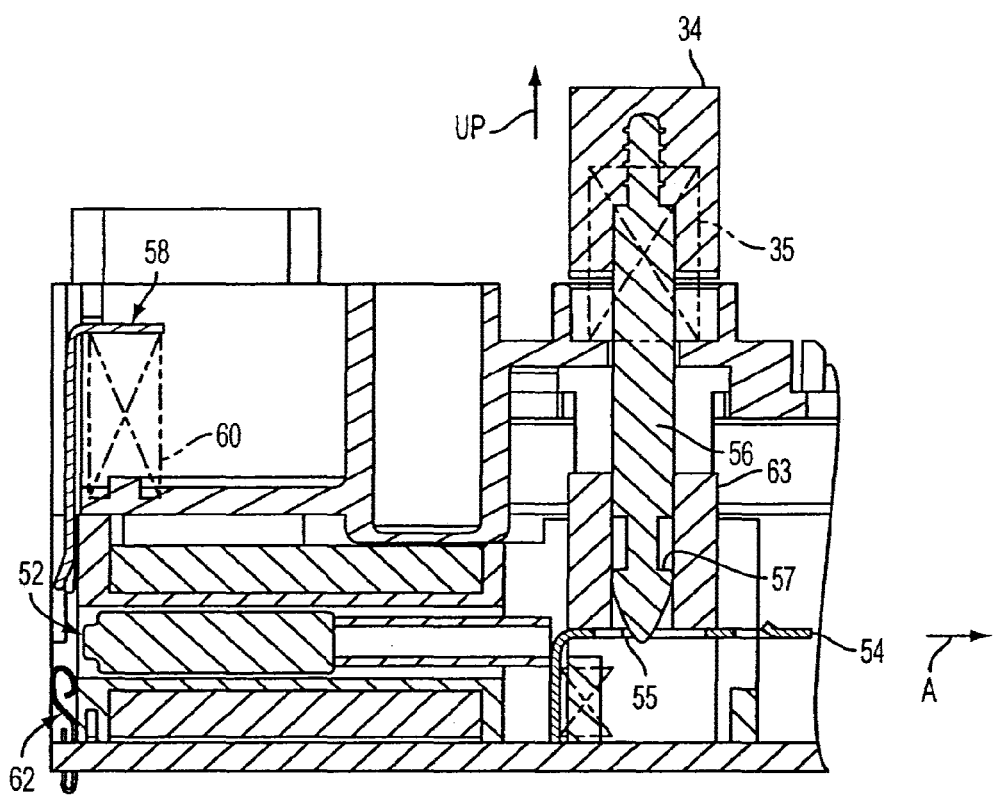
Figure 9:
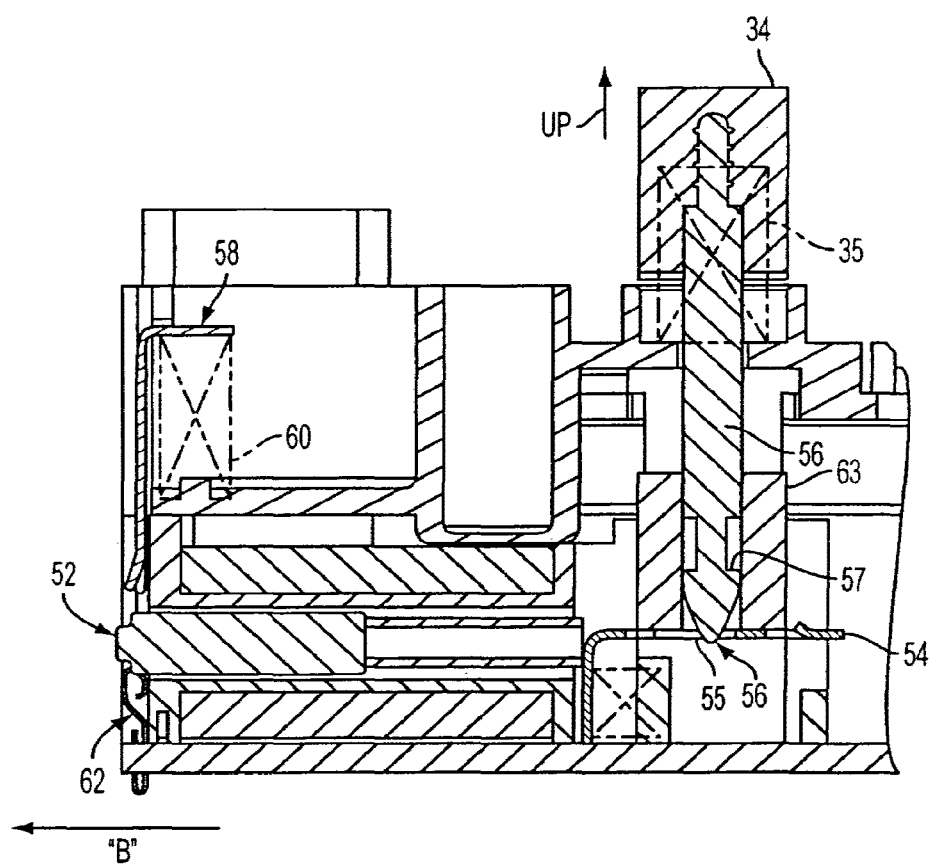

FIGS. 7-9 are cross sectional views illustrating examples of positions of the miswire plate 58, a latching plate 54 and a reset pin 56 in accordance with an embodiment of the present application. In FIG. 7, the miswire plate 58 is shown as being engaged with the projection 53 of the plunger 52 via the aperture 59. The miswire plate 58 makes contact with secondary contacts 62, thus closing them. Locking spring 60 is compressed and exerts pressure against the miswire plate 58, but cannot move miswire plate 58 upwards because miswire plate 58 is held in place by solenoid plunger 52. In addition, latching plate 54 is positioned to prevent the reset pin 56 from engaging with the latching plate 54. That is, the latching plate 54 is positioned to allow the reset pin 56 to freely pass through the latching plate 54 when the reset button is depressed without engaging with the latch plate 54.

FIG. 8 illustrates the GFCI receptacle 10 after power is applied to the line side of the device. The secondary contacts 62 are closed, thus power is applied to the solenoid 50, which drives the plunger 52 forward in the direction of "A". This releases the projection of the plunger 52 from the aperture 59 when power is first applied, and also pushes the plunger 52 against the latching plate 54 to position the opening 53 slightly out of alignment with the reset pin 56. The locking spring 60 urges the miswire plate 58 upward, thus forcing the miswire plate 58 into an extended or non-contacting position. The secondary contacts 62 open and remove power from the solenoid 50.

FIG. 9 illustrates the GFCI receptacle 10 with the miswire plate 58 in a non-engaged state and the latching plate 54 in an alignment state. Specifically, solenoid plunger 52 is free to move in the direction of "B". That is, the latch spring 53 pushes latch plate 54 and solenoid plunger 52 in the "B" direction. Because the solenoid plunger 52 can move further, latching plate 54 can move to an engagement position, such that reset pin 56 engages an edge of aperture 55 in the latching plate 54. The GFCI receptacle is now able to provide ground fault protection.

It should be noted that since contacts 45, 46, 47 and 48 of FIG. 3 are shipped in an open position, if the power source is connected to the load terminals 37 and 38, there is no electrical continuity to the solenoid 50. Thus the solenoid 50 does not remove the solenoid plunger 52 from engagement with the miswire plate 58.

Referring now to FIG. 3 and the operation of the GFCI receptacle 10 in a ground fault state, FIG. 3 is a schematic diagram of a ground fault circuit interrupter in accordance with an embodiment of the present application, in which a conventional GFCI chip 100 is employed in combination with a microprocessor 104 to operate the GFCI receptacle 10. The GFCI receptacle 10 employs a GFCI chip 100 with an output 102 connected to a pin 112 of the microprocessor 104. The microprocessor 104 is preferably a Type PIC12F629 or PIC12F675 microprocessor manufactured by Microchip, located in Chandler, Ariz.

In an embodiment of the present application, the PIC12F675 microprocessor 104 is used where there is a need for an I/O port to accept more than one condition. For example, as an option, the test button 30 and reset button 34 can be voltage divided to share an analog I/O port. A voltage divider can be used to distinguish whether the test or reset button was pressed. In another embodiment of the present application, test button 30 can be eliminated and reset button 34 can be used as a test/reset button. For example, microprocessor 104 would distinguish a first press of the button as being a test and a second press of the button as being a reset. In another embodiment of the present application, the test button 30 and the reset button 34 can be RC coupled to produce signals having different periods of duration which can be detected by the microprocessor 104.

The GFCI device 10 employs two sets of contacts, namely contacts primary hot and neutral contacts 45 and 46 and face hot and neutral contacts 47 and 48. Contact 45 establishes electrical continuity between line terminal 39 and load terminal 37 via hot conductor 66. Contact 46 establishes electrical continuity between line terminal 40 and load terminal 38 via neutral conductor 64. Face contacts 47 and 48 establish electrical continuity between the line terminals 39 and 40 and face terminals 18 and 20 via hot conductor 66 and neutral conductor 64, respectively. The isolation of face contacts 47 and 48 from the load terminals 37 and 38 prevent the face terminals 18 and 20 from being powered if the GFCI device 10 is mistakenly wired so that power source 41 is connected to the load terminals 37 and 38. It should be noted that GFCI device 10 is structured and arranged to permit the electronics of the circuit to be powered only when the GFCI device 10 is wired from the line terminals 39 and 40 via a power source. If a power source 41 is connected to the load terminals 37 and 38, the electronics of the GFCI device 10 cannot be powered, and the miswire plate 58 cannot be released in order to close contacts 45, 46, 47 and 48, which are mechanically closed by the reset button 34. Before initial power is applied contacts 45, 46, 47 and 48 are open. As discussed in more detail below, optocoupler 71 detects current from the load hot conductor 67 and load neutral conductor 65 via conductors 66 and 64 when primary hot contact and primary neutral contact 45 and 46 are closed.

The detection of a ground fault condition at a load connected to one of the face receptacles 18, 20 or to the load terminals 37 and 38, is implemented by a current sense transformer 68A, and the GFCI chip 100 as well as other interconnecting components. The GFCI chip 100 is preferably a Type RV4145N integrated circuit. The GFCI chip 100 and the microprocessor 104 are powered from the line terminals 39 and 40 by a full-wave bridge rectifier 72. A transient voltage suppressor 73 is preferably connected across the line terminals 39 and 40 to provide protection from voltage surges due to lightning and other transient conditions. As the transients increase, the voltage suppressor 73 absorbs energy.

Within the GFCI receptacle 10, the hot conductor 66 and 67, as mentioned above, connect the line terminal 39 to the load line terminal 37, and neutral conductor 64 and 65 connect the line terminal 40 to the load terminal 38, in a conventional manner when contacts 45 and 46 are closed. The conductors 66 and 64 pass through the magnetic cores 67A and 67B of the two transformers 68A and 68B, respectively. The transformer 68A serves as a differential sense transformer for detecting a leakage path between the line side of the AC load and an earth ground (not shown), while the transformer 68B serves as a grounded neutral transformer for detecting a leakage path between the neutral side of the AC load and an earth ground. In the absence of a ground fault, the current flowing through the conductors 64 and 66 are equal and opposite, and no net flux is generated in the core 67A of the differential sense transformer 68A. In the event that a connection occurs between the line side of the AC load and ground, however, the current flowing through the conductors 64 and 66 no longer precisely cancel, and a net flux is generated in the core 67A of the differential sense transformer 68A. This flux gives rise to a potential at the output of the sense transformer 68A, and this output is applied to the input 150 of the GFCI chip 100 to produce a trip signal on the output line 102. The trip signal pulses the SCR's 51 gate which is detected via pin 112 of the microprocessor 104. The solenoid 50 is energized via SCR 51, which opens primary hot contact and neutral contact 45 and 46 and face hot contact and face neutral contact 47 and 48. The optocoupler 71 outputs a signal which is detected by the microcontroller 104 via pin 110. If the optocoupler's 71 signal is high, it indicates that primary hot contact and primary neutral contact 45 and 46 are open. If the optocoupler's 71 signal is low, it indicates that both the primary hot contact and primary neutral contact 45 and 46 are closed Primary hot contact and neutral contact 45 and 46 and face hot contact and face neutral contact 47 and 48 are in a closed state when the reset button 34 has been pressed and the solenoid 50 is deenergized. This state will be referred to as the normal state or closed state. However, when the solenoid 101 is energized, the contacts 45, 46, 47 and 48 are open. This state will be referred to as an abnormal or open state.

In operation, a ground fault can occur via a manual or self-test, or an actual ground fault, for example when a person comes into contact with the line side of the AC load and an earth ground at the same time. In a manual test described in more detail below, a user presses test button 30. Test button 30 is connected between the hot conductor 66 and neutral conductor 64. When the test button 30 is pressed, an imbalance is detected by sense transformer 68A because a path is established outside of the transformers 68. Since there is no canceling current in the opposite direction, sense transformer 68A detects the current imbalance. As discussed above, the GFCI chip 100 detects a fault condition via transformers 68A and 68B. GFCI chip 100 communicates the fault condition via a trip signal on pin 102 to the microprocessor 104 via pin 112. Since the microprocessor 104 has no way of knowing whether a ground fault was triggered by an actual fault or by a manual fault simulated by pressing test button 30, the microprocessor 104 always reacts as if an actual fault condition has occurred.

The microprocessor 104 also does not know whether the actual fault has been removed until a user presses the reset button 34. If the fault is still present, the transformers 68A and 68B will detect the condition and GFCI chip 100 will reopen the contacts immediately as discussed above. If a manual test was performed, the fault will no longer be present and the GFCI device 10 returns to normal operation.

According to an embodiment of the present application, a self-test is performed on the fault detection and circuit tripping portions of the GFCI device 10. In this example, the self test is preferably performed in two stages, Test A and Test B, and preferably at 1 minute intervals. However, as will be appreciated by one skilled in the art, the microprocessor 104 can be programmed to perform testing at any interval of time. During the first stage, which is Test A, of the self-test the microprocessor 104 communicates a signal to the transistor 70 via pin 106 on a negative half sinusoid near the middle of the half sinusoid. The transistor 70 is activated and provides a signal on conductor 69, which creates an imbalance in sensing transformer 68A. The imbalance is detected by GFCI chip 100, and the GFCI chip 100 provides a 0.5 ms trip signal on pin 102 which is detected by the microprocessor 104 via pin 112. Pin 112 of the microprocessor 104 is preferably an analog I/O. Resistor R5, which is in series with the pin 112 of the microprocessor 104, allows capacitor C2 to be monitored. Specifically, when the signal is output from pin 102 of the GFCI chip 100, the charge on capacitor C2 rises. The test signal is short and on a negative half cycle of a sinusoid to prevent current in the sinusoid 50 and thereby avoid tripping the contacts 45, 46, 47 and 48. The microprocessor 104 detects the GFCI chip's trip signal in order to verify that the GFCI chip 100 is operating normally.

It should be noted that the I/O of microprocessor 104 comprises a 10 bit I/O providing 3.2 my per bit accuracy or 31 bits for 0.1 v. The sampling rate of the microprocessor 104 is 15 µs at an internal oscillator frequency of 4 MHz (8 TOSC) and 15 µs×31 bits=0.46 ms. The 2.5 k ohm minimum recommended analog source requirement is met since capacitor C2 has a low source resistance (ESR) and is charged by GFCI chip 100.

It should be noted that during Test A, if the GFCI chip 100 cannot provide an output signal to open the contacts 45, 46, 47 and 48, the microcontroller 104 will activate SCR 51 and energize the solenoid 50 to open the contacts 45, 46, 47 and 48. The user can reset the GFCI device 10 to restore power to the load terminals. However, the microcontroller 104 will no longer send a signal to open the contacts 45, 46, 47 and 48.

The second phase of the self testing according to an embodiment of the present application will now be discussed. The second phase of the embodiment of the present application, which is Test B. Test B tests the operability of SCR 51 and the continuity of solenoid 50 via pin 118 of the microprocessor 104. Specifically, capacitor C2 is quick charged via a 0.5 ms pulse on pin 112 of the microprocessor 104. The 0.5 ms pulse is asserted high 12 ms after the zero crossing at the start of the positive half sinusoid. That is, Test B is initiated only on the negative half sinusoid. The charge on capacitor C2 activates SCR 51 about 0.4 ms from the zero crossing, which is far away from the energy necessary to open contacts 45, 46, 47 and 48. The microprocessor 104 will then detect via pin 118 whether capacitor C5 discharges through the SCR 51 in order to determine if the SCR 51 is operating normally. The microprocessor 104 then detects whether the capacitor C5 recharges after the SCR 51 has turned off in order to determine whether the solenoid 50 has continuity.

In an embodiment of the present application, if the GFCI device 10 determines that the one minute periodic test failed, the one minute test can be repeated, preferably eight times, and if the test fails each time, the GFCI device 10 can be declared as non-operational. As previously described, the red LED 44B will flash. In an embodiment of the present application, the GFCI device 10 allows a user to reset the GFCI device 10 to function in an unprotected mode, if the GFCI device 10 is determined to be non-operational. The red LED 44B will then flash to indicate that the GFCI device 10 is not providing ground fault protection.

It should be noted that if the GFCI device 10 is determined to be nonfunctional, and operates in a receptacle mode of operation, the self tests are prevented from occurring. The microprocessor 104 flashes the red LED 44B via pin 108.

The application will now be described with reference to power/alarm indicator 44. It should be noted that the GFCI chip 100 preferably includes a regulator that provides a dual function. One function is to power the internal circuitry of the GFCI chip 100. The second function is to power circuitry external to the GFCI chip 100 (such as Green LED 44A). The Green LED 44A illuminates during normal operation of the GFCI receptacle 10. The Red LED 44B is illuminated solid if contacts 45, 46, 47 and 48 have been tripped and the Green LED 44A is extinguished. However, the Red LED 44B flashes to indicate that the GFCI receptacle 10 is not providing ground fault protection if any of the self tests have failed.

Figure 10:
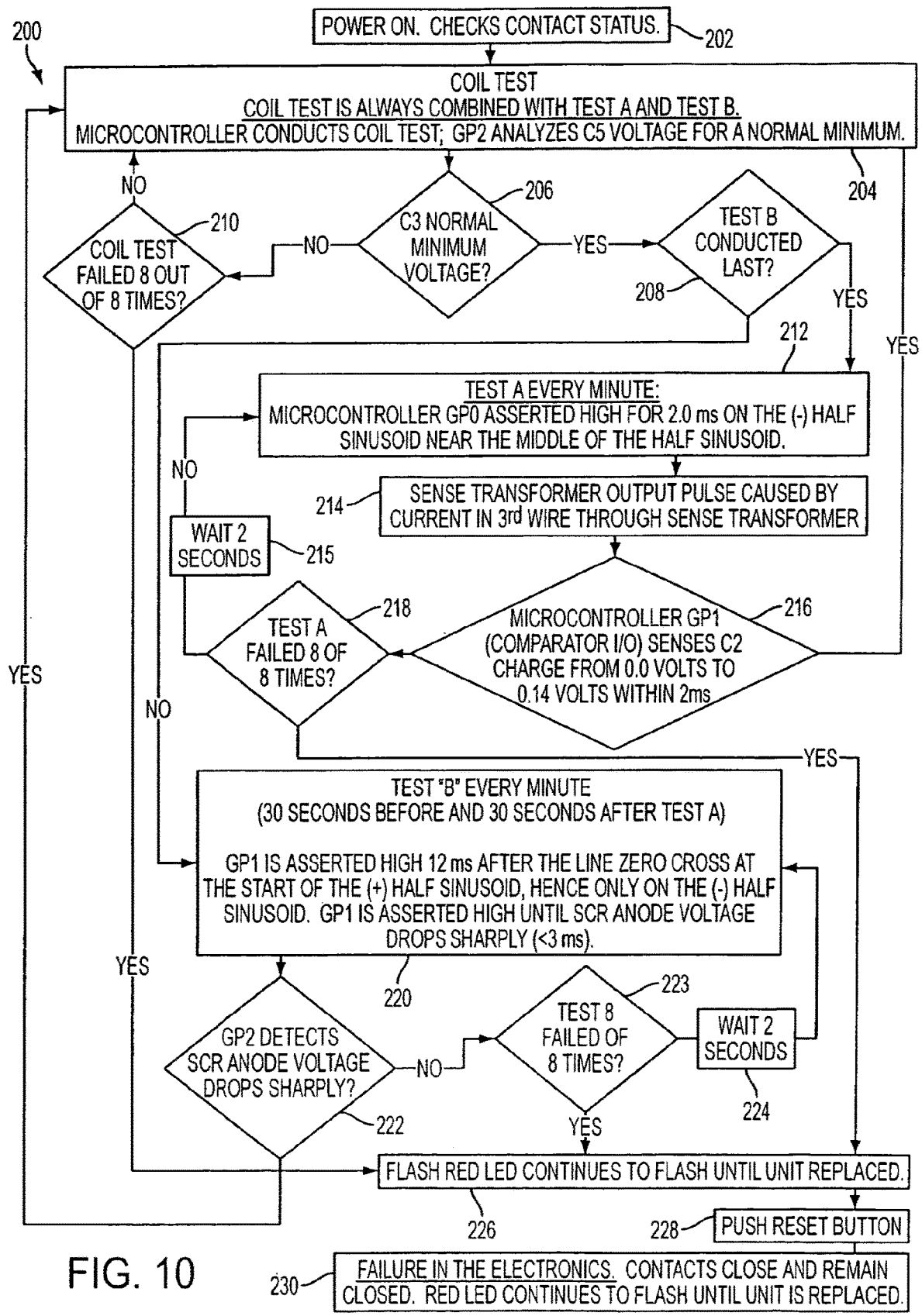
FIG. 10 is a flow chart of an example of a method of performing an automatic self-test on the GFCI in accordance with an embodiment of the present application.

FIG. 10 is a flow chart of an example of a method of performing an automatic self-test on the GFCI in accordance with an embodiment of the present application. The method 200 is initiated at step 202 where the GFCI receptacle 10 is powered on and the status of the primary hot and neutral contacts 45 and 46 is determined via pin 110 of the microprocessor 104. At step 204, a decision is made to initiate a self-test. The self-test is preferably performed in two stages or tests. Test A comprises testing sense transformer 68A and GFCI circuit 100. Test B comprises testing the SCR 51. An exemplary automatic self-test is preferably performed once per minute. The self-test tests the solenoid 50 before each of Test A and Test B. However, it should be appreciated by those skilled in the art that a self-test can be scheduled at any interval of time without departing from the scope of the present application.

At step 206, a determination is made as to whether C5 is at a normal minimum voltage which indicates that solenoid 50 has continuity. If the determination at step 206 is answered negatively, the method proceeds to step 210 where a determination is made as to whether the solenoid test failed 8 out of 8 times. If the determination at step 210 is answered affirmatively, the method proceeds to step 226. If the determination at step 210 is answered negatively, the method returns to step 204.

If the determination at step 206 is answered affirmatively, the method proceeds to step 208 where a determination is made as to whether Test B was conducted last. If test B was not conducted last, the method proceeds to step 220. If Test B was conducted last, the method proceeds to step 212 to perform Test A.

At step 212, Test A is performed. The microcontroller 104 is asserted high at pin 106 for about 1.5 ms near the middle of a negative half sinusoid of the line input 39, and preferably less than about 2.0 ms. The high signal on pin 106 turns transistor 70 on resulting in a signal on third wire 69. It should be noted that the SCR 51 anode capacitor C5 waveform is used to locate positive and negative half sinusoids and the middle of half sinusoids. Capacitor C5 voltage minimum occurs slightly after the true zero crossing during the negative half cycle. The microcontroller 104 preferably monitors the voltage C5 via pin 118, and may include software to calculate the actual zero crossing.

At step 214, the sense transformer 68A detects the pulse on third wire 69 as an imbalance and provides an imbalance indication to the GFCI chip 100. The GFCI chip 100 places a trip signal on pin 102 of the GFCI chip 100 which charges capacitor C2.

At step 216, a determination is made as to whether the microcontroller 104 detects capacitor C2 being charged from 0.0 volts to preferably 0.28 volts. The rise in capacitor C2 occurs preferably in less than 1.5 ms. If the determination at step 216, is answered affirmatively, the method returns to step 204.

If the determination at step 216 is answered negatively, the process proceeds to step 218 where a determination is made as to whether Test A, which tests the sense transformer 68A and GFCI chip 100 has failed 8 out of 8 times.

If the determination at step 218 is answered negatively, the process waits for 2 seconds at step 219 then returns to step 212. If the determination at step 218 is answered affirmatively, the process proceeds to step 226.

At step 220, Test B is performed every minute preferably 30 seconds before and 30 seconds after Test A. The microcontroller 104 places a high signal on pin 112 of the microcontroller 104 after the zero crossing at and the positive half sinusoid, hence only on the negative half sinusoid. Pin 112 is maintained high until the SCR anode voltage drops sharply after 2 ms but no longer than 3 ms. Capacitor C5 can discharge through SCR 51 rather than through R15 and R16 which is a slow discharge. The method proceeds to step 222.

At step 222 a determination is made as to whether the microcontroller 104 detects a sharp drop in the SCR anode voltage at pin 118. That is the microcontroller 104 looks for the SCR anode voltage to drop sharply to ground. Test B is performed during the negative half cycle when the solenoid 50 advantageously cannot be tripped.

If the determination at step 222 is answered affirmatively, Test B has passed and the method returns to step 204. If the determination at step 222 is answered negatively, the process proceeds to step 224 where a determination is made as to whether Test "B" has failed 8 out of 8 times. If Test B has failed eight times, the method proceeds to step 226.

At step 226, the microcontroller 104 flashes the red LED 42B permanently via pin 108 if Test "A" or "B" failed 8 out of 8 times. The flashing of the red LED 42B provides an alarm indication to a user that GFCI 10 is nonfunctional and has reached its End Of Life (EOL). If Test "A" fails and the failure of the GFCI 10 prevents the GFCI chip 100 from providing an output on pin 102 to open the contacts, the microcontroller 104 provides a signal to activate SCR 51 and open the primary hot and neutral contacts 45 and 46. It should be noted that the user is not permanently locked-out. The user is still able to reset GFCI 10 to restore power. However, the microcontroller 104 will no longer conduct self-tests, and will not generate another signal to open the primary hot and neutral contacts 45 and 46. Manual tests, however, remain available to the user.

At step 228, the reset button 34 is pressed in order to reset the primary hot and neutral contacts 45 and 46 of the GFCI 10. At step 230, the red LED 42B continues to flash if the primary hot and neutral contacts 45 and 46 remain closed. The malfunctioning GFCI 10 should be replaced.

Figure 11:
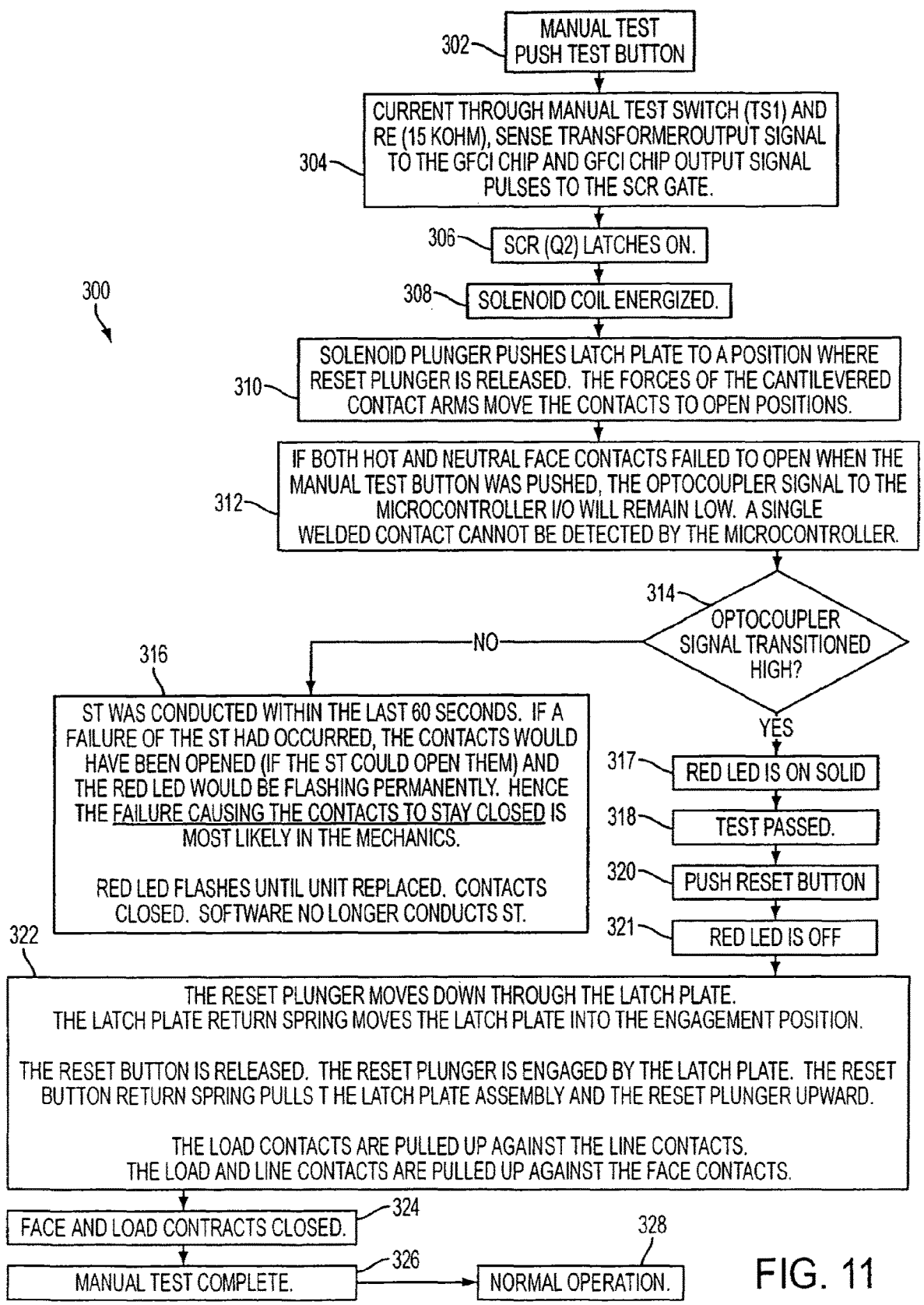
FIG. 11 is a flow chart of an example of a method of performing a manual test on the GFCI in accordance with an embodiment of the present application.

FIG. 11 is a flow chart of an example of a method of performing a manual test on the GFCI in accordance with an embodiment of the present application. The process 300 is initiated at step 302 where the test button 30 is pressed.

At step 304, the pressing of the test button causes an imbalance in the sense transformer 68A because the current from the line neutral flows through line 61. The sense transformer 68A communicates an imbalance signal to the GFCI chip 100, which places a trip signal on pin 102 of the GFCI chip 100.

At step 306, the trip signal activates the SCR 51, which results in the solenoid 50 being energized at step 308. The energization of the solenoid 50 results in the solenoid plunger 52 pushing the latch plate 54 to a position where the reset pin 56 is released. The force of the cantilevered contact arms then move the primary hot and neutral contacts 45 and 46 to an open position at step 310.

At step 312, if both the primary hot and neutral contacts 45 and 46 fail to open when the test button 30 is pressed, the optocoupler's 71 signal to the microcontroller 104 remains low. Thus, this embodiment of the present application can detect dual welded contacts.

At step 314, a determination is made as to whether the optocoupler signal transitioned high indicating that the primary hot and neutral contacts 45 and 46 opened. If the determination at step 314 is answered negatively, the method proceeds to step 316 where the red LED 44B flashes until the GFCI 10 is replaced. Since the manual test has been performed and the primary hot and neutral contacts failed to open, the failure of the manual test is due to a problem affecting the mechanics of the GFCI 10. Thus, the self test is no longer performed. As with a failure of the self test, as described above, a failure of the manual test causes the Red LED 44B to flash until the unit is replaced. Self tests will no longer be performed and the unit operates in an unprotected receptacle mode until replaced.

If the determination at step 314 is answered affirmatively, the method proceeds to step 318 where the manual test passes once the primary hot and neutral contacts 45 and 46 open.

At step 320 the user presses the reset button 34. Then at steps 322 and 324, the reset pin 56 is then positioned through the latch plate 54 into a position of engagement. When the reset button 34 is released, the reset pin engages the latch plate 54. The reset button 34 return spring 35 pulls the latch plate assembly and the reset pin 56 upward. This results in the primary hot and neutral contacts 45 and 46 and the face hot and neutral contacts 47 and 48 closing.

The closing of the contacts results in the completion of the manual test at step 326. At step 328, the GFCI 10 returns to monitoring for ground faults and performing periodic self tests.

Figure 12:
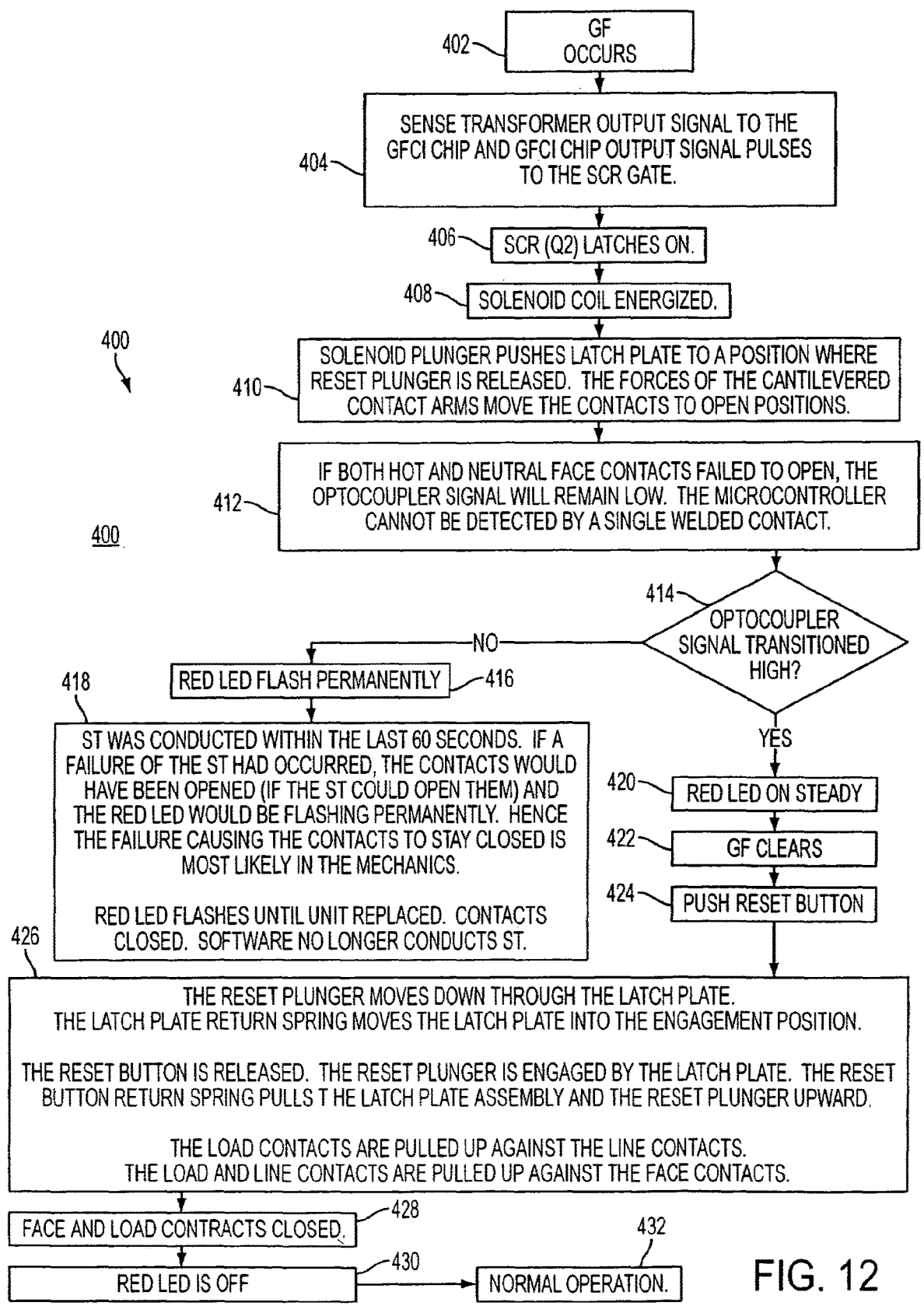
FIG. 12 is a flow chart of an example of a method of responding to an externally generated ground fault using the GFCI device in accordance with an embodiment of the present application.

FIG. 12 is a flow chart of an example of a method of responding to an externally generated ground fault using the GFCI device in accordance with an embodiment of the present application. The process 400 is initiated at step 402 when an actual ground fault occurs.

At step 404, the ground fault is detected via an imbalance in the sense transformer 68A because the current from the line neutral conductor 64 flows through the third wire 69. The sense transformer 68A communicates an imbalance signal to the GFCI chip 100, which places a trip signal on pin 102 of the GFCI chip 100.

At step 406, the trip signal activates the SCR 51, which results in the solenoid 50 being energized at step 408. The energization of the solenoid 50 results in the solenoid plunger 52 pushing the latch plate 54 to a position where the reset pin 56 is released. The force of the cantilevered contact arms then move the primary hot and neutral contacts 45 and 46 to an open position at step 410.

At step 412, if both the primary hot and neutral contacts 45 and 46 fail to open when the test button 34 is pressed, the optocoupler's 71 signal to the microcontroller 104 remains low. It should be noted that the embodiment of the present application can detect dual welded contacts.

At step 414, a determination is made as to whether the optocoupler's 71 signal transitioned high indicating that the primary hot and neutral contacts 45 and 46 opened. If the determination at step 414 is answered negatively, the method proceeds to step 416 where the red LED 44B flashes permanently until the GFCI 10 is replaced. Since the self test has recently been performed and passed and the primary hot and neutral contacts 45 and 46 failed to open, the failure of the contacts to open is due to a problem affecting the mechanics of the GFCI 10. Thus, the self test is no longer performed at step 418, and the GFCI operates in a receptacle mode until replaced.

If the determination at step 414 is answered affirmatively, the method proceeds to step 420 where the red LED 44B is illuminated solid. This indicates that the primary hot and neutral contacts 45 and 46 and the face hot and face neutral contacts 47 and 48 have opened. The ground fault condition is cleared at step 422.

At step 424 the user presses the reset button 34. Then at steps 426 and 428, the reset pin 56 is then positioned through the latch plate 54 into a position of engagement. When the reset button 34 is released, the reset pin 56 engages the latch plate 54. The reset button 34 return spring 35 pulls the latch plate assembly and the rest pin 56 upward. This results in the primary hot and neutral contacts 45 and 46 and the face hot and face neutral contacts 47 and 48 closing.

At step 430, the closing of the contacts results in the primary hot and neutral contacts 45 and 46 and the face hot and face neutral contacts 47 and 48 closing and the red LED 44B being extinguished.

At step 322, the GFCI receptacle 10 returns to monitoring for ground fault conditions and performing periodic self-tests.

Figure 13:
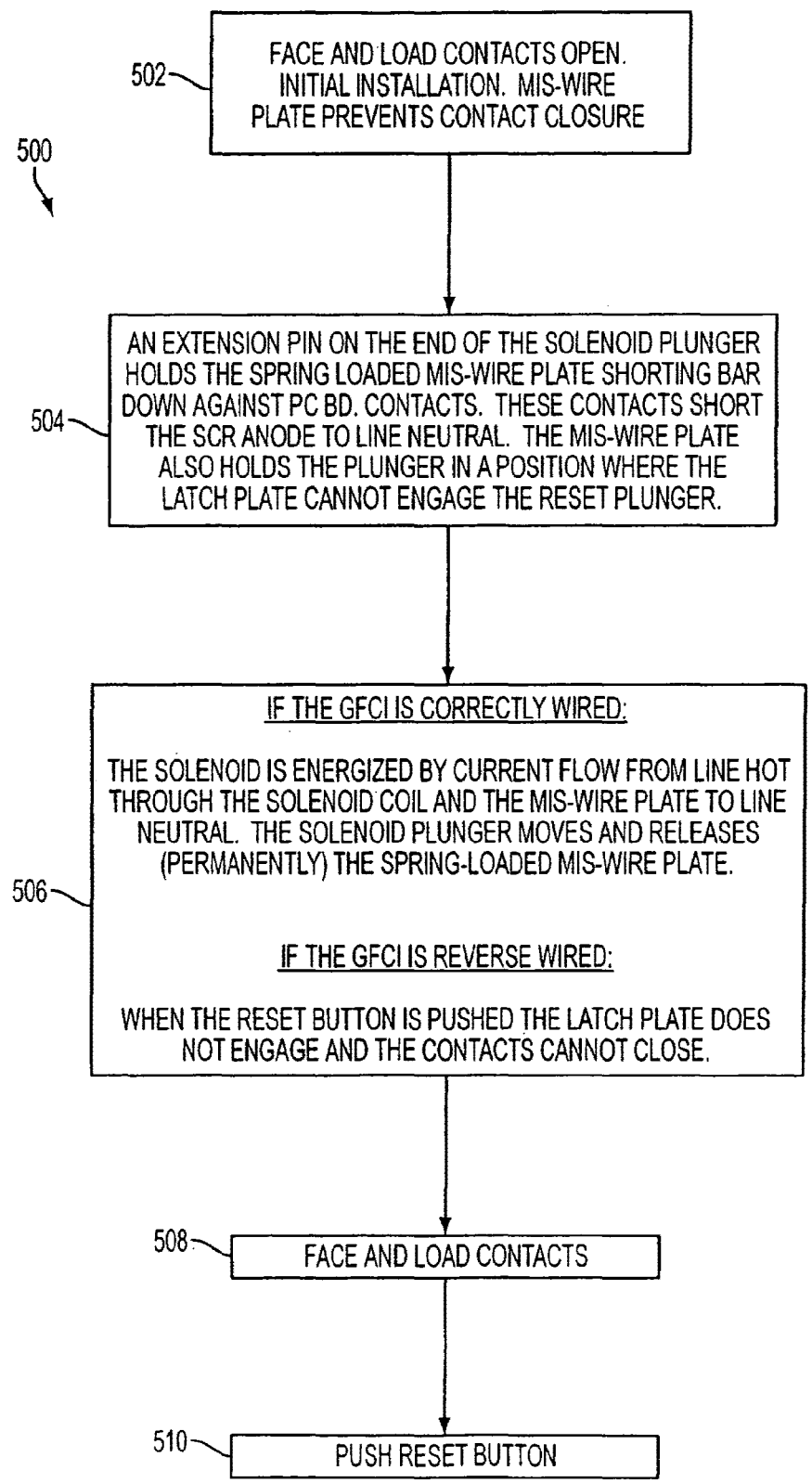
FIG. 13 is a flow chart of an example of a miswire prevention method using the GFCI device in accordance with an embodiment of the present application.
Figure 14A:
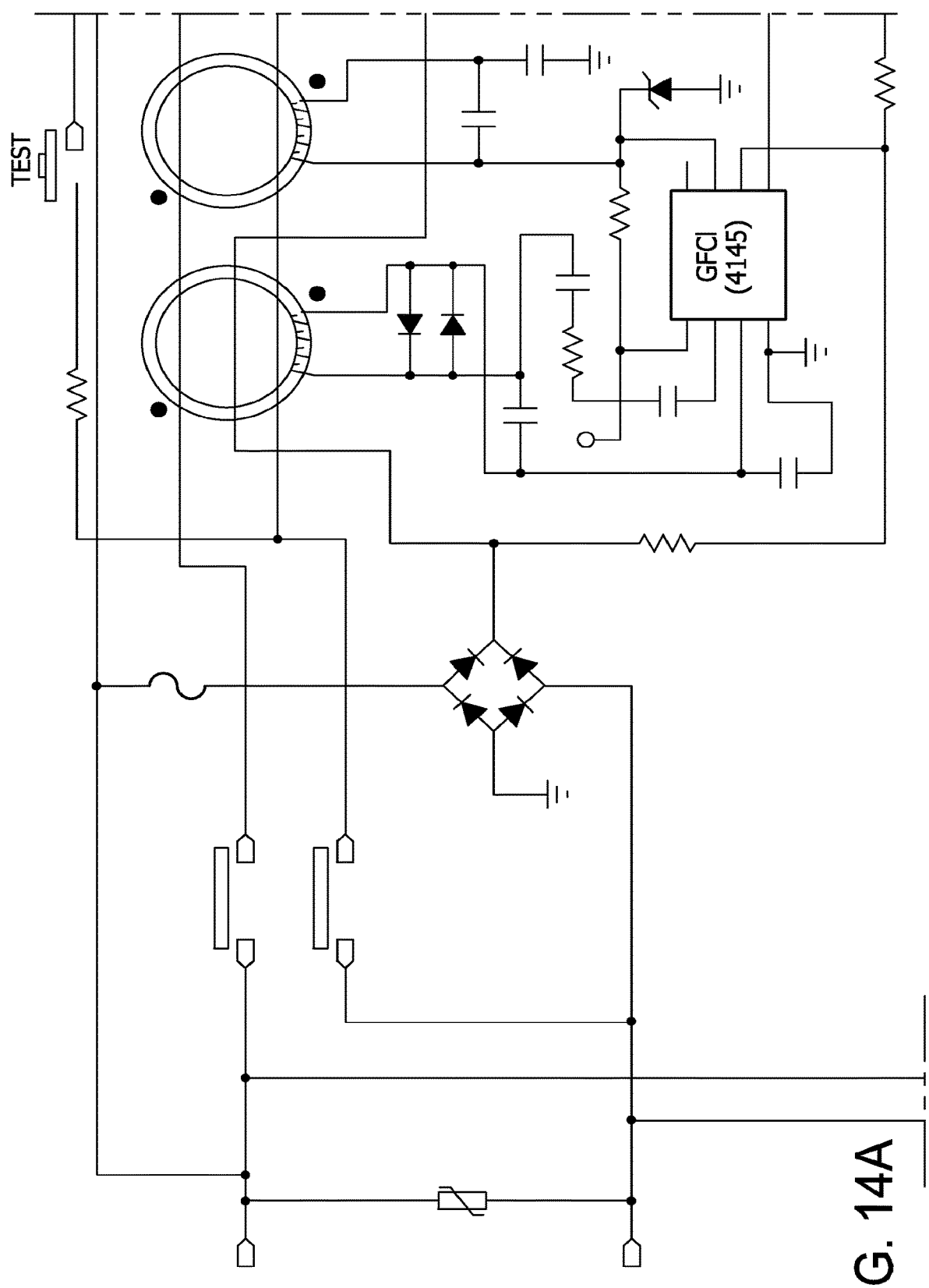
FIGS. 14A-14D is a schematic diagram of a ground fault circuit interrupter in accordance with an embodiment of the present application.
Figure 14B:
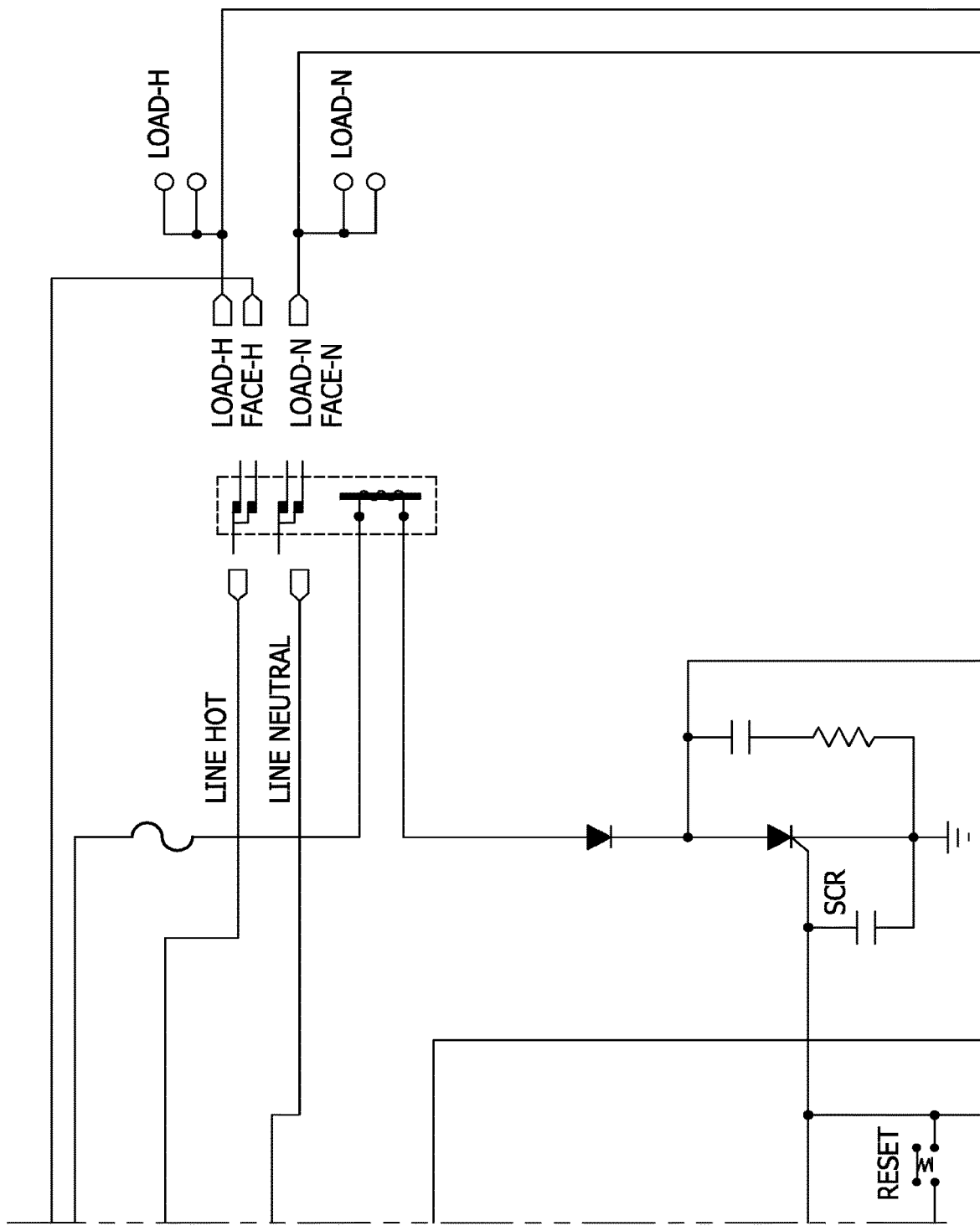
Figure 14C:
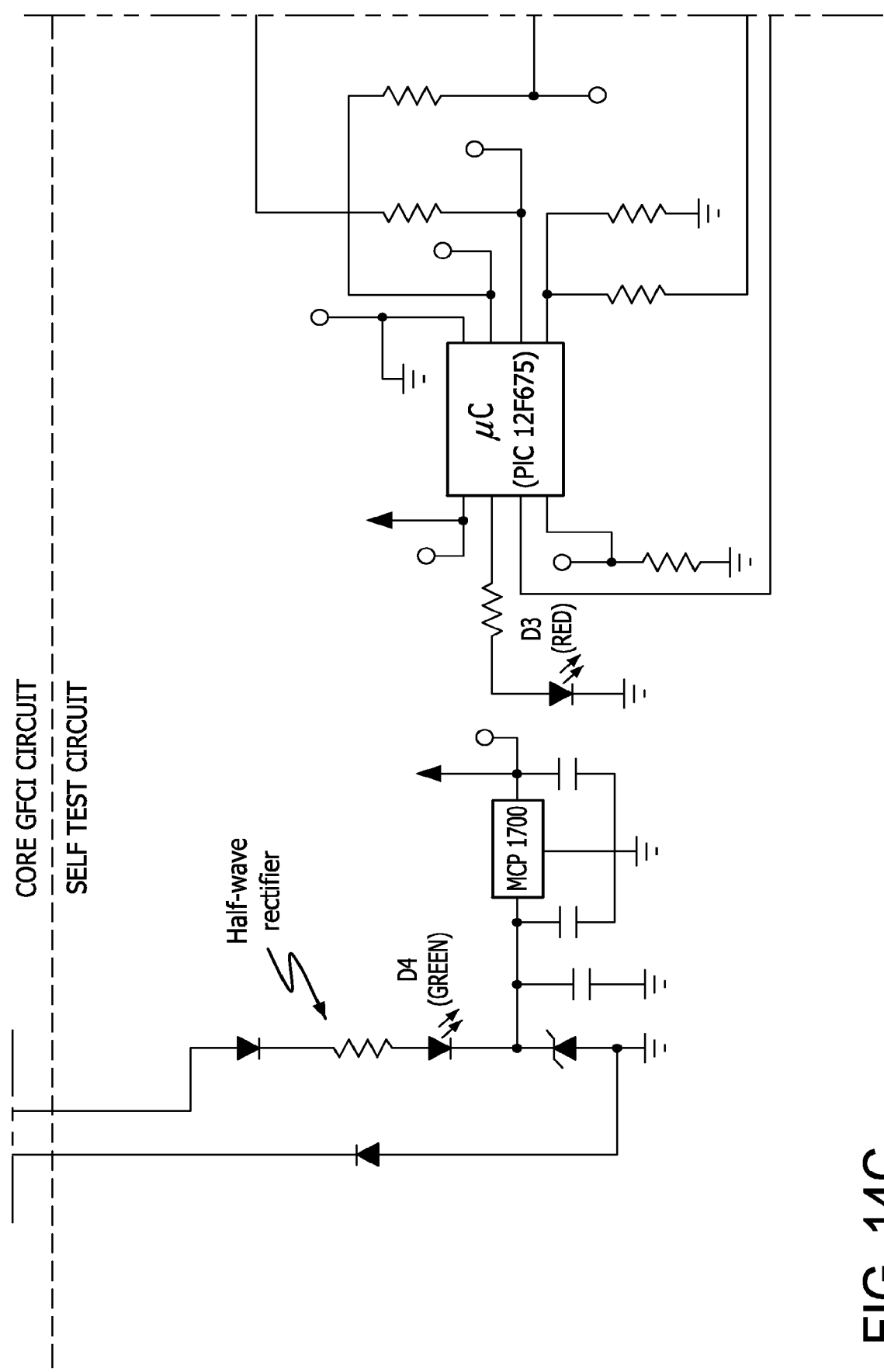
Figure 14D:
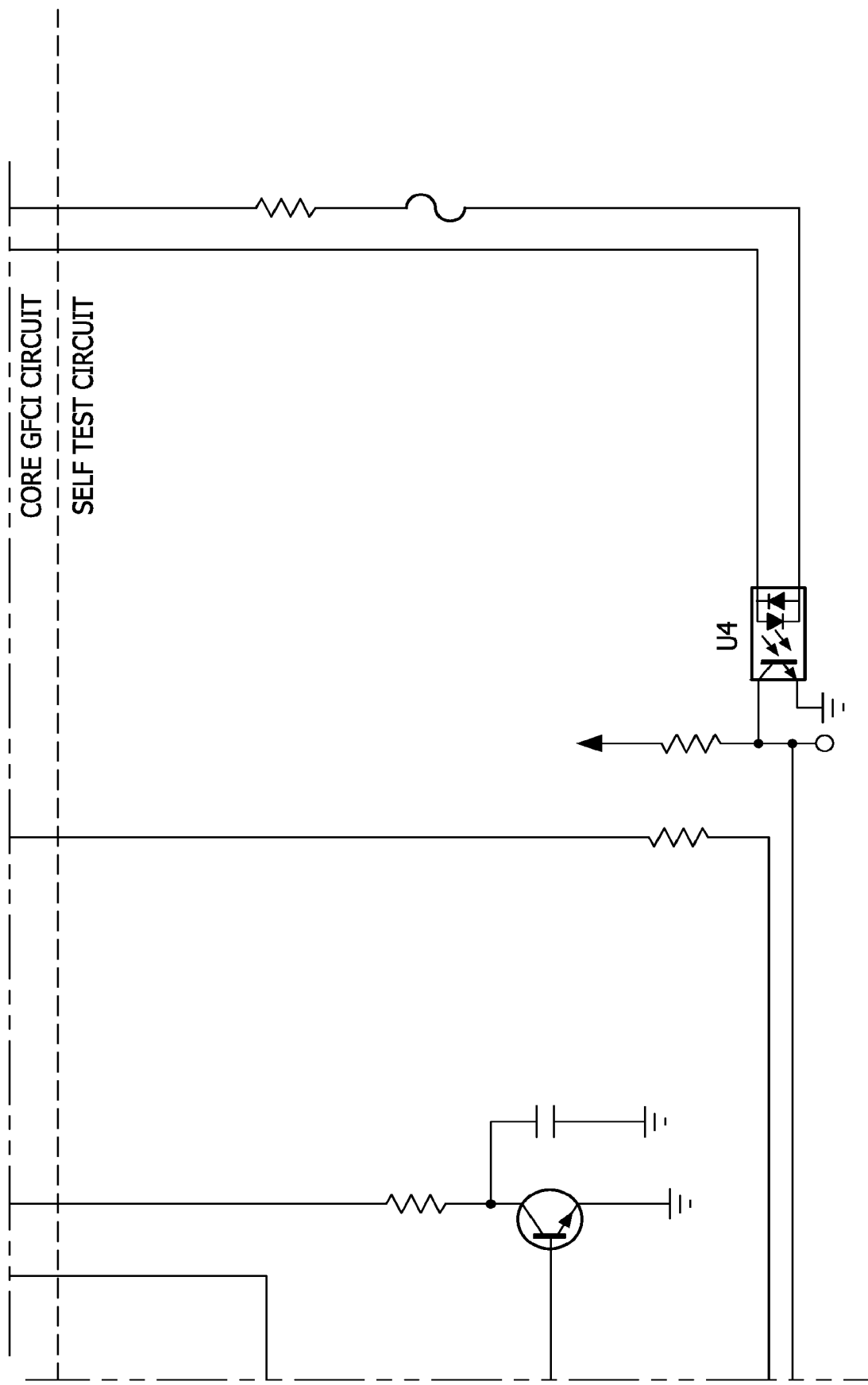
Figure 15A:
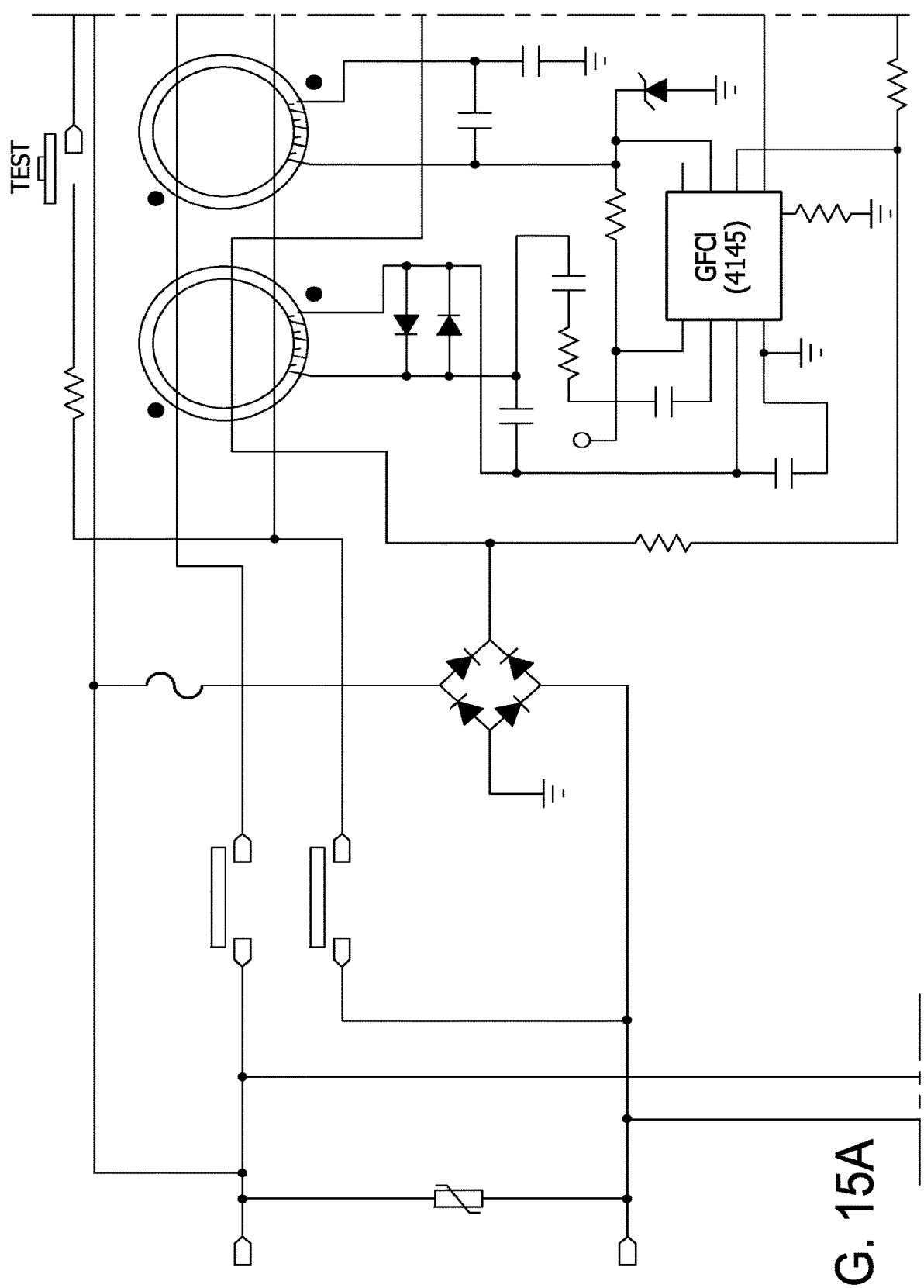
FIGS. 15A-15D is a is a schematic diagram of a ground fault circuit interrupter in accordance with an embodiment of the present application.
Figure 15B:
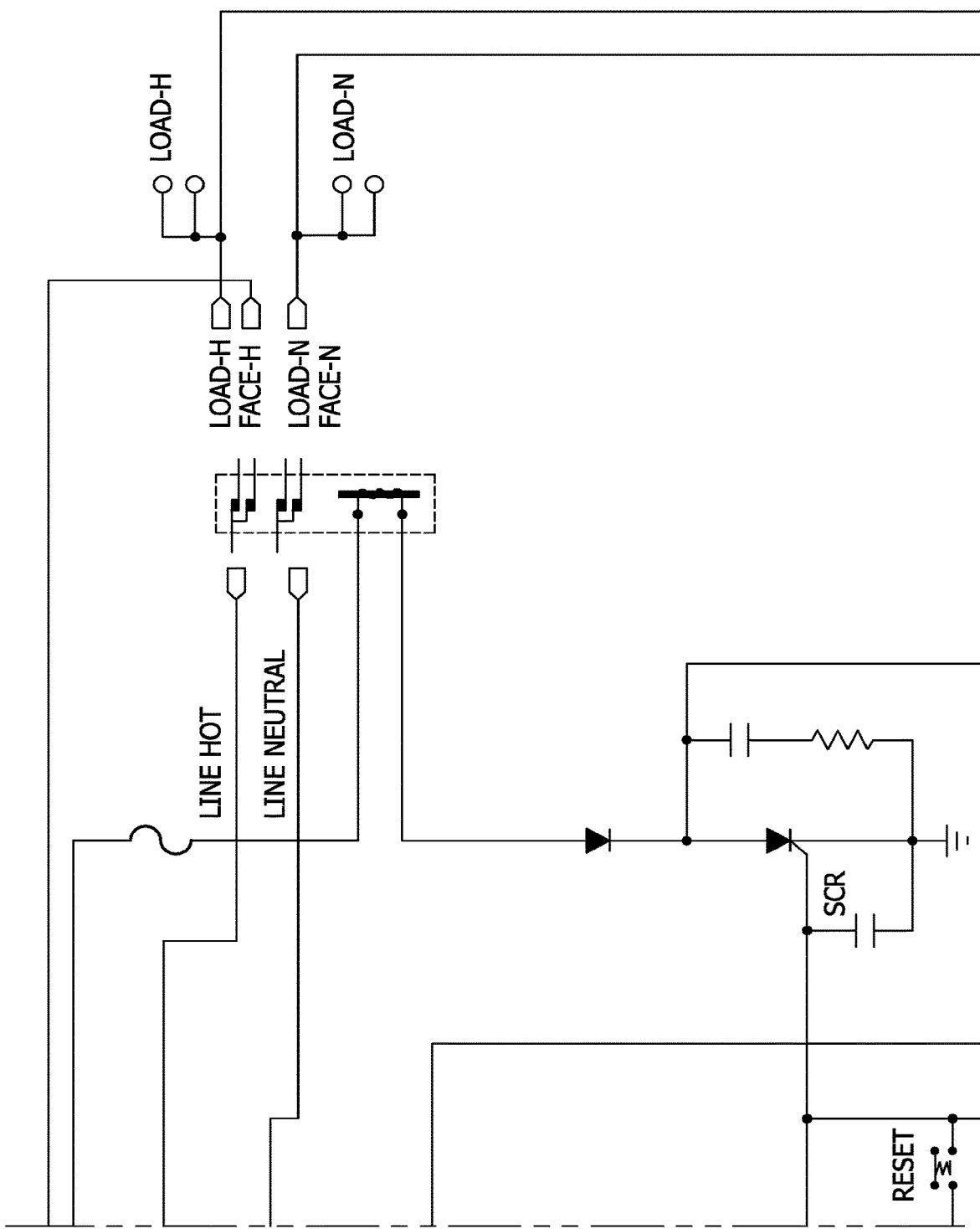
Figure 15C:
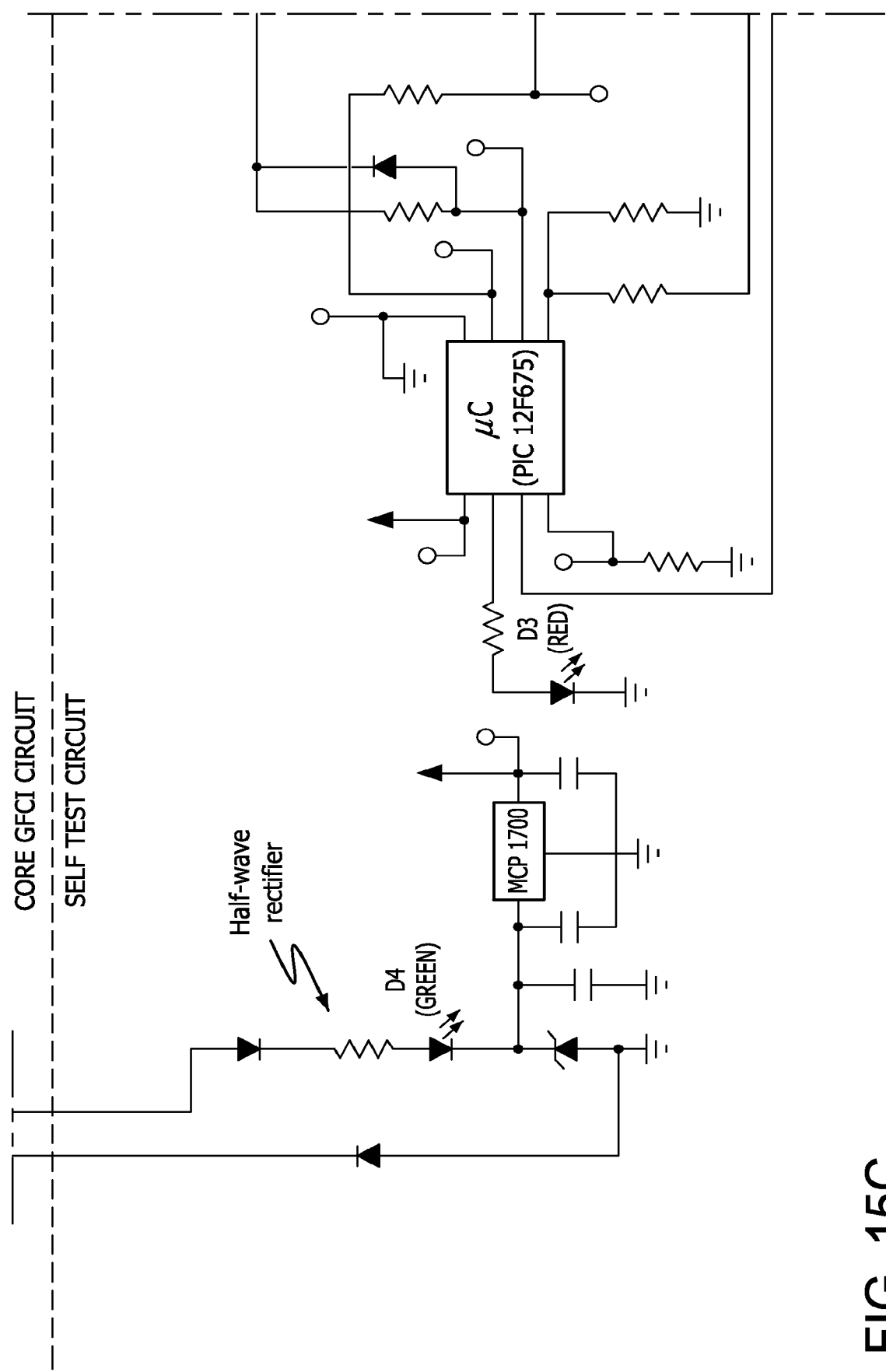
Figure 15D:
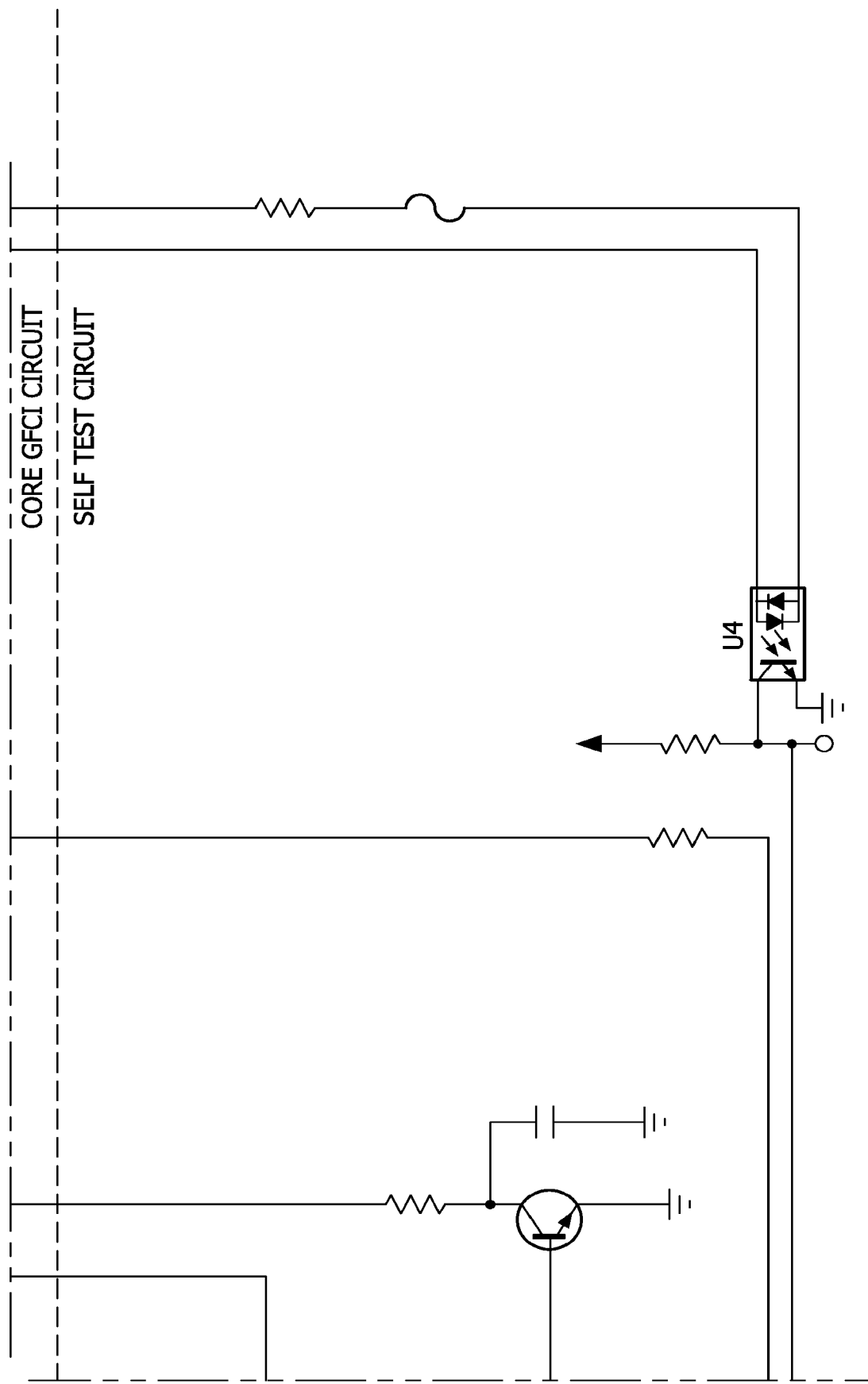
Figure 16A:
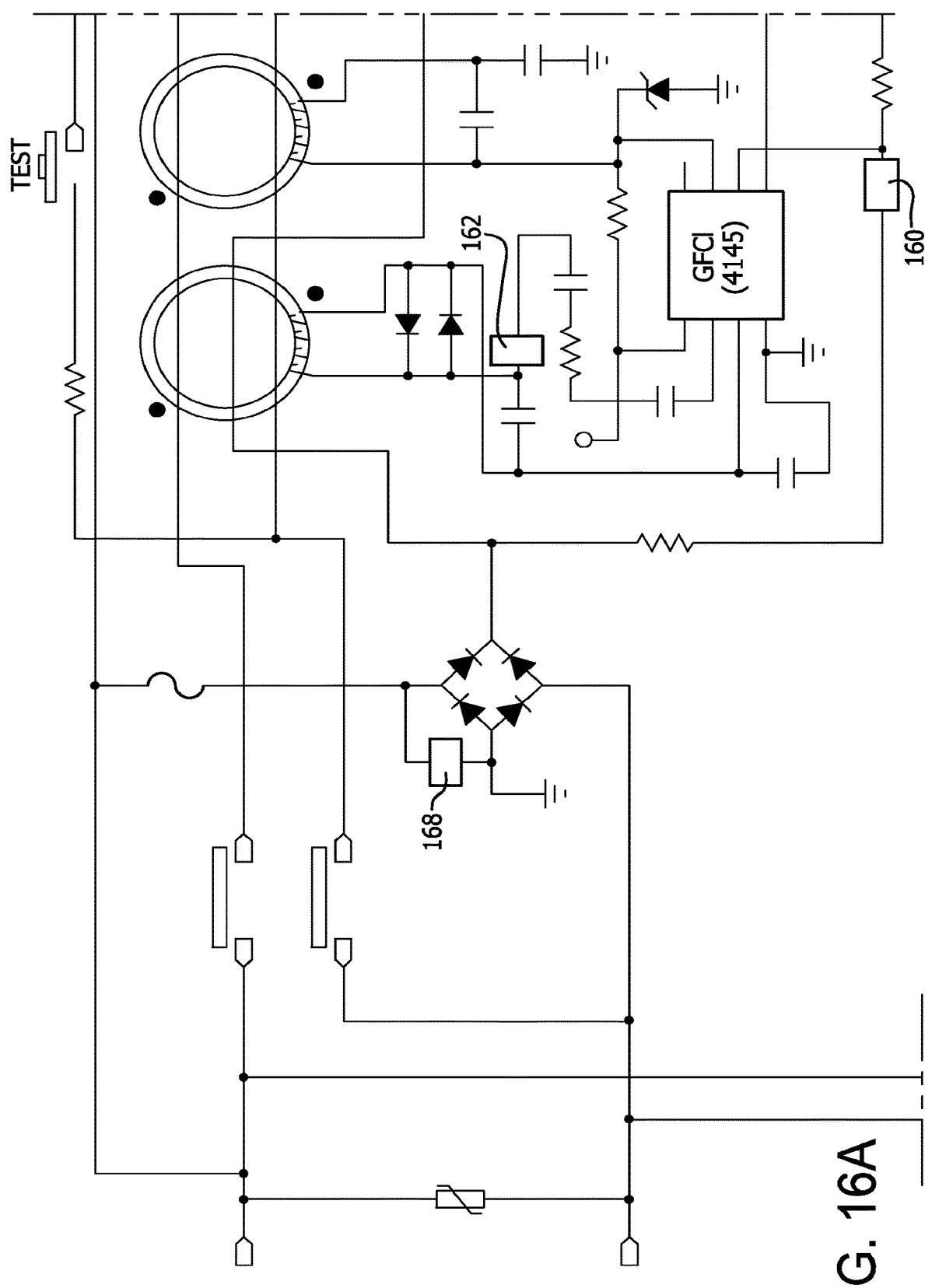
FIGS. 16A-16D is a schematic diagram of a ground fault circuit interrupter illustrating how various test requirements are met in accordance with an embodiment of the present application.
Figure 16B:
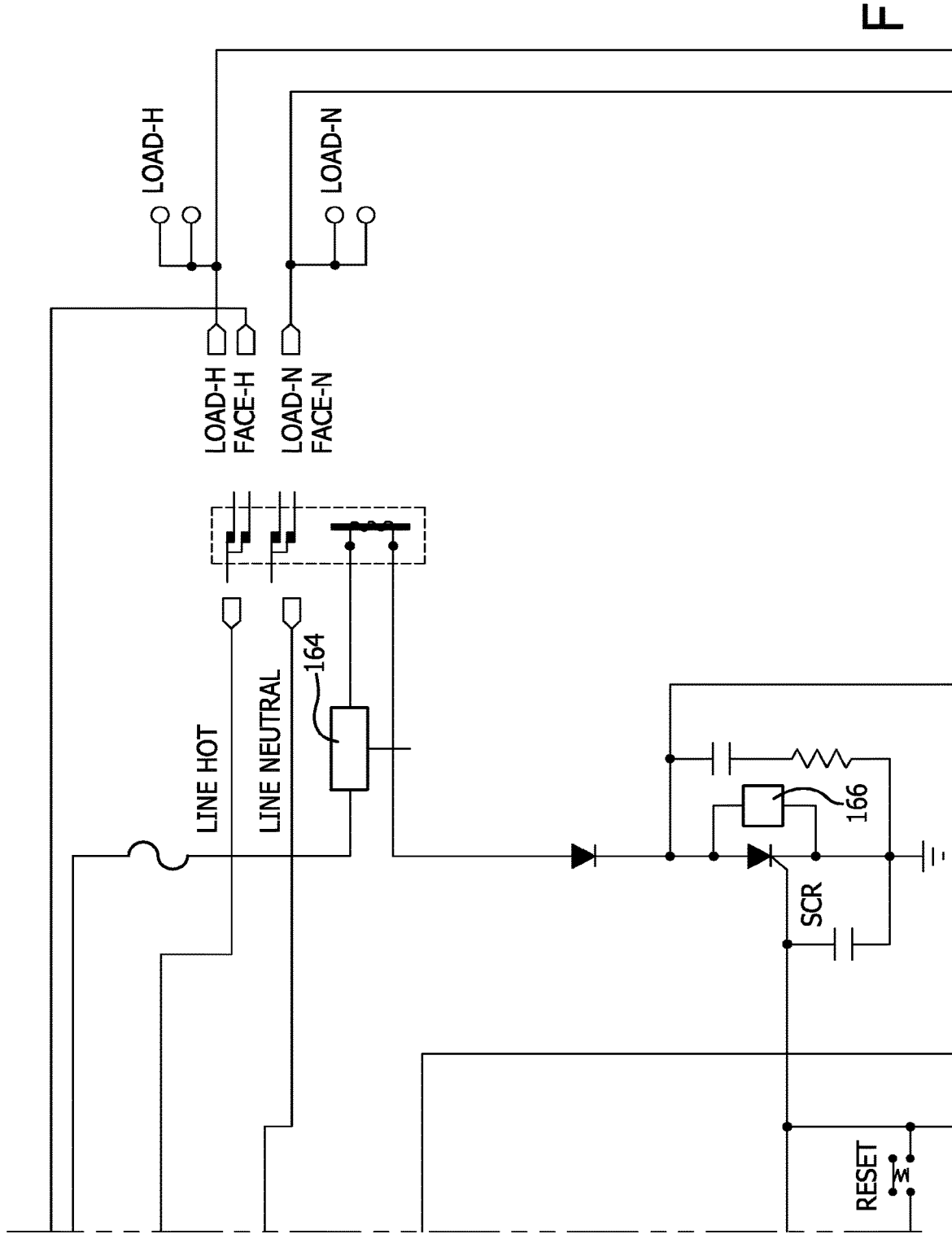
Figure 16C:
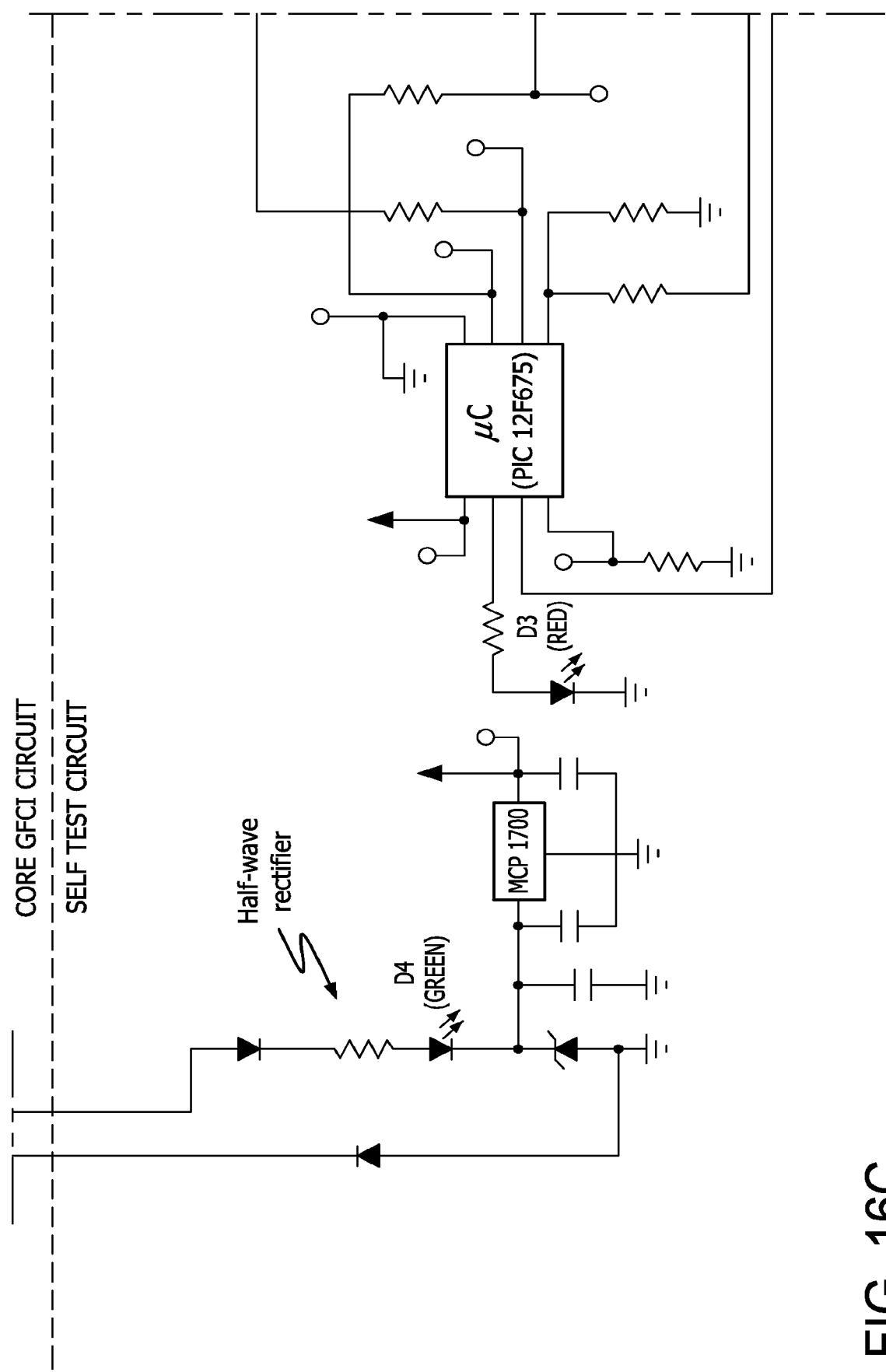
Figure 16D:
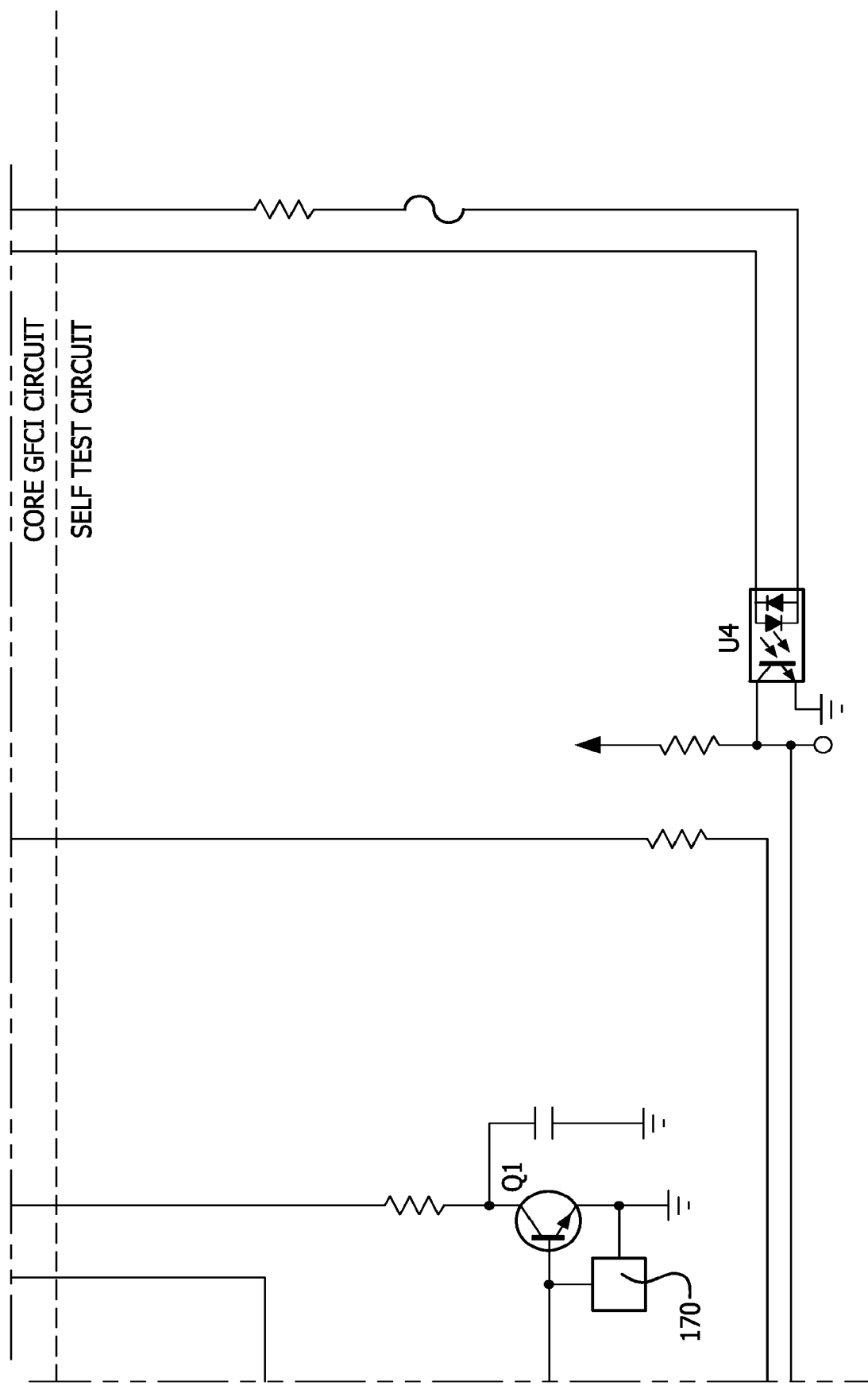

FIG. 13 is a flow chart of a miswire prevention method using the GFCI device in accordance with an exemplary embodiment of the present application. The method 500 is initiated at step 502 where the initial installation is being performed. Thus, the primary hot and neutral contacts 45 and 46 and the face hot and face neutral contacts 47 and 48 are open due to the miswire plate 58 prevents the reset pin from engaging the latching plate. Therefore, the primary hot and neutral contacts 45 and 46 and the face hot and face neutral contacts 47 and 48 are prevented from closing if the GFCI receptacle 10 is miswired on the load side. As described above, the GFCI device is required to be wired upon initial installation from the line side in order for the solenoid 50 to be energized and remove the solenoid plunger 52 from engagement with the miswire plate 58.

At step 504, an extension pin on the solenoid plunger 52 holds the spring biased miswire plate 58 against the secondary contacts 62. The secondary contacts 62 short the SCR's 51 anode to line neutral 64. The miswire plate 58 also maintains solenoid plunger 52 in a position where the latch plate 54 cannot engage the reset pin 56.

At step 506, if the GFCI receptacle 10 is miswired on the load side, the solenoid 50 cannot be energized to displace the solenoid plunger 52. If the GFCI receptacle 10 is wired correctly, which is from the line side, the solenoid 50 is energized and displaces the solenoid plunger 52 releasing the miswire plate 58 permanently.

At step 508, the primary hot and neutral contacts 45 and 46 and the face hot and face neutral contacts 47 and 48 are still open but are closed when the reset button 34 is depressed at step 510.

FIGS. 14A-14D (FIG. 14) is a circuit schematic illustrating a further embodiment of the application. The circuit in FIG. 14 is substantially similar to FIG. 3. One difference is the power supply circuit, e.g., half-wave rectified AC power, in the lower left side of FIG. 14, which is not shown in FIG. 3. Further, green power indicator LED (D4) is located as part of this power supply circuit in FIG. 14 instead of being powered by the full-wave reciter in FIG. 3. Also, a reset switch connected between the rectifier bridge and the gate of the SCR is provided in FIG. 14, for example, to drive the SCR gate when the reset button is pressed.

FIGS. 15A-15D (FIG. 15) is a circuit schematic illustrating a further embodiment of the application. The circuit in FIG. 15 is substantially similar to FIG. 14 with certain exceptions. For example, in the embodiment shown in FIG. 14, I/O port GP1 of the microcontroller is connected to the circuit node between the SCR OUT port of the GFCI IC device and the SCR gate for the sole purpose of reading the SCR drive signal from the GFCI device to determine if the GFCI IC device is properly detecting self-test faults. In comparison, according to the circuit in FIG. 15, the software within the microcontroller is modified such that the microcontroller converts the status of the I/O port GP1 from an input (e.g., for reading the SCR OUT signal from the GFCI IC device) to an output so it can independently drive the gate of the SCR, for example, when end-of-life (EOL) is determined.

Further, according to a further aspect of the embodiment of FIG. 15, power can be denied to the load and face contacts, for example, when EOL is determined, by driving the output signal on GP1 to permanently maintain the SCR gate at a level that prevents the SCR from turning ON. According to this feature, even if the reset button is pressed and the reset switch in FIG. 15 closes, the gate of the SCR will remain undriven, or OFF.

FIGS. 16A-16D (FIG. 16) is a circuit schematic illustrating a further embodiment of the application. The circuit in FIG. 16 is substantially similar to the circuit in FIG. 15 with certain exceptions. According to the embodiment of FIG. 16, the circuit is provided with certain modifications that represent certain single component failure modes that may prevent the GFCI device from properly responding to a ground fault. These modifications may be provided by external hardware or may be resident on within the GFCI device being tested and can be implemented, for example, by a switch device. Further, the modifications are in the form of a short-circuit condition or an open-circuit condition and enable the fault detector device to be tested in accordance with certain testing requirements, such as those set forth in accordance with UL943.

For example, as shown in FIG. 16 at reference number 160, an open-circuit condition is applied to alter the integrated circuit (IC) responsible for the ground fault detection, i.e., the GFCI IC device, by disconnecting the power to the supply pin of the IC device. At reference number 162 an open-circuit condition is applied to alter the integrated circuit responsible for the ground fault detection by opening the signal path at the subject IC pin, e.g., the INPUT port of the GFCI IC device. Further, at reference number 164 an open-circuit condition is applied in the current path to the solenoid, thus, preventing the solenoid from being activated.

Figure 17:
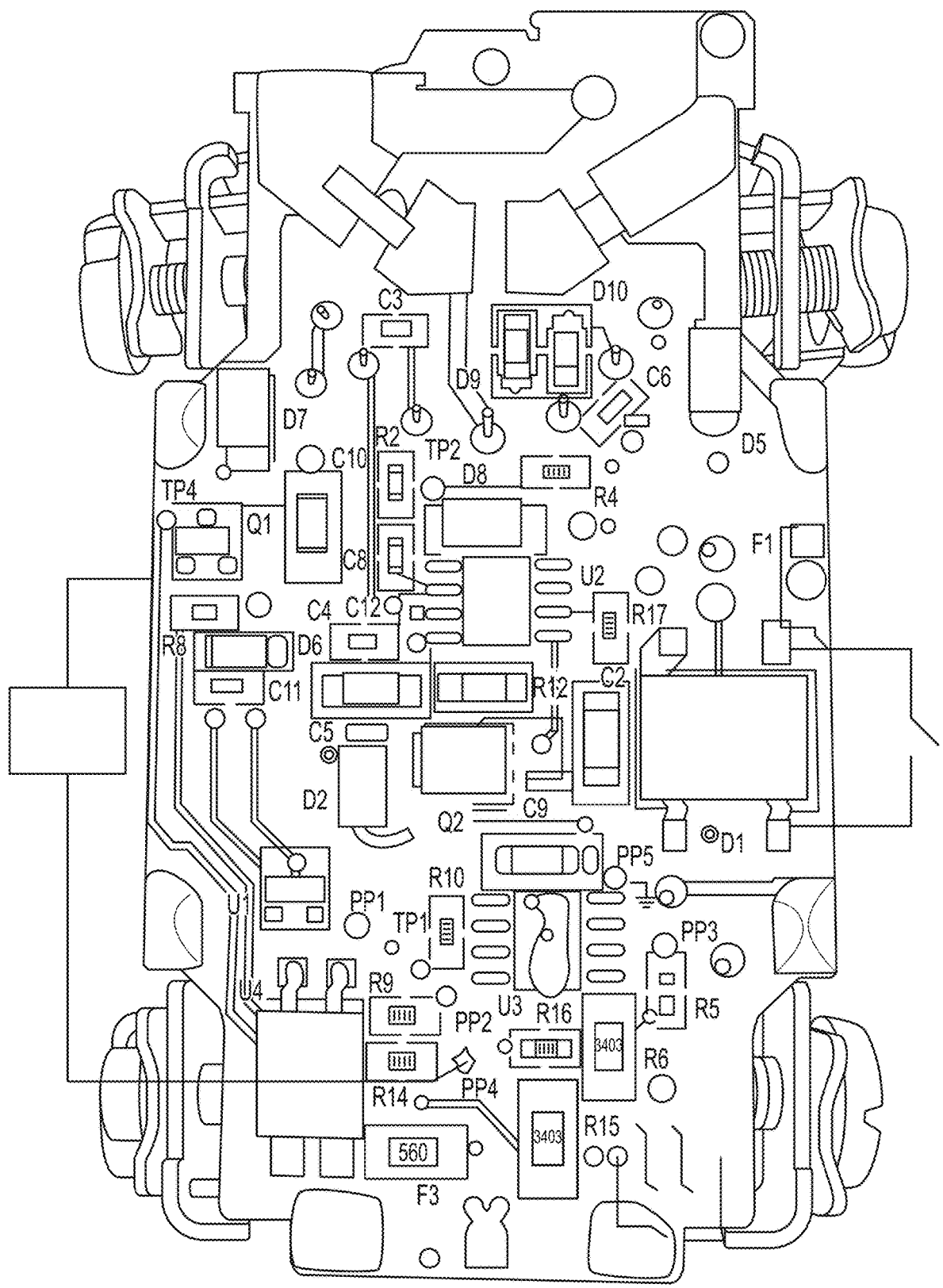
FIG. 17 is an illustration of a ground fault circuit interrupter illustrating how various test requirements are met in accordance with an embodiment of the present application.
Figure 18:
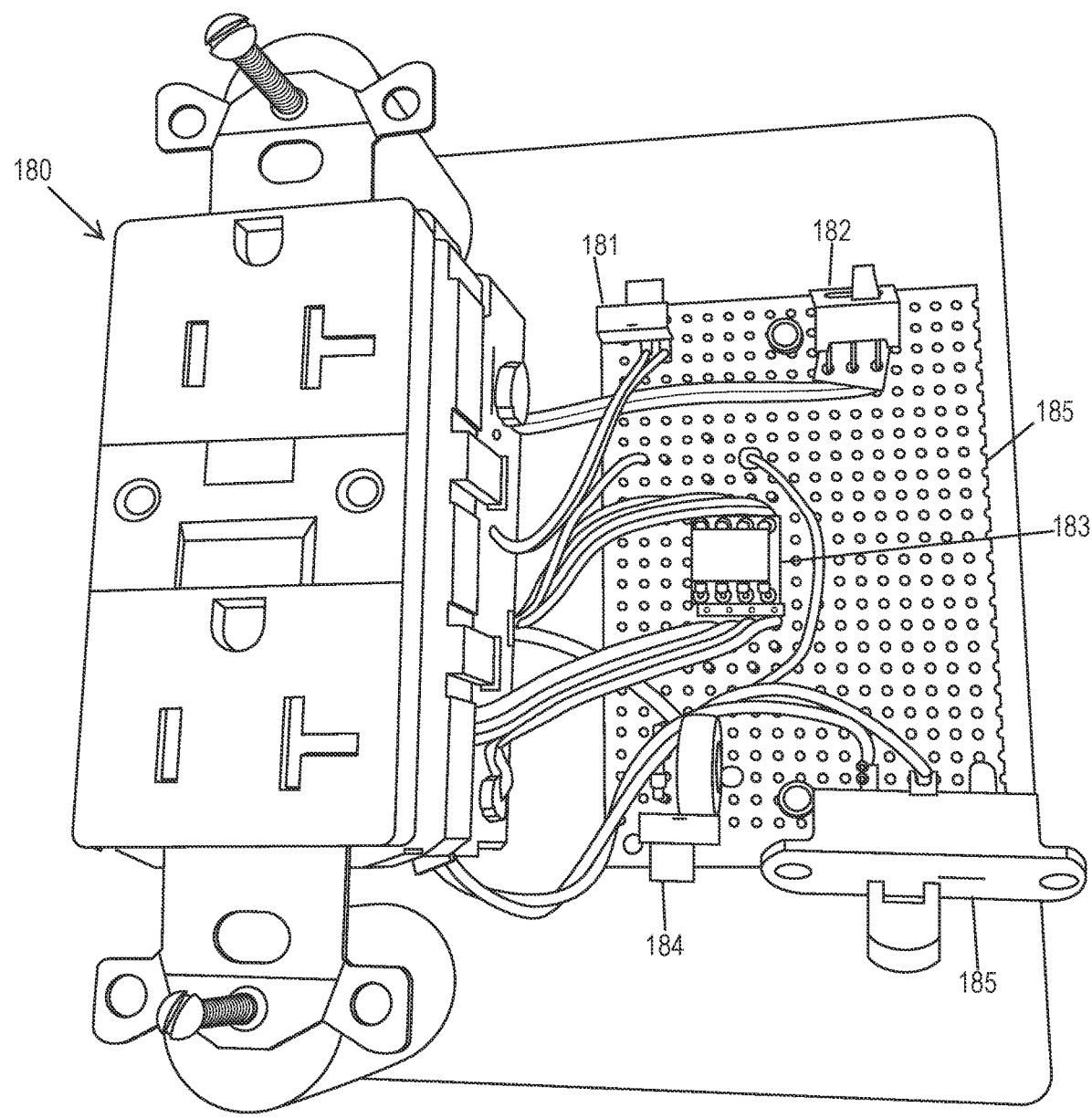
FIG. 18 is an illustration of a ground fault circuit interrupter illustrating how various test requirements are met in accordance with an embodiment of the present application.

At reference number 166 a short-circuit condition is applied across the switching semiconductor, e.g., transistor Q1, that supplies the trip solenoid, and at 168 a short-circuit condition is applied across pins 2 and 3 of the full-wave bridge rectifier device to short circuit a single rectifier diode in the ground fault detection power supply circuit. Additionally, to confirm that the auto-monitoring routine, including the self-test fault signal, is active during a device testing procedure, such as UL943 testing, that includes applying a 'real' ground fault condition to the device, provision 170 is provided at the base of transistor Q1 to enable a tester to confirm that self-test faults continue during the time when 'real' ground fault(s) pursuant to the test are being applied. Provision 170 can be, for example, a test point for applying a test probe, such as for an oscilloscope. These and other provisions for enabling testing of a GFCI in accordance with the present application are provided as shown in FIGS. 17 and 18. FIG. 17 shows the layout of a printed circuit board in accordance with one exemplary embodiment and FIG. 18 shows a GFCI device 180 electrically connected to various test components, such as components 181-183, 184 and 186 on an external circuit board 185.

One or more auto-monitoring routines in accordance with the present application perform the following functions and/or meet the following requirements.

In addition to the Supervisory Circuit, e.g., the TEST button described above, a permanently connected ground-fault circuit interrupter shall be provided with an auto-monitoring function that will allow for periodic, automatic testing of the ability of the device to respond to a ground fault. This testing shall be done without opening the circuit interrupter contacts.

With the GFCI wired normally (not reversed), the auto-monitoring function shall perform the automatic test each time power becomes available to the load terminal(s) or alternatively line terminal(s) of a properly wired GFCI. The automatic test shall be initiated within five seconds of power availability to the line or load terminals. The automatic test shall be repeated at least every three hours.

The auto-monitoring function shall not compromise the ability of the GFCI to respond to a ground fault or a grounded neutral fault. Compliance of these requirements is determined by the test procedures and requirements set forth below.

The consequence of the auto-monitoring test detection of a problem is one or more of the following: a) Power denial (trip with the inability to reset); b) Trip with the ability to reset, subject to the next auto-monitoring test cycle or repeatedly trip; c) Visual and/or audible indication.

During testing, separate samples can be modified to represent those single component failure modes that can cause the GFCI to become unable to respond to a ground fault per this standard. Welded power contacts are not considered. Each sample can be altered with a single modification that represents either an open or a shorted component (unless otherwise specified) as follows (a-g): a) Open circuit or short circuit the ground fault sensing component (transformer); b) Alter the integrated circuit responsible for the ground fault detection by one of the following modifications (1-4): 1) Disconnect the power supply pin of the IC; 2) Disable the "clock" circuit; 3) Open the signal path at the subject IC pin; 4) Short the signal path pin to one of the adjacent pins one at a time; c) Open circuit the current limiter (for example, dropping resistor) of the power supply of the ground fault detection circuit; d) open-circuit the trip solenoid; e) open the switching semiconductor supplying the trip solenoid; f) Short circuit the switching semiconductor supplying the trip solenoid; and g) Open circuit or short circuit a single rectifier diode in the ground fault detection power supply circuit. Short circuit a single diode in the case of a bridge rectifier package.

Certain failure modes in need not be tested if, based on an engineering analysis of the circuit, one or both of the following criteria are met; a) The failure mode does not interfere with the ability of the GFCI to respond to a line to ground fault; and b) The failure mode results are being met automatically, without assistance from the auto-monitoring function.

The device power contacts are in the closed position at the start of the test. Power is applied externally by closing a switch in the supply. During device testing, a ground fault can be applied when the auto monitoring function is active and at least one of the following conditions is met; a) The GFCI visually or audibly indicates if it does not interrupt the electric circuit to all loads; or b) The GFCI interrupts the electric circuit to all loads or does not permit power to be applied to any loads, each time the reset is operated when reset is attempted.

Figure 19:
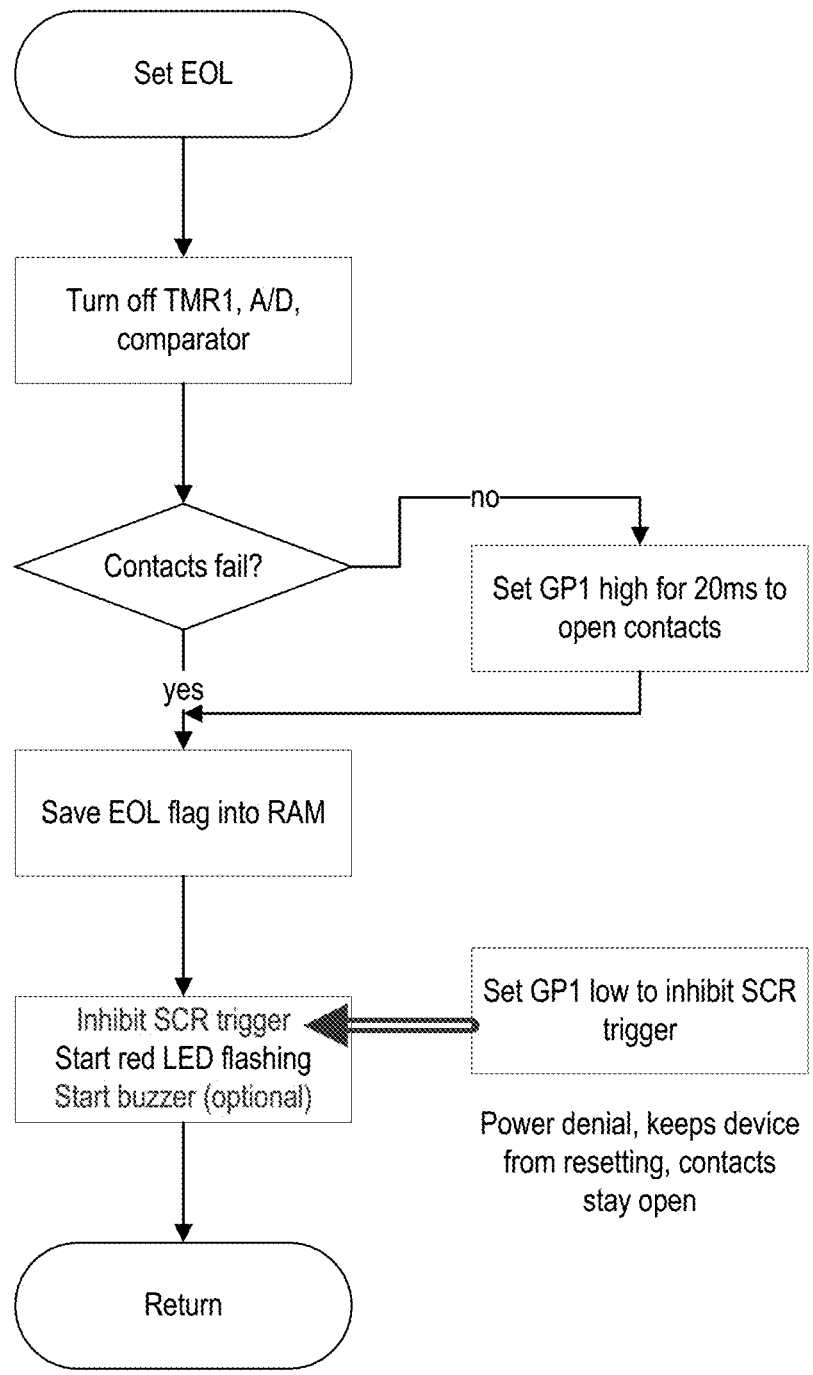
FIG. 19 is a flowchart illustrating a method in accordance with the present application when an end-of-life condition has been determined.

According to a further embodiment of the application illustrated, for example, in FIG. 19, when the End-Of-Life (EOL) state of the GFCI has been determined and the interrupter contacts have not failed, e.g., they are not welded together, the software (S/W) in the microcontroller (uC) outputs a high on port GP1, pin 6 for at least 20 ms to make sure the interrupter contacts are opened. The duration of the high signal on GP1 is adjustable and accounts for the inclusion of a positive 60 Hz ½ cycle required to activate the solenoid independent of when the signal to trip is asserted during AC wave. The EOL flag is saved in random access memory (RAM) and the SCR trigger signal is inhibited by changing the output signal on GP1 low. Accordingly, the contacts stay open and the device cannot be reset. Optionally, to indicate that the device has reached its end-of-life and can no longer be safely used, a red LED is activated, for example, to blink, and/or an audio buzzer is activated.

Referring to, for example, the schematic of FIG. 14, when the reset button is pressed, the microcontroller reads that the contacts are closed from the opto-isolator (U4) on GP2/INT pin 5. As mentioned, the microcontroller then outputs a high signal on port GP1, pin 6 for >20 mS. This opens the contacts providing power denial (not allowing the contacts to remain closed).

The RED LED (D3) also flashes in the EOL state. The EOL state is stored in the microcontroller's RAM, this will clear during a loss of AC power. If the fault causing the EOL is still present, the microcontroller verifies and asserts the EOL state. If the fault is no longer present, the GFCI will continue auto monitoring and normal operation. The fault condition causing EOL can be stored in the microcontroller's $E^2$ nonvolatile memory for fault determination at a later time.

Further embodiments of the present application include one or more of the features described above in conjunction with an alternative method for preventing the miswire condition discussed above. Specifically, one exemplary embodiment includes an electrical solution to the miswire problem instead of the mechanical solution provided, for example, in the embodiment illustrated in FIGS. 4-6. Details of one or more exemplary methods for carrying out the electrical miswire solution in accordance with these additional embodiments are described and illustrated in U.S. application Ser. No. 13/422,793, which is assigned to the owner of the instant application and the entire contents of which are expressly incorporated by reference herein for all that is taught. For example, according to one or more additional embodiments, one of the respective circuits shown in FIGS. 14-16 is used to operate a GFCI device as described in U.S. application Ser. No. 13/422,793. In accordance with such embodiments, instead of mechanically preventing the reset button from being pressed when the GFCI is in the tripped state, as is the case with respect to a GFCI using the circuit shown in FIG. 3A-3B, pressing the reset button initiates a reset function. The reset function places the latching mechanism in a latched state that reestablishes electrical continuity in the open conductive paths, that is, it reestablishes electrical continuity between the line, load and face contacts.

Figure 20:
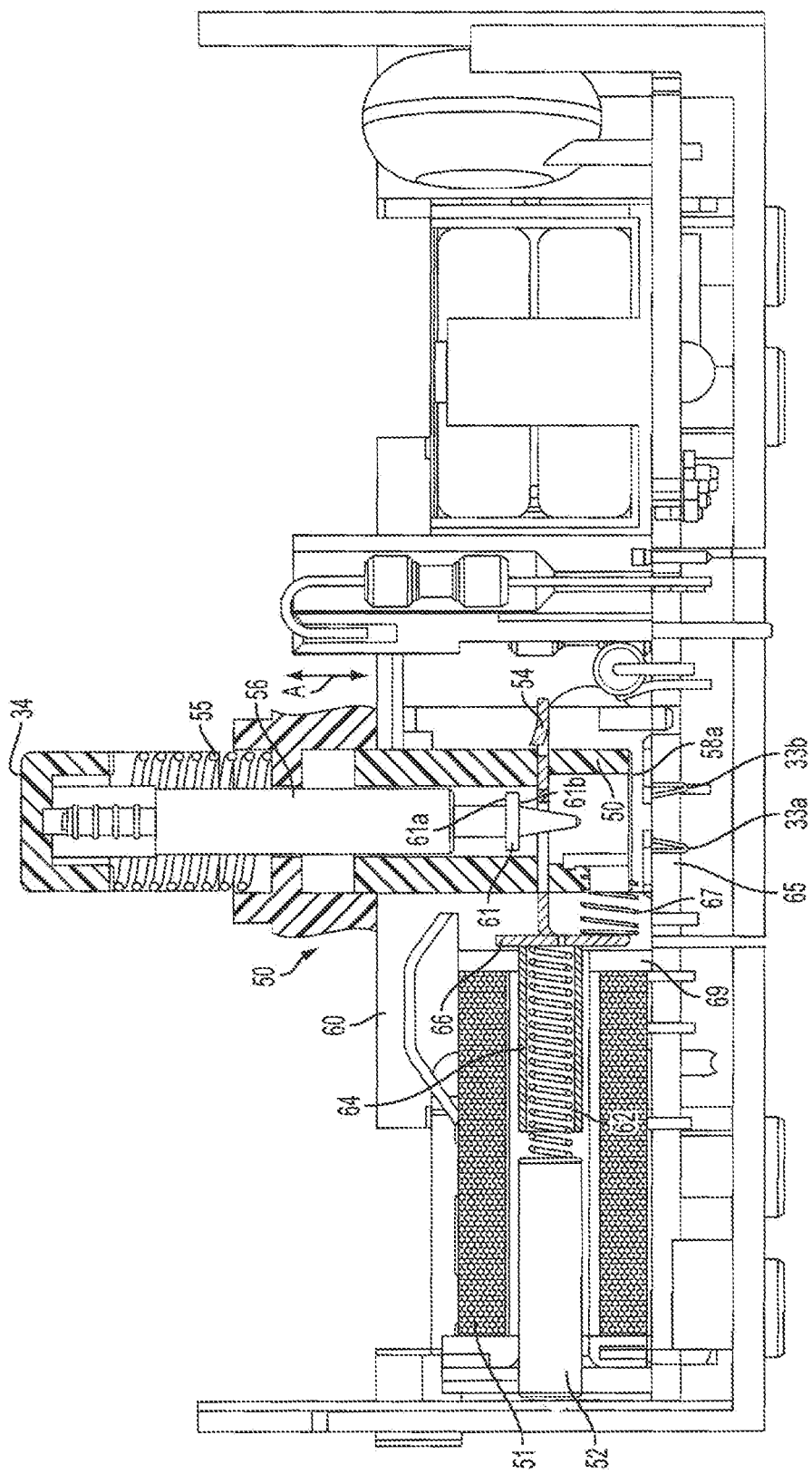
FIG. 20 is a cross sectional view illustrating the various mechanical components within the ground fault circuit interrupting device of FIG. 1 in accordance with an exemplary embodiment of the present application.

FIG. 20 depicts a cross-section of the internal housing of a GFCI device according to this further exemplary embodiment. As shown, the internal housing includes latch assembly 50 which includes "T"-shaped latch plate 54. Latch plate 54 slidably extends through the latch assembly 50, as shown, and is secured to latch assembly 50 such that they move together during both the latching and tripping sequences, in the directions shown by the arrow "A". Reset pin 56 is provided through a central opening in latch assembly 50 with reset button 34 provided at the end of the reset pin extending out of the central opening 36 in the GFCI cover 14 (FIG. 1). Reset pin 56 has an annular reset flange 61 extending radially outwardly from reset pin 56 and having first upwardly facing surface 61a and second downwardly facing surface 61b near the end of the reset pin 56 opposite the reset button 34 at the upper end. As discussed further below, first and second surfaces 61a, 61b engage with lower and upper surfaces, respectively, of the latch plate 54 to initiate a reset operation and to position the latch plate 54 in the latched state. Reset pin 56 is surrounded by a helical spring element 55 provided between the reset button 34 and a support surface in the latch assembly 50. In the tripped position, reset button 34 is urged upward in FIG. 20 by spring element 55.

Figure 22A:
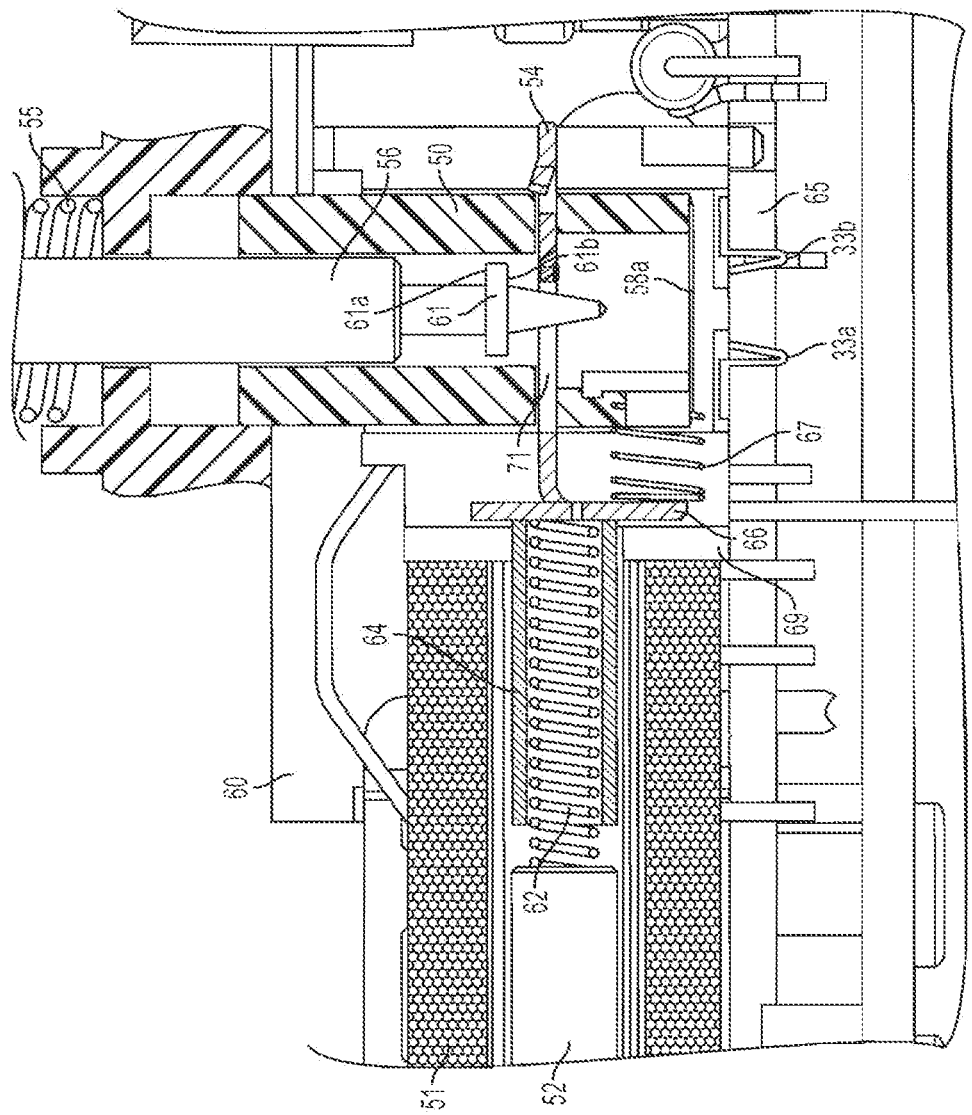
FIG. 22A is an enlarged cross sectional view of a portion of the latch assembly and reset mechanism in the tripped condition, within the solenoid housing of the ground fault circuit interrupting device of FIG. 1 in accordance with an embodiment of the present application.

A conductive shorting bar 58a, more easily seen in FIG. 22A, is provided at a lower end of the latch assembly 50 on a surface facing the printed circuit board (PCB) 65. Secondary switch contacts 33a and 33b are provided on PCB 65 at a position facing shorting bar 58a. Shorting bar 58a is preferably a rigid member composed of a conducting material, such as metal, and has a length at least equal to the distance between the secondary contacts 33a and 33b provided as part of the reset circuit; for example the reset switch and resistor connected in series to the supply voltage output (Vs) shown in FIG. 14. Shorting bar 58a is electrically isolated from secondary switch contacts 33a and 33b at all times, except during the user initiated reset operation. Specifically, latch assembly 50 is suspended above PCB 65 to prevent shorting bar 58a from contacting the secondary switch contacts and, thus, shorting the reset circuit except when a user presses reset button 34 to initiate the reset operation.

In a further embodiment, shorting bar 58a is attached to the latch assembly 50 with one or more intervening spring elements to provide additional travel for the latch assembly. For example, in accordance with this further embodiment one or more springs, such as coil springs, leaf springs, etc., are placed between the bottom of latch assembly 50 and shorting bar 58a. When reset button 34 is pressed, spring element 55 begins to compress as shorting bar 58a moves downward toward secondary switch contacts 33a, 33b. When shorting bar 58a makes contact with switch contacts 33a, 33b, the spring element(s) between the shorting bar and the bottom of the latch assembly begin to compress as reset button 34 continues to be pressed and reset spring 55 continues to compress.

Solenoid 51 is provided within solenoid housing 60. Plunger 52, spring element 62 and spacer 64 are all provided within solenoid 51 and are coaxially therewith. As shown, plunger 52 and spring element 62 abut against an outer surface of side wall 66 of the "T"-shaped latch plate 54. Latch plate 54 is held in its initial position by the force of helical spring element 67 provided between an inner surface of side wall 66 and a lower end of the latch assembly 50. In the absence of a magnetic field around solenoid 51, the force of spring element 67 overcomes the force of spring element 62 provided within solenoid 51, side wall 66 of latch plate 54 remains pressed against flange 69 of the solenoid housing.

Figure 21A:
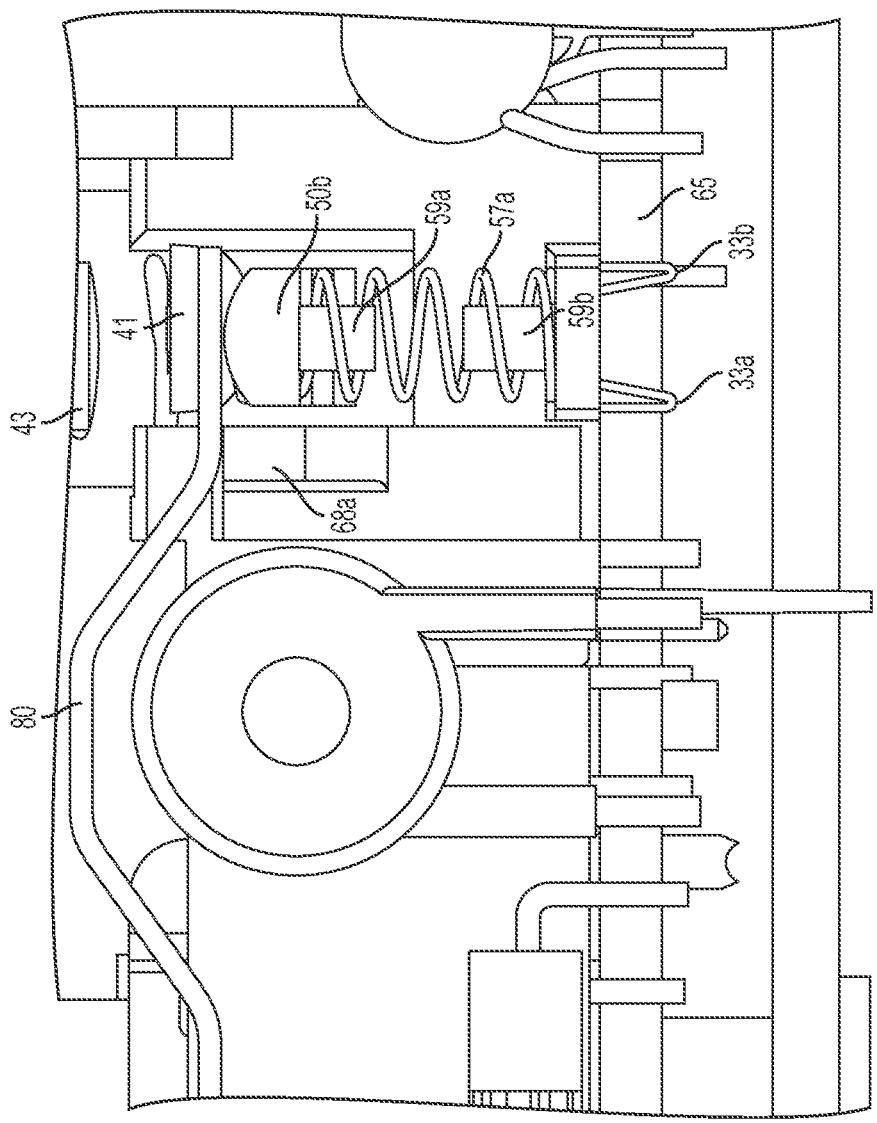
FIG. 21A is an enlarged cross sectional side view of a portion of the latch assembly and spring mechanism within the solenoid housing of the ground fault circuit interrupting device of FIG. 1 in accordance with an embodiment of the present application.
Figure 21B:
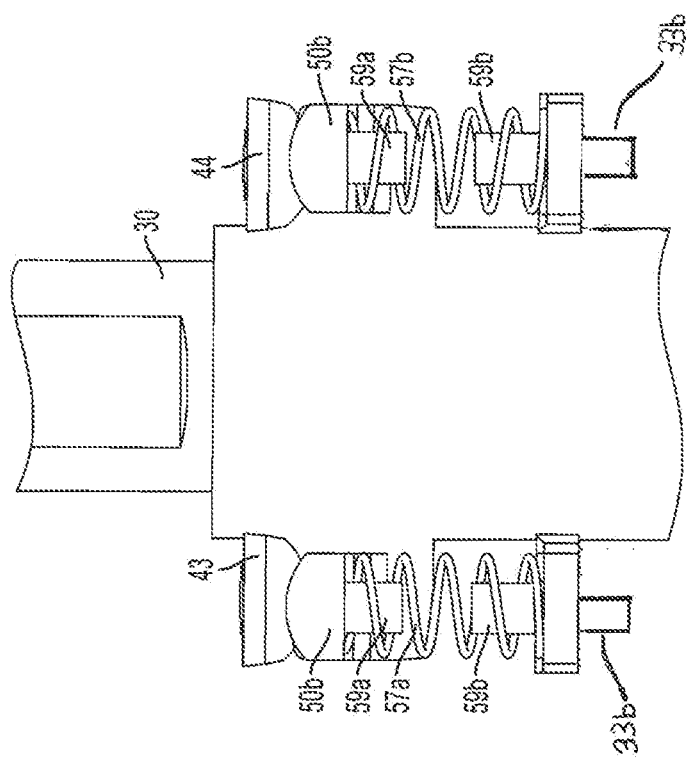
FIG. 21B is an enlarged cross sectional front view of a portion of the latch assembly and spring mechanism within the solenoid housing of the ground fault circuit interrupting device of FIG. 21A in accordance with an embodiment of the present application.

FIGS. 21A, 21B are enlarged side and front cross-sectional views, respectively, of an exemplary embodiment of latch assembly 50. As shown, latch assembly 50 is suspended above the PCB 65 by spring elements 57a and 57b provided between the two pairs of retaining pegs 59a and 59b. According to this embodiment, retaining pegs 59b are provided as part of the solenoid housing 60, while retaining pegs 59a are provided as part of the latch assembly 50, as shown. Retaining pegs 59a are provided on the outwardly protruding surfaces or arms 50b integral with and extending laterally away from the latch assembly 50. Retaining pegs 59a and 59b not only retain the spring elements 57a and 57b but they also provide reactive surfaces for the spring elements 57a and 57b, to keep the latch assembly 50 floating or suspended above PCB 65. The force provided by spring elements 57a and 57b is sufficient to maintain the latch assembly 50 in the floating position in the absence of an external force, for example when a user presses the reset button to begin the reset operation.

As described in greater detail below with respect to FIGS. 27A, 27B, when GFCI device 10 (FIG. 1) enters the latched state, laterally extending arms 50b of latch assembly 50 urge cantilevered load contact arms 80 and 81 into engagement with cantilevered line contact arms 82 and 83, respectively, to supply power to the face and load terminals. Because load contact arms 80 and 81 electrically connect with line contact arms 82 and 83, respectively, in the latched state, load contact arms 80 and 81 are preferably formed as resilient cantilevers that are effectively biased toward PCB 65, away from line contact arms 82 and 83. To prevent cantilevered load arms 80 and 81 from undesirably forcing the latch assembly arms 50b, and, thus, the latch assembly 50, against the bias of the spring elements 57a and 57b toward the PCB 65 in the unlatched state, solenoid housing 60 also preferably includes at least one fixed or built-in stop 68a providing a stop surface against which the cantilevered load arms 80 and 81 rest, thus, stopping further downward movement. Fixed stop 68a prevents the cantilevered arms from providing a force on the latch assembly arms 50b, by blocking movement of the cantilevered arms in the biased direction when the cantilevered arms contact the fixed stop. Fixed stop 68a is provided as an additional means to ensure that the latch assembly 50 remains suspended above PCB 65 in the absence of an applied force by a user to initiate the reset mechanism. A similar fixed stop 68b is also preferably provided on the opposite side of solenoid housing 60 to provide a similar stop surface for the cantilevered line arms 82 and 83. Fixed stop 68b prevents a dangerous situation from occurring where the cantilevered line arms 82 and 83 may be urged by the effective bias of the cantilever to contact the load arms 80 and 81, while the GFCI is in an unlatched state.

FIGS. 22-26 are perspective views illustrating the sequence of operation of the latching mechanism of the exemplary GFCI device 10 as it enters the latched, "reset," state. As illustrated in FIG. 22A, according to this exemplary embodiment the GFCI device is in the unlatched, or "tripped," condition. This is the condition the device is in when it is provided from the manufacturer. As shown, latch assembly 50 in the initial unlatched state is suspended above the printed circuit board (PCB) 65, such that there is no physical contact between shorting bar 58a and secondary PCB contacts 33a and 33b. In the unlatched state, latch plate 54 is positioned below the contact flange of the reset pin formed by first and second contact surfaces 61a, 61b of reset flange 61. In this unlatched position, as described further below with respect to FIG. 27A, line side contacts 41 and 42 are not able to contact load side contacts 43 and 44, respectively, thus preventing power from being supplied to any load side devices or face terminals 18, 20 (FIG. 1) of the GFCI device. Thus, in the initial state, prior to the reset operation, there is no power supplied to face terminals 18, 20 regardless of whether or not the GFCI device is correctly wired to a power source.

Figure 22B:
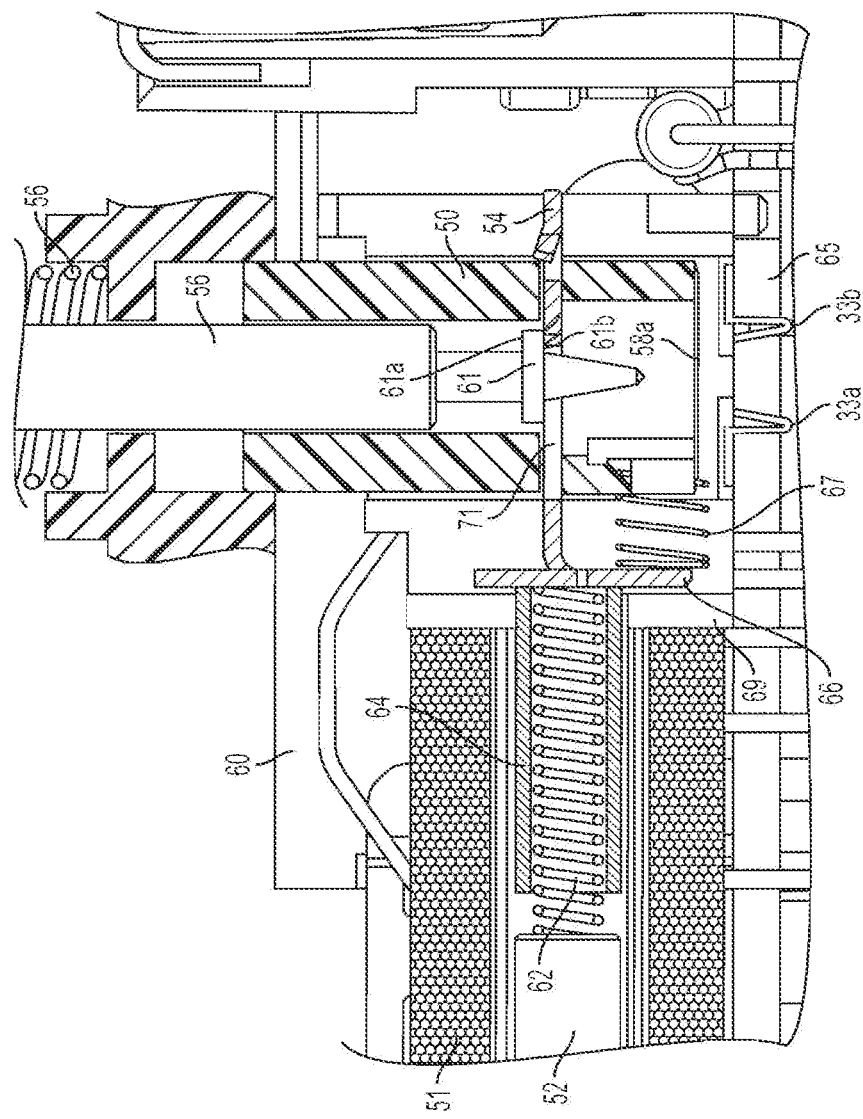
FIG. 22B is an enlarged cross sectional view of a portion of the latch assembly and reset mechanism within the solenoid housing of the ground fault circuit interrupting device of FIG. 1 as the reset button is initially being pressed, in accordance with an embodiment of the present application.

After the GFCI device is correctly wired to a power source by connecting the hot and neutral conductors of the power source to the line terminals 39 and 40 (FIGS. 1, 2), respectively, a reset operation is performed before power will be supplied to the face terminals 18, 20 and load terminals 37, 38. To initiate a reset, i.e., to place the latch assembly in a latched state, a user presses the reset button 34 protruding from GFCI cover 14 against the force of the spring element 55 surrounding reset pin 56. Reset pin 56 moves in the same direction as reset button 34 into the GFCI housing toward latch plate 54. As shown in FIG. 22B, bottom surface 61b of reset flange 61 contacts latch plate 54.

Prior to contacting latch plate 54, reset pin 56, including reset flange 61, moves axially through a hole in the body of latch assembly 50 without effecting movement of the latch assembly. Due to the engagement with the latch plate 54, which is movable in the same direction with the latch assembly 50, and upon continued pressing of reset button 34, latch assembly 50 moves against the force of spring elements 57a, 57b, shown in FIG. 21B, together with the reset pin 56.

Figure 23A:
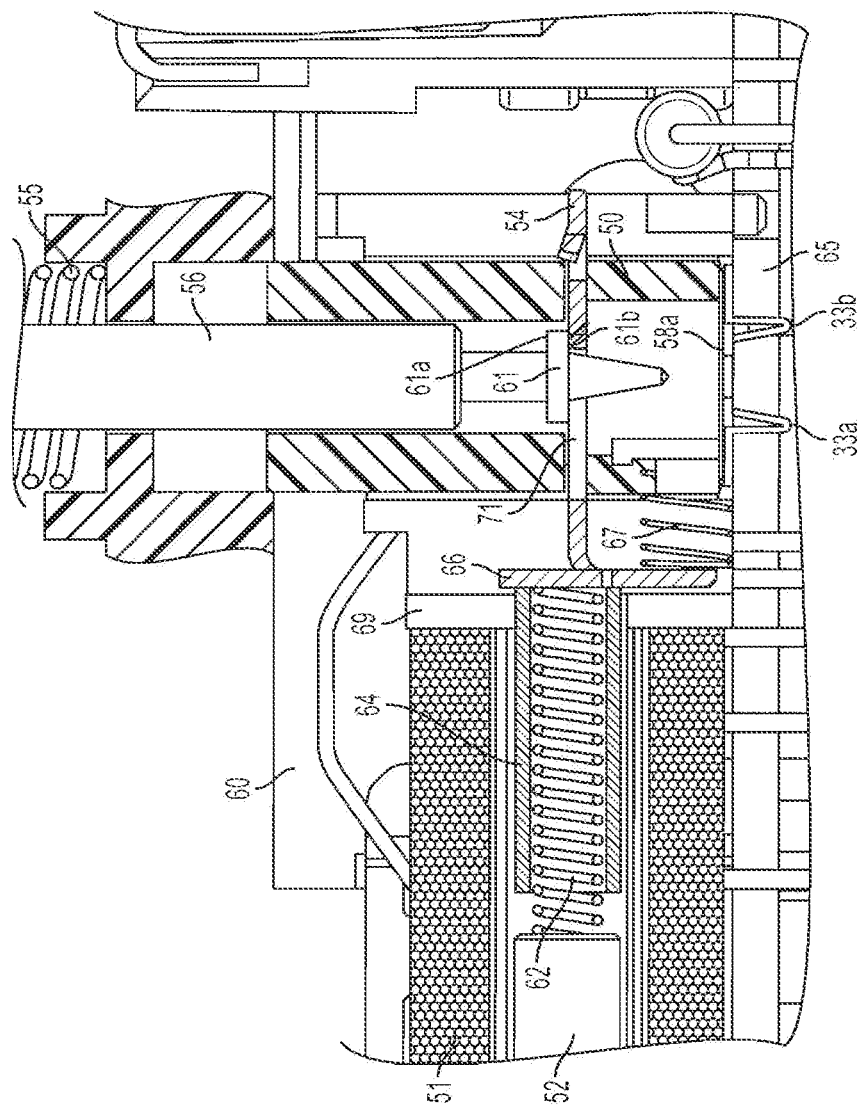
FIG. 23A is an enlarged cross sectional view of a portion of the latch assembly and reset mechanism within the solenoid housing of the ground fault circuit interrupting device of FIG. 1 when the reset button is fully pressed and the switch on the PCB is closed, in accordance with an embodiment of the present application.
Figure 23B:
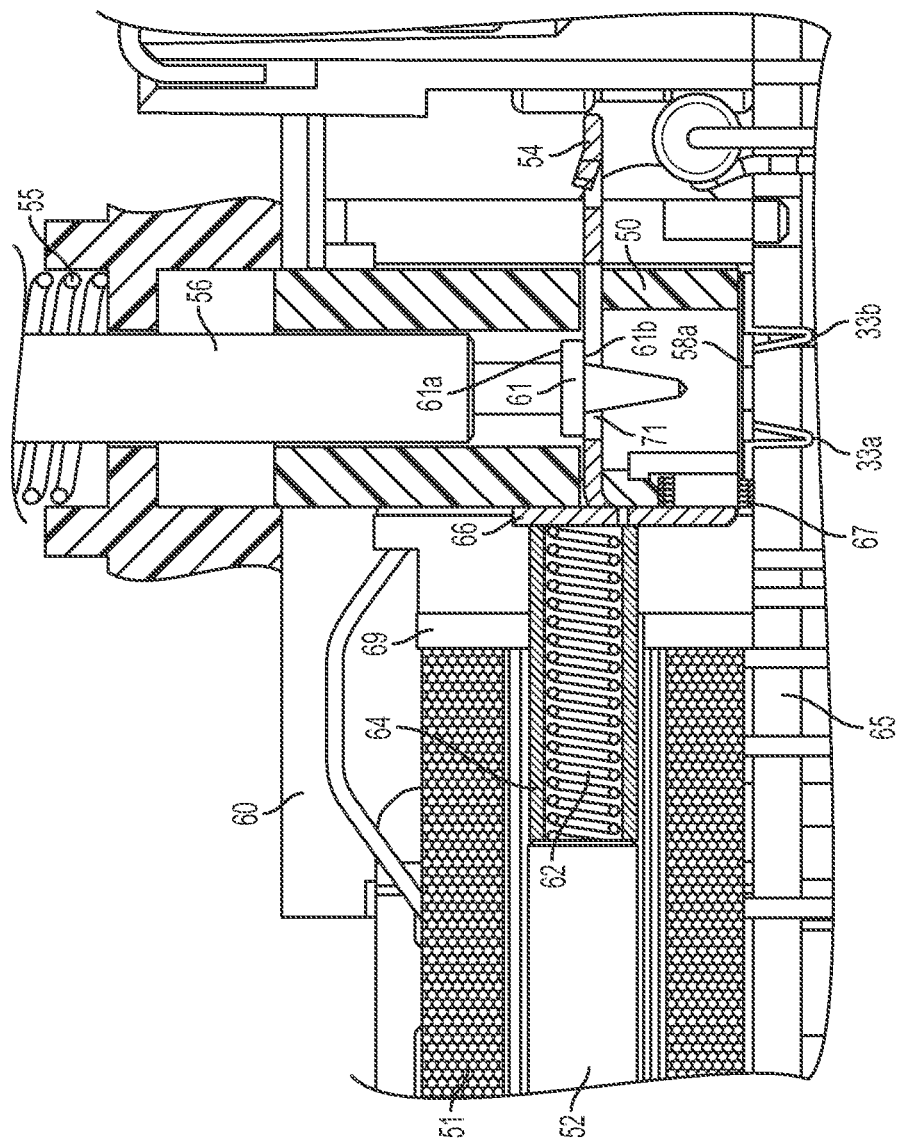
FIG. 23B is an enlarged cross sectional view of a portion of the latch assembly and reset mechanism within the solenoid housing of the ground fault circuit interrupting device of FIG. 1 after the solenoid has fired.

As shown in FIGS. 23A, 23B, downward movement of latch assembly 50 and latch plate 54 continues until shorting bar 58a comes into contact with secondary contacts 33a, 33b provided on PCB 65, thus closing the reset switch. Secondary contacts 33a, 33b, provided on PCB 65, form a first part of the reset switch. When shorting bar 58a contacts secondary contacts 33a, 33b, the reset switch is closed, thus, providing a conductive path between the gate of the SCR connected to the SCR OUT port of the GFCI IC device and the voltage output pin of the GFCI IC (FIG. 14). If GFCI device is wired correctly, an electric current will be supplied to the gate terminal of the SCR through this closed conductive path. The supplied current transitions the SCR into a conducting/operating state and current is drawn through solenoid 51 from the correctly wired hot line terminal 39. The current now flowing generates a magnetic field at solenoid 51 that forces, i.e., fires, plunger 52 in a direction that slightly compresses spring 62 against the side wall 66 and pushes spacer 64 against sidewall 66 of latch plate 54.

Referring to FIG. 23B, the magnetic force applied to plunger 52 by the coil of solenoid 51 is sufficient to overcome the opposing force asserted by spring element 67 positioned between the side wall 66 of latch plate 54 and a spring retaining peg on latch assembly 50. As a result, latch plate 54 is moved, to the right in FIG. 23B, by plunger 52 and hollow spacer 64 through a slot in latch assembly 50, as shown. In this position, an aperture 71 in latch plate 54 aligns with reset flange 61 on reset pin 56 such that the second, or bottom, surface 61b of the reset flange no longer contacts the latch plate. In an exemplary embodiment, spring elements 57a, 57b (FIG. 21A, 21B) provide a resilient buffer against excessive force asserted on the reset pin by a user initiating the reset operation. Specifically, as the user presses the reset button to initiate the condition shown in FIG. 23B, springs 57a, 57b compress. Springs 57a, 57b reduce an effective force on the surface of the latch plate 54 when the shorting bar closes the reset switch to initiate the firing of the plunger 52. Because the reset switch is closed, i.e., by the shorting bar 58a, before latch assembly 50 "bottoms out" on the PCB board, springs 57a, 57b absorb some of the downward force applied by reset flange 61 on latch plate 54. This ensures that latch plate 54 moves to the desired position upon firing of plunger 52, as described above.

Figure 21C:
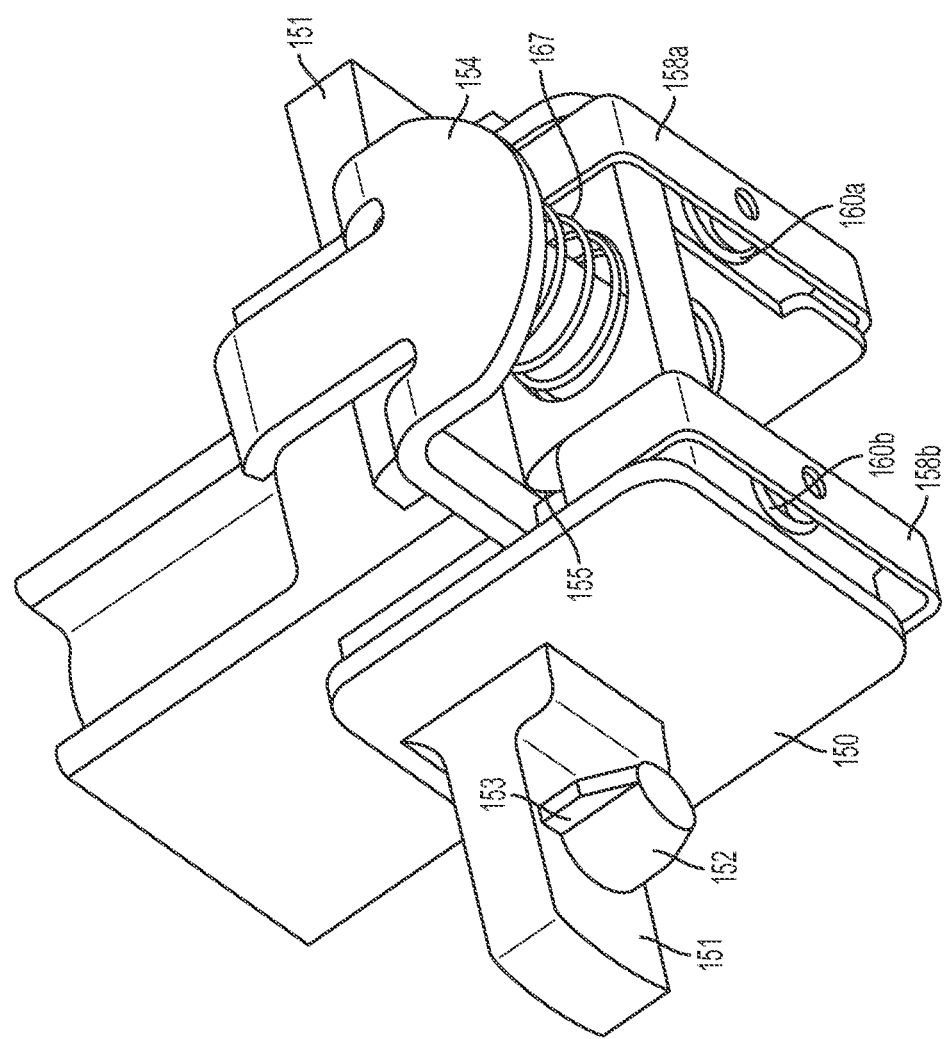
FIG. 21C is a perspective view of an exemplary embodiment of a latch block assembly in accordance with the present application.
Figure 24:
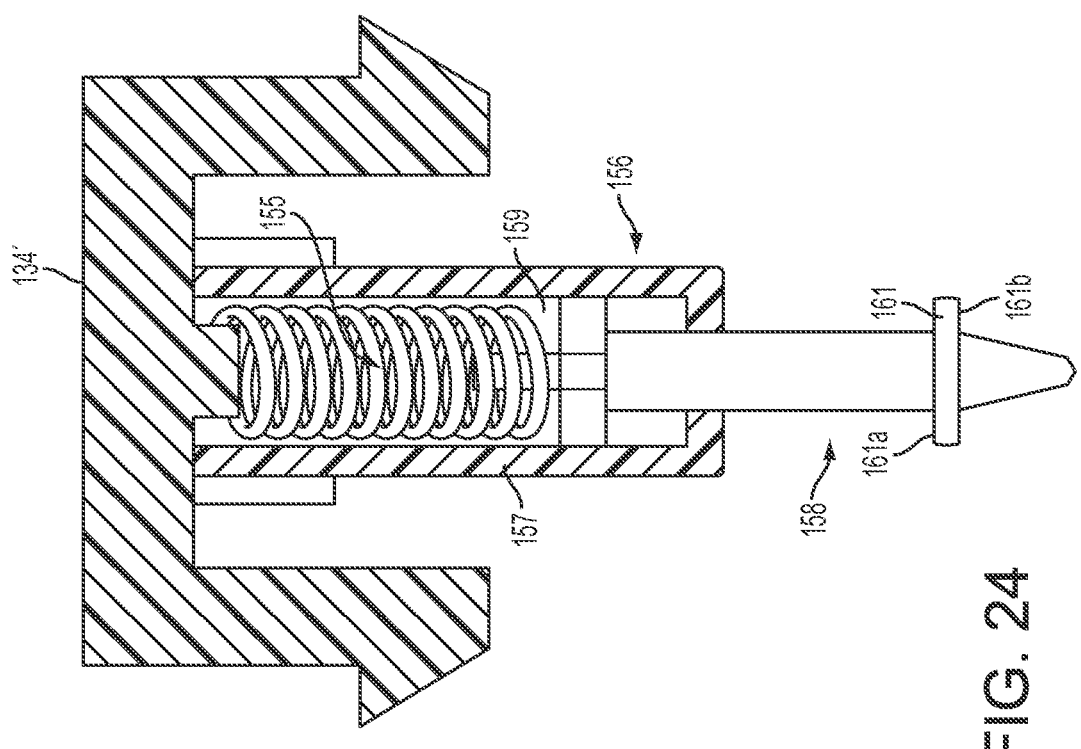
FIG. 24 is a cross-sectional view of an alternative construction for the reset pin assembly in accordance with a further embodiment of the present application.

In a further exemplary embodiment, shown for example in FIG. 24, cylindrical reset pin 156 with internal spring element 155 is provided instead of, or in addition to, springs 57a, 57b shown in FIG. 23B. In this embodiment, shorting bar 58a may be attached directly to the lower end of the latch assembly, as opposed to having one or more intervening springs, such as springs 160a, 160b included in the embodiment of FIG. 21C. Reset pin 156 comprises at least two portions 157, 158. Upper portion 157 of reset pin 156 has a hollow cavity, 159 with a retaining peg at the top end thereof for retaining one end of spring 155. Lower portion 158 of the reset pin 156 includes reset flange 161 with upper and lower surfaces 161a, 161b, respectively, and extends outside of hollow cavity 159. Lower portion 158 is attached to the hollow upper portion 157 with a spring element 155. Spring element 155 is preferably provided with a biasing strength at least slightly greater than the upward force of the latch assembly 50. Spring element 155 provides a buffer to reduce an effective force of the reset pin 156 on latch plate 54. Thus, latch plate 54 is not prevented from moving to the desired position upon firing of plunger 52, as described above.

Figure 25A:
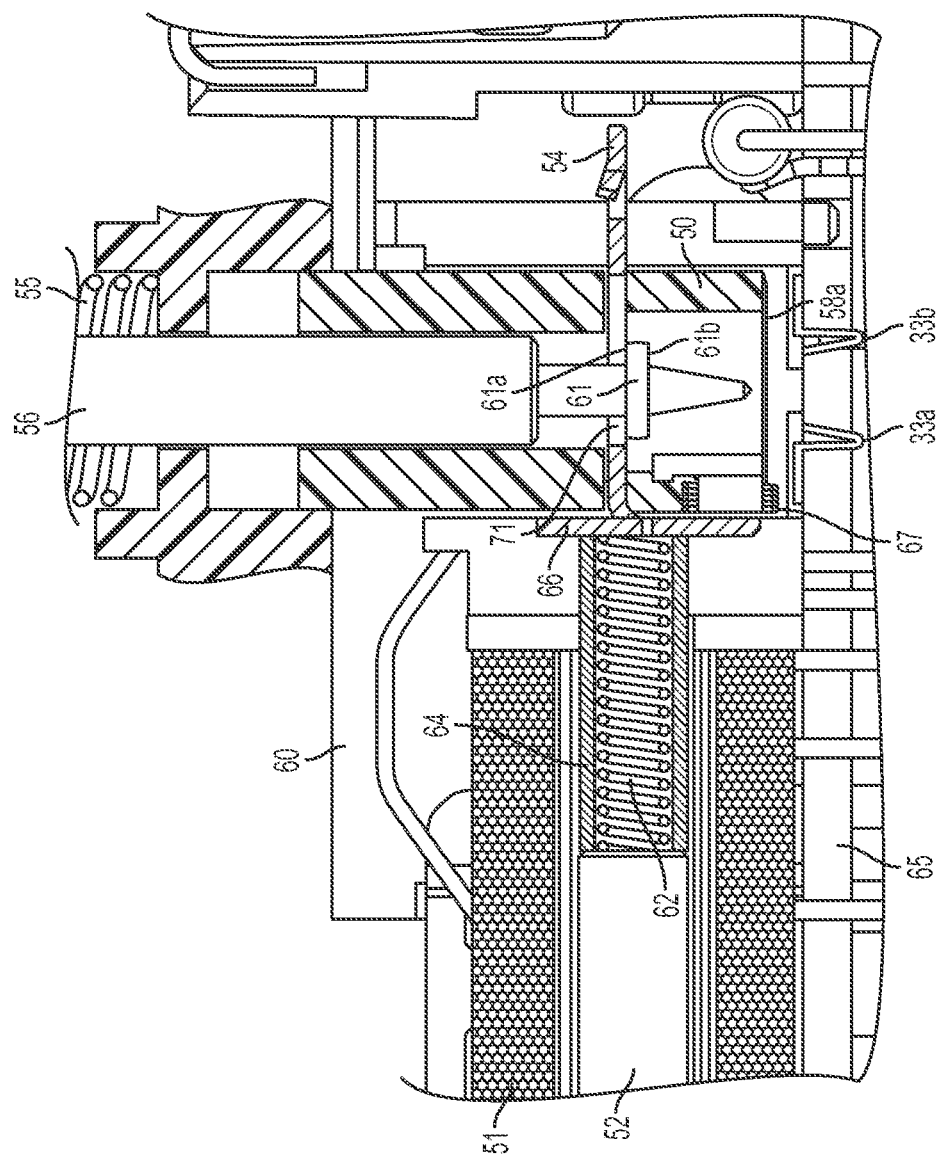
FIG. 25A is an enlarged cross sectional view of a portion of the latch assembly and reset mechanism within the solenoid housing of the ground fault circuit interrupting device of FIG. 1 after the latch plate clears the reset pin and the latch assembly is permitted to rise, opening the switch on the PCB.
Figure 25B:
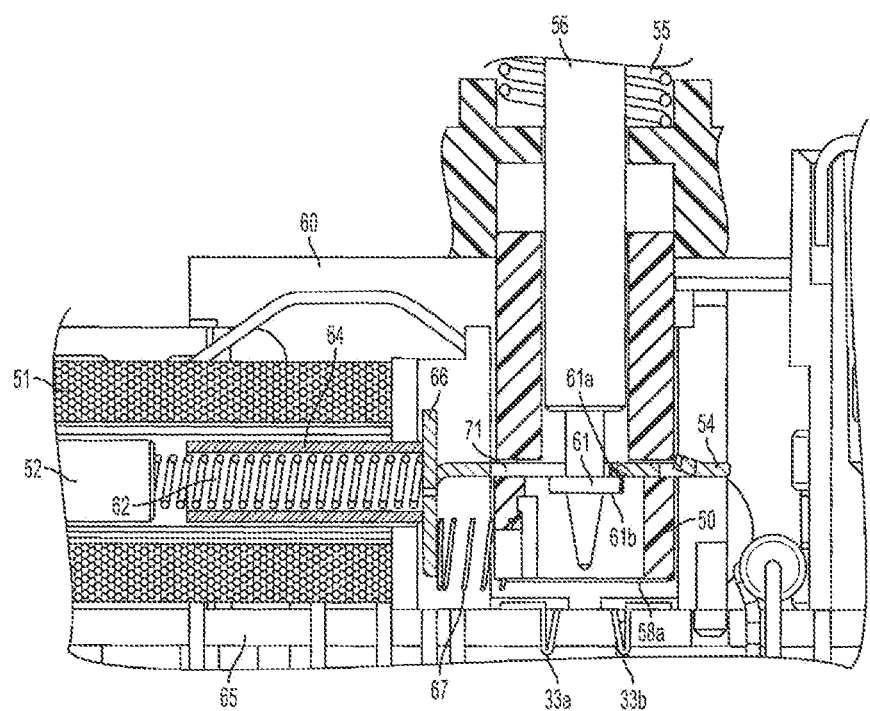
FIG. 25B is an enlarged cross sectional view of a portion of the latch assembly and reset mechanism within the solenoid housing of the ground fault circuit interrupting device of FIG. 1 after the latch plate is permitted to retract.

Regarding the embodiment illustrated in FIGS. 22A, 22B and 23A, 23B, continued pressing of reset button 34 (FIG. 20) moves reset pin 56 down through a cavity in latch assembly 50, as shown in FIG. 25A. Because the second, lower, surface 61b of reset flange 61 is no longer in contact with latch plate 54, the reset flange moves through aperture 71 in latch plate 54 to the position shown in FIG. 25A. Also, because latch assembly 50 is no longer forced by the pressing of the reset button against the bias of the spring elements 57a, 57b, as shown in FIGS. 21A, 21B, spring elements 57a, 57b urge the latch assembly up and away from being in contact with PCB 65. Further, because latch assembly 50 is urged away from PCB 65, shorting bar 58a on the latch assembly is also urged away from the PCB and no longer contacts the secondary contacts 33a, 33b on the PCB, thus, opening the reset circuit between the gate of the SCR and the GFCI IC device (see e.g., FIG. 14).

Because the gate of the SCR is no longer activated when shorting bar 58a disconnects from the secondary contacts 33a, 33b, the SCR transitions back to a non-conducting/non-operating state. Consequently, current is no longer drawn through solenoid 51 and the magnetic field ceases. Without the magnetic field to push plunger 52 and spacer 64 against latch plate 54, spring element 67 contacting side wall 66 of the latch plate 54, pushes spacer 64 and plunger 52 to the left in FIG. 25B and urges the latch plate to its initial position. Latch plate 54 slides sideways in the slot within latch assembly 50 such that aperture 71 in the latch plate is no longer aligned with reset flange 61. When reset button 34 is released by the user, the reset button and reset pin 56 are urged by reset return spring element 55 in the direction away from PCB 65, e.g., upward in FIGS. 25A, 25B.

Figure 26:
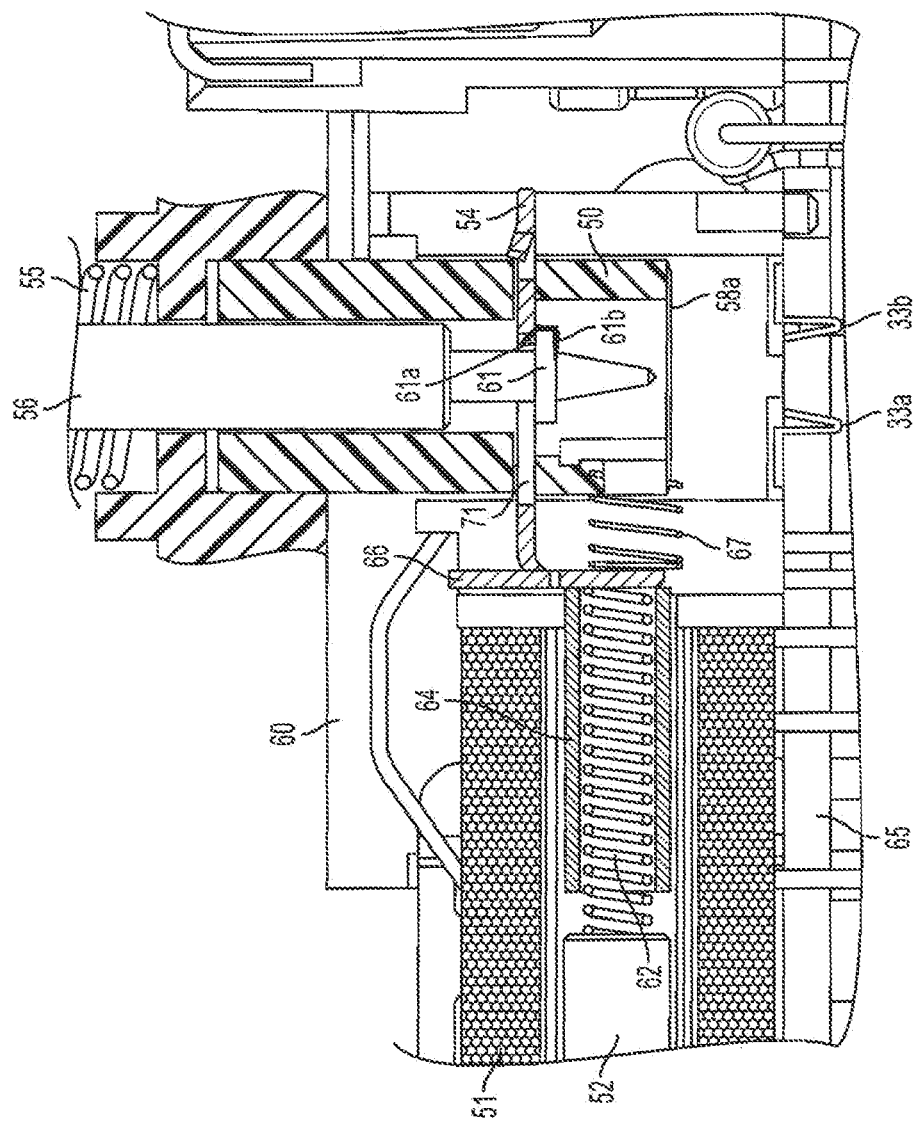
FIG. 26 is an enlarged cross sectional view of a portion of the latch assembly and reset mechanism within the solenoid housing of the ground fault circuit interrupting device of FIG. 1 after the reset pin is released and pulls the latch assembly up under the bias of the reset spring.

Referring to FIG. 26, when the user releases the reset button (see, e.g., FIG. 20), reset pin 56, which now engages the underside of the latch plate 54 with the first, top, surface 61a of reset flange 61, pulls the latch plate 54 up in a direction away from PCB 65. The GFCI device 10 and latch assembly 50 are now said to be in the latched state because contacts 41, 43, 45 (FIG. 27C) are electrically connected and contacts 42, 44, 46 (FIG. 27C) are electrically connected. Because latch plate 54 is movable in the same direction as latch assembly 50, the latch assembly also moves in the same direction due to the force applied by the spring element 55 surrounding reset pin 56. Specifically, as latch assembly 50 is pulled in the "up" direction, farther away from the PCB 65, laterally extending arms 50b (FIG. 21B) of the latch assembly pull contacts 43, 44 on the free end of cantilevered load arms 80 and 81, respectively, into direct contact with the line contacts 41, 42 provided on the cantilevered line arms 82 and 83, respectively. When latch assembly 50 is pulled up and the device enters the latched condition, cantilevered arms 80-83 and contacts 41-44 are disposed as illustrated in FIG. 27B.

Figure 27A:
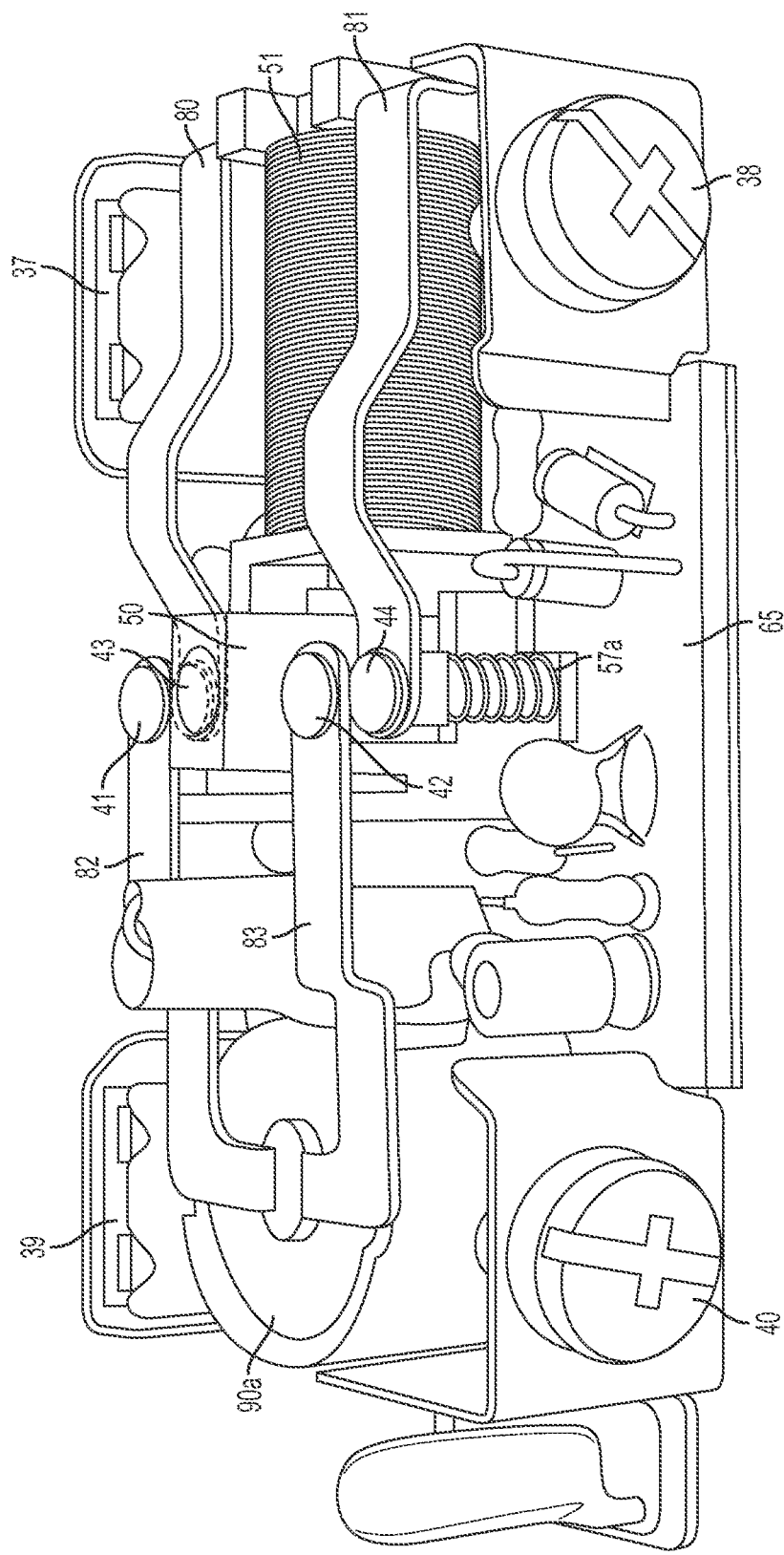
FIG. 27A is a perspective view showing the interrupter contacts in the open position and other internal components of the ground fault circuit interrupting device of FIG. 1 in accordance with an embodiment of the present application.
Figure 27B:
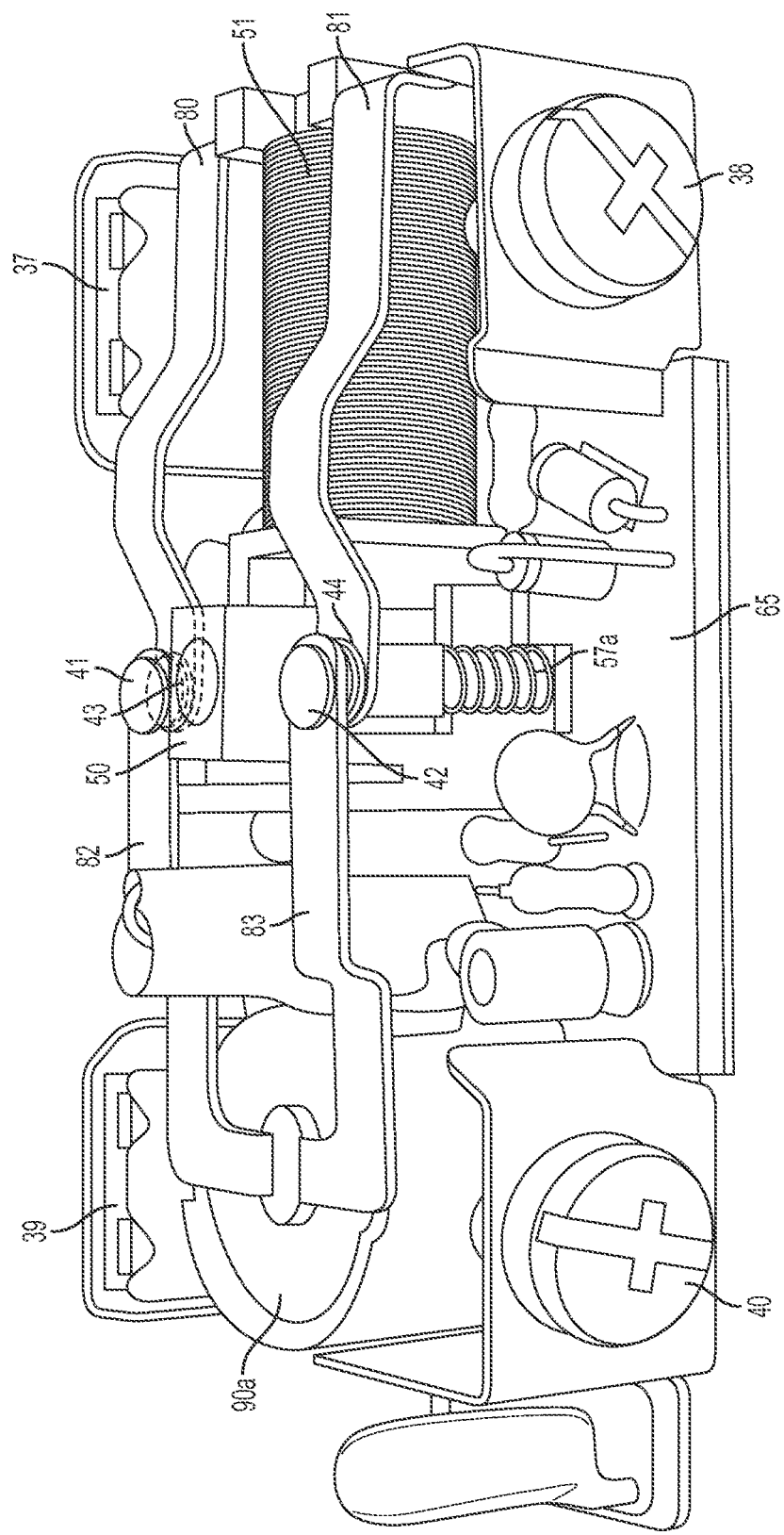
FIG. 27B is a perspective view showing the interrupter contacts in the closed position and other internal components of the ground fault circuit interrupting device of FIG. 1 in accordance with an embodiment of the present application.

FIGS. 27A and 27B illustrate, among other things, an exemplary embodiment of the contact assembly described above. FIG. 27A shows GFCI device 10 in the unlatched state. As shown, in the unlatched state, line contacts 41 and 42 do not contact load contacts 43 and 44. Accordingly, no current flows between the line terminals, 39, 40 and the load terminals 37, 38. As discussed with respect to FIG. 1, if the GFCI device is properly wired, line hot and line neutral conductors connected to an AC power supply are connected to line hot and neutral terminals 39 and 40, respectively. Load hot and load neutral conductors are similarly connected to load hot and neutral terminals 37 and 38, respectively. Line terminals 39 and 40 are electrically connected to the cantilevered line arms 82 and 83, respectively. A plurality of electrically conducting contacts, 41 and 42, are provided at the free end of the cantilevered line arms 82, 83, respectively. According to the present embodiment, line contacts 41 and 42 are staked into holes in the ends cantilevered arms 82 and 83, respectively, and include surfaces that face load contacts 43 and also include surfaces that face upward, towards face contacts 45, 46 (not shown) and 44. Face contacts 45, 46 are provided on separate electrically conducting members located on a separate housing (not shown). Although not shown, face contacts 45, 46 are electrically connected to the face terminals 18, 20 provided on the top cover 14, and electrically connect with contacts 41, 42, respectively, when the GFCI device 10 is in the latched state. Due to the natural bias of the resilient cantilevered line arms 82, 83, contacts 41, 42 are urged away from connecting to the face contacts 45, 46 when the GFCI device 10 is in the unlatched or, tripped, state.

As seen in FIG. 27A, load hot terminal 37 and load neutral terminal 38 are electrically connected to cantilevered load arms 80 and 81, respectively. Load contacts 43 and 44 are provided at the free ends of the cantilevered load arms 80 and 81, respectively, facing the line contacts 41 and 42 on the resilient cantilevered line arms 82 and 83, respectively. In the unlatched state, as shown in FIG. 27A, due to the natural bias of the cantilevered load arms 80 and 81, the load contacts are urged away from contacting with line contacts 41 and 42, respectively. As previously discussed with respect to FIG. 21A, fixed stop 68*b* provides a surface for preventing the line contacts 41 and 42 from "dropping" onto the load contacts 43 and 44, respectively. Contacts 41-46 are preferably composed of, and/or coated with, an electrically conducting material that prevents any undesired arcing between the contacts.

According to the embodiment shown in FIG. 27B, when the GFCI device enters the latched state, as described above, the bias of reset return spring element 55 forces the reset button and reset pin upwards, thus pulling the latch plate and latch block upwards as well. Laterally extending arms 50*b* (see, e.g., FIG. 21B), on either side of latch assembly 50, urge the resilient cantilevered load arms 80, 81, along with load contacts 43 and 44, upwards to make contact with line contacts 41 and 42, respectively. As the latch assembly 50 continues to move upwards, the face contacts 45 and 46 are contacted by line contacts 41, 42 which are thus, brought into electrical contact with face terminals 18 and 20. AC power is now provided to face terminals 18, 20 on the outer housing of the GFCI device and to any device connected downstream to the load terminals 37, 38. In the configuration shown in FIG. 27B, GFCI device 10 is now in the latched, or reset, state.

Because GFCI device 10 is initially provided in an unlatched state and proper wiring is required before it can enter the reset state, there is no need to provide any locking mechanism or lock-out mechanism that could potentially be defeated prior to installation. The GFCI device will only enter the reset state when the GFCI device is properly wired during installation such that AC power is provided at the line terminals. Therefore, miswire protection of GFCI device 10 cannot be defeated prior to installation and a potentially dangerous situation where the GFCI device is incorrectly wired unbeknownst to the user but power is applied to the face terminals can be prevented. Additionally, the above exemplary latching mechanism is capable of repeatedly detecting a miswire condition without any specific additional operation of the user, if the GFCI device is un-installed and then re-installed later.

Referring to FIG. 27C, manifold 91, made of non-conductive material, such as plastic, retains, among other things, hot face terminal 18 and neutral face terminal 20. The End-of-life indicator circuit (FIG. 14), including an LED and other EOL circuit components, is also provided on printed circuit board (PCB) 92 adjacent face terminals 18, 20. According to the present embodiment, when the device assembled manifold 91 is disposed on top of the latch housing shown in FIGS. 27A and 27B, as indicated by the dotted line in FIG. 27C. Specifically, hot face contact 45 is axially aligned with hot line contact 41 and hot load contact 43, and neutral face contact 46 is axially aligned with neutral line contact 42 and neutral load contact 44. When GFCI device 10 is in the latched, or reset, condition, as described in detail above, all three hot contacts, 41, 43 and 45 are electrically connected together and all three neutral contacts, 42, 44 and 46 are electrically connected together. Alternatively, when the GFCI device is in the unlatched, or tripped, condition, contacts 41, 43 and 45 are electrically isolated from each other and contacts 42, 44 and 46 are electrically isolated from each other.

End-of-life circuit is provided on printed circuit board (PCB) 92 in FIG. 27C. When the GFCI device is in the reset condition and the test switch is closed, e.g., as a result of a user pressing test button 34, hot face terminal 18, which is electrically connected to hot line and hot load terminals 39, 37, respectively, is initially connected to neutral line terminal 40 through resistor 27 and test switch contact 28. Based on the value of resistor 27 this causes a test current, typically 8-9 milliamperes according to this embodiment, to be diverted around transformer 90A causing a differential, or net, current to be generated on the hot and neutral conductive paths between the hot and neutral line and load terminals. If the differential current is detected by the microcontroller, which can be implemented by a custom programmed semiconductor device, a GFCI IC device, such as an RV4141 integrated circuit, or some other similar device useful for detecting faults in a GFCI device, the GFCI device will immediately, or at least very quickly, be placed into the unlatched, or tripped, condition and the device will be non-conductive, i.e., where no power is delivered to the face terminals or the load terminals, until the device is reset.

Figure 28:
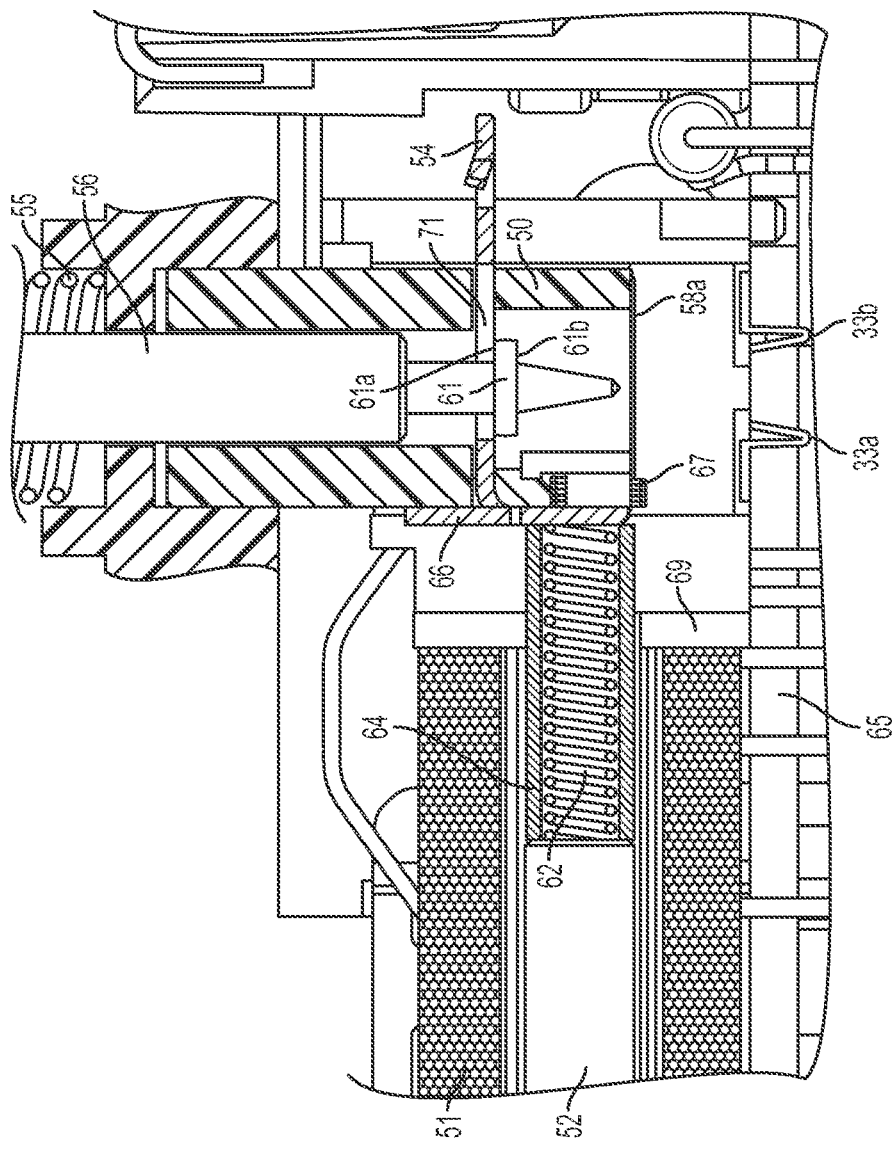
FIG. 28 is an enlarged cross sectional view of a portion of the latch assembly and reset mechanism within the solenoid housing of the ground fault circuit interrupting device of FIG. 1 after the test button is pressed and the solenoid fires, pushing the plunger into the latch plate.
Figure 29:
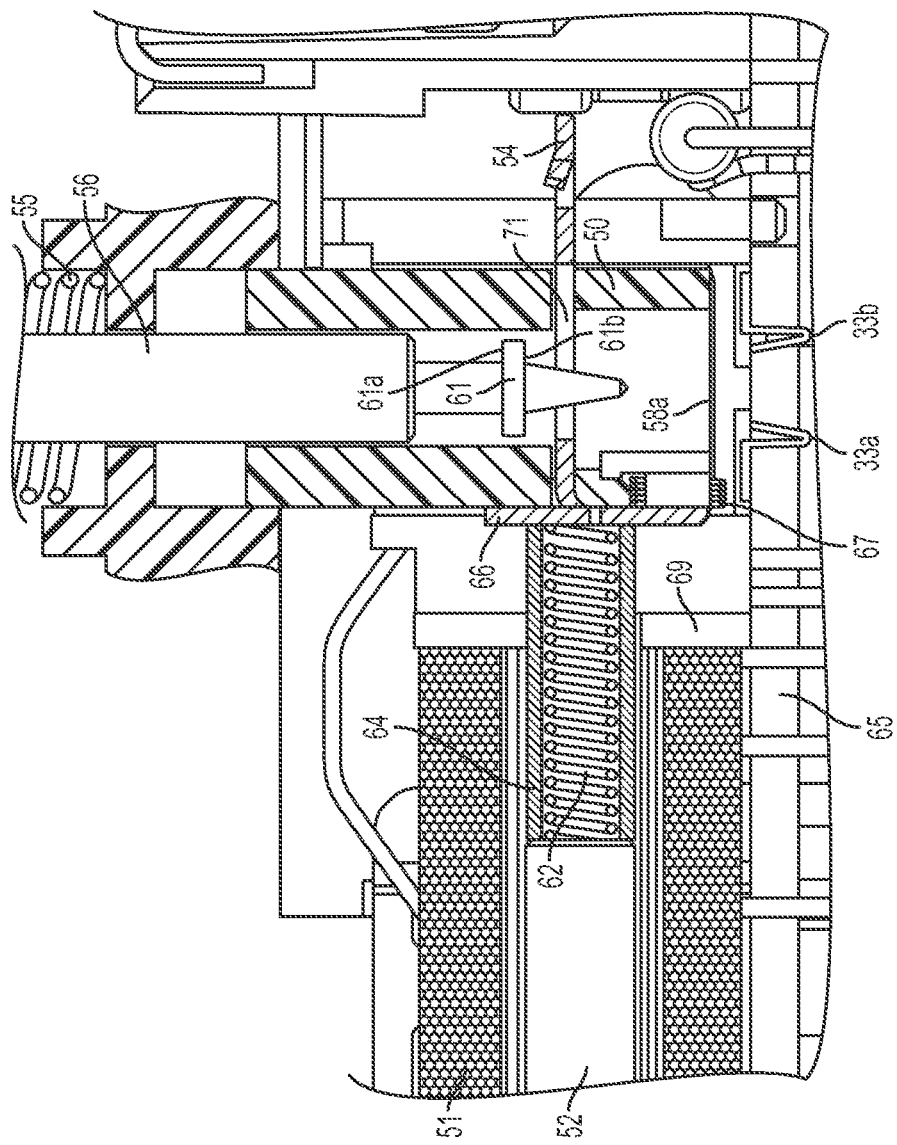
FIG. 29 is an enlarged cross sectional view of a portion of the latch assembly and reset mechanism within the solenoid housing of the ground fault circuit interrupting device of FIG. 1 after the solenoid has fired and the latch plate has cleared the reset pin allowing the latch assembly to drop and open the interrupter contacts as shown in FIG. 27B.

FIGS. 28 and 29 depict the operation of exemplary GFCI device 10 when it cuts-off power to the face terminals 18, 20, and any downstream load, when a ground fault is detected, or upon a user pressing the test button 34 (see FIG. 20) protruding from the external cover 14 as shown in FIG. 1. Referring to FIG. 14, when test switch 30 is closed, test circuit contact 28 is electrically connected to line terminal 40, thus completing the resistive circuit between the face terminal 18 and electrical ground, e.g., through resistor 27, simulating a ground-fault condition. More particularly, the current drawn through resistor 27 provides a detectable difference in current flowing through the sense transformer 90A, thus triggering a ground-fault response. When the simulated ground-fault or an actual ground-fault is detected, a current pulse is generated at the SCR output pin of the GFCI IC device, which is connected to the gate terminal of the SCR. As described above with respect to the reset operation, the current pulse transitions SCR 49 into the conducting state drawing current through solenoid 51. A resultant magnetic field is created that urges plunger 52 within the solenoid in the direction of side wall 66 of the latch plate 54. Latch plate 54 moves laterally through latch assembly 50 against the bias of spring element 67 to the "fired" position. In this position, aperture 71 in latch plate 54 aligns with the reset flange 61 of the reset pin 56, as shown in FIG. 12, allowing the reset flange to pass through the aperture 71.

Because latch plate 54 is no longer engaged with reset flange 61 of reset pin 56, and reset flange 61 travels through aperture 71, latch assembly 50 is urged by the natural bias of cantilevered load arms 80, 81 to move, e.g., downward in FIG. 28, thus carrying latch plate 54 downward past reset flange 61 in a direction towards PCB 65. As load arms 80, 81 move, or drop, in this direction, load contacts 43, 44 separate from line contacts 41, 42, as shown for example in FIG. 27A. Line cantilever arms 82, 83 also flex downward under their respective natural bias and line contacts 41, 42 separate from face contacts 45, 46. Thus, no current can flow from line terminals 39, 40 to either the face terminals 18, 20 or the load terminals 37, 38.

As mentioned, latch assembly 50 is urged downward in the direction of PCB 65 when a real or simulated ground fault occurs. Latch assembly 50 is prevented from contacting the PCB 65 in this situation, however, due to the reactive forces of spring elements 57a, 57b, and the at least one built-in stop 68a of the solenoid housing 60, e.g., as shown in FIG. 21A. Latch assembly 50, thus, returns to its initial suspended position, shown in FIG. 29, and the latch assembly is now in the unlatched, or tripped, state. After the test condition or ground fault is cleared, a current pulse is no longer supplied at the gate terminal of SCR 49, and the SCR returns to the non-conducting state. Because current is no longer being drawn through solenoid 51, the magnetic field is lost and plunger 52 is no longer urged against the side wall 66 of the latch plate 54. Latch plate 54 returns to its initial position under the bias of spring element 67, as shown in FIG. 22A. Latch assembly 50 remains in this position until the user initiates the reset of the GFCI device 10 by once again pressing the reset button 34 as described above in reference to FIGS. 22-26.

Those skilled in the art can now appreciate from the foregoing description that the broad teachings of the present application can be implemented in a variety of forms. Therefore, while this application can be described in connection with particular examples thereof, the true scope of the application should not be so limited since other modifications will become apparent to the skilled practitioner upon a study of the drawings, specification and following claims.

What is claimed is:

1. A circuit interrupting device comprising:
    one or more line terminals for connecting to an external power supply;
    one or more load terminals for connecting to an external load;
    one or more contacts electrically connecting one or more line terminals to one or more load terminals; and
    an auto-monitoring circuit configured to
        monitor one or more signals to determine an operating state of said circuit interrupting device,
        output a first signal having a first voltage level based on the operating state, wherein the first voltage level is greater than zero volts, and
        output, after outputting the first signal, a second signal having a second voltage level based on the operating state, wherein the second voltage level is greater than the first voltage level.

2. The circuit interrupting device of claim 1, wherein the operating states is at least one selected from a group consisting of a first operating state and a second operating state, wherein the first operating state is an end-of-life state and it is determined that the contacts have not failed, and in the second operating state it is determined that the contacts have failed.

3. The circuit interrupting device of claim 2, wherein said auto-monitoring circuit determines whether said contacts have failed by determining if the contacts are stuck together.

4. The circuit interrupting device of claim 1, wherein said first signal is driven for at least 20 milliseconds.

5. The circuit interrupting device of claim 1, further comprising at least one of actuating a visual indicator and actuating an audio indicator.

6. The circuit interrupting device of claim 5, wherein said visual indicator includes a light emitting diode (LED).

7. The circuit interrupting device of claim 1, wherein the external power supply is an alternating current (AC) power source providing said circuit interrupting device with an AC power signal having a first number of cycles per second and a first length of time that is greater than a duration of one of said cycles.

8. The circuit interrupting device claimed in claim 7, wherein said AC power signal is a 60 hertz signal having 60 cycles per second and said first length of time is greater than 16.667 milliseconds.

9. The circuit interrupting device claimed in claim 1, wherein said auto-monitoring circuit includes a microcontroller having one or more input/output (I/O) ports that can be configured by said auto-monitoring circuit to be either an input or an output, and when said auto-monitoring circuit determines that said circuit interrupting device has reached the end of its useful life at least one of said I/O ports is configured to be an output.

10. A method of operating a circuit interrupting device, the method comprising:
    connecting an external power supply via one or more line terminals;
    connecting an external load via one or more load terminals for;
    electrically connecting one or more line terminals to one or more load terminals via one or more contacts;
    monitoring, via an auto-monitoring circuit, one or more signals to determine an operating state of said circuit interrupting device;
    outputting, via the auto-monitoring circuit, a first signal having a first voltage level based on the operating state, wherein the first voltage level is greater than zero volts; and
    outputting, after outputting the first signal, via the auto-monitoring circuit, a second signal having a second voltage level based on the operating state, wherein the second voltage level is greater than the first voltage level.

11. The circuit interrupting device of claim 10, wherein the operating states is at least one selected from a group consisting of a first operating state and a second operating state, wherein the first operating state is an end-of-life state and it is determined that the contacts have not failed, and in the second operating state it is determined that the contacts have failed.

12. The circuit interrupting device of claim 11, wherein said auto-monitoring circuit determines whether said contacts have failed by determining if the contacts are stuck together.

13. The circuit interrupting device of claim 10, wherein said first signal is driven for at least 20 milliseconds.

14. The circuit interrupting device of claim 10, further comprising at least one of actuating a visual indicator and actuating an audio indicator.

15. The circuit interrupting device of claim 14, wherein said visual indicator includes a light emitting diode (LED).

16. The circuit interrupting device of claim 10, wherein the external power supply is an alternating current (AC) power source providing an AC power signal having a first number of cycles per second and said a first length of time that is greater than a duration of one of said cycles.

17. The circuit interrupting device claimed in claim 16, wherein said AC power signal is a 60 hertz signal having 60 cycles per second and said first length of time is greater than 16.667 milliseconds.

* * * * *